US008736401B2

(12) United States Patent
Kanno et al.

(10) Patent No.: US 8,736,401 B2
(45) Date of Patent: May 27, 2014

(54) CAPACITANCE DEVICE AND RESONANCE CIRCUIT

(75) Inventors: Masayoshi Kanno, Kanagawa (JP); Toshiaki Yokota, Miyagi (JP); Kazutaka Habu, Tokyo (JP); Makoto Watanabe, Miyagi (JP); Noritaka Sato, Kanagawa (JP)

(73) Assignee: Dexerials Corporation, Tokyo (JP)

( * ) Notice: Subject to any disclaimer, the term of this patent is extended or adjusted under 35 U.S.C. 154(b) by 396 days.

(21) Appl. No.: 13/063,624

(22) PCT Filed: Sep. 24, 2009

(86) PCT No.: PCT/JP2009/067116
§ 371 (c)(1),
(2), (4) Date: Mar. 11, 2011

(87) PCT Pub. No.: WO2010/035879
PCT Pub. Date: Apr. 1, 2010

(65) Prior Publication Data
US 2011/0163827 A1 Jul. 7, 2011

(30) Foreign Application Priority Data

Sep. 26, 2008 (JP) .................................. 2008-249242
Apr. 2, 2009 (JP) .................................. 2009-090423
Sep. 9, 2009 (JP) .................................. 2009-208353

(51) Int. Cl.
*H03H 7/01* (2006.01)
(52) U.S. Cl.
CPC .................................. *H03H 7/0115* (2013.01)
USPC .......................................... 333/185; 333/24 C
(58) Field of Classification Search
CPC ........................................................ H03H 7/0115
USPC ................................. 333/185, 175, 24 C
See application file for complete search history.

(56) References Cited

U.S. PATENT DOCUMENTS

| 5,576,672 | A | * | 11/1996 | Hirai et al. | 333/204 |
| 7,345,558 | B2 | * | 3/2008 | Okahashi | 333/175 |
| 2002/0149443 | A1 | * | 10/2002 | Toncich et al. | 333/158 |
| 2007/0067066 | A1 | * | 3/2007 | Niki | 700/286 |
| 2012/0062338 | A1 | * | 3/2012 | Kanno | 333/185 |

FOREIGN PATENT DOCUMENTS

| JP | 55-036601 | 3/1980 |
| JP | 07-240339 | 9/1995 |
| JP | 08-007059 | 1/1996 |
| JP | 08-181035 | 7/1996 |
| JP | 10-223475 | 8/1998 |
| JP | 2007-220874 | 8/2007 |
| JP | 2007-287996 | 11/2007 |

OTHER PUBLICATIONS

International Search Report dated Nov. 24, 2009.

* cited by examiner

*Primary Examiner* — Benny Lee
*Assistant Examiner* — Rakesh Patel
(74) *Attorney, Agent, or Firm* — Oliff PLC

(57) ABSTRACT

To suppress changes in capacitance due to displacement between electrodes opposing each other across a dielectric layer, thereby allowing stable manufacturing of a capacitance device having a desired capacitance.
The capacitance device according to the present invention is of a configuration including a dielectric layer (10), a first electrode (11) formed on a predetermined surface (10*a*) of the dielectric layer (10), and a second electrode (12) formed on a surface (10*b*) on the opposite side of the dielectric layer (10) from the predetermined surface (10*a*). The forms of the first and second electrodes (11, 12) are set so that even in the event that the first electrode (11) is relatively displaced regarding position in a predetermined direction as to the second electrode (12), the area of the opposing-electrode region between the first electrode (11) and to the second electrode (12) is unchanged.

15 Claims, 44 Drawing Sheets

FIG. 3
PRIOR ART
(A)
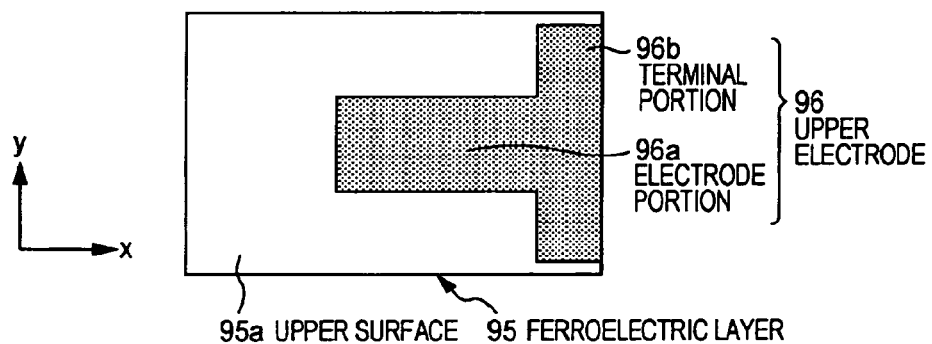
(B)
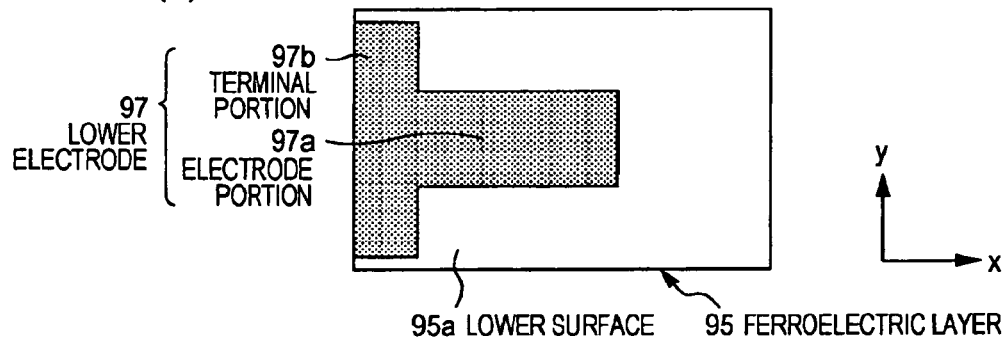

FIG. 6
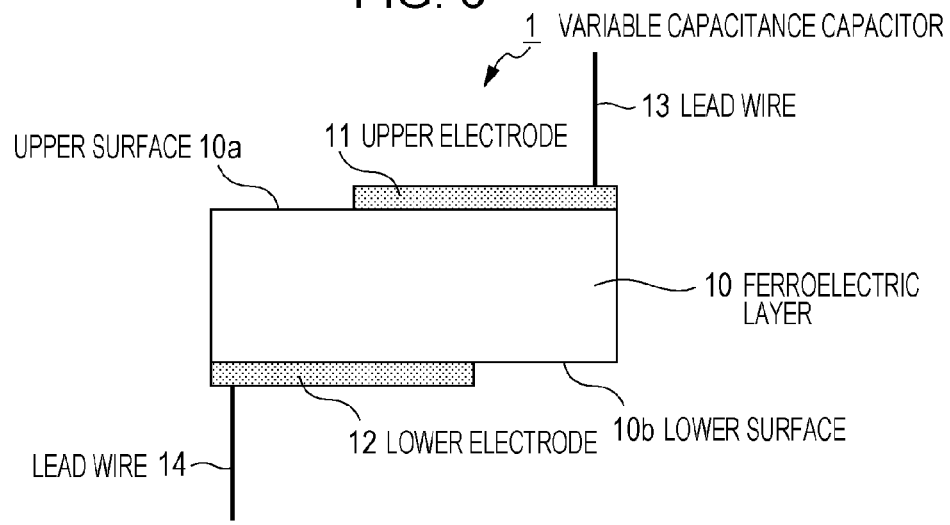
FIG. 7
(A)
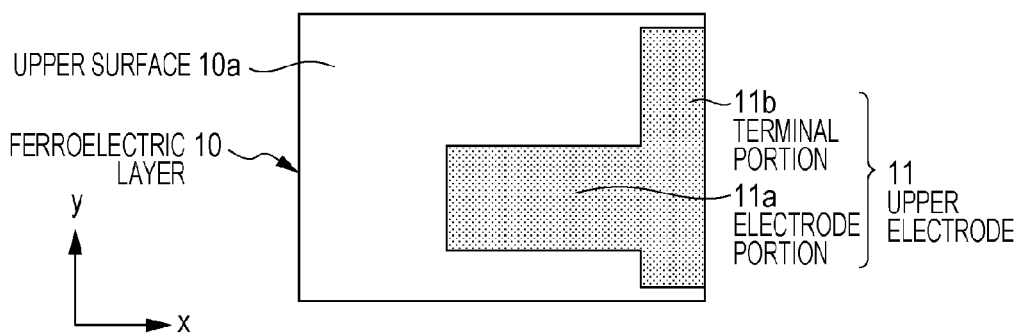
(B)
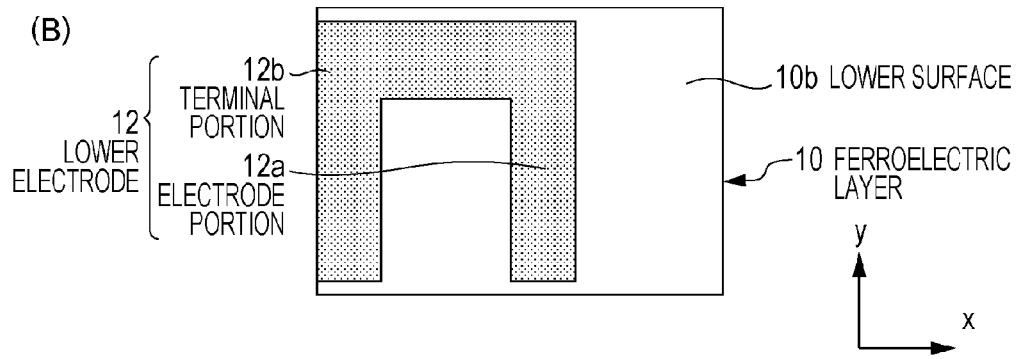

FIG. 9
(A)
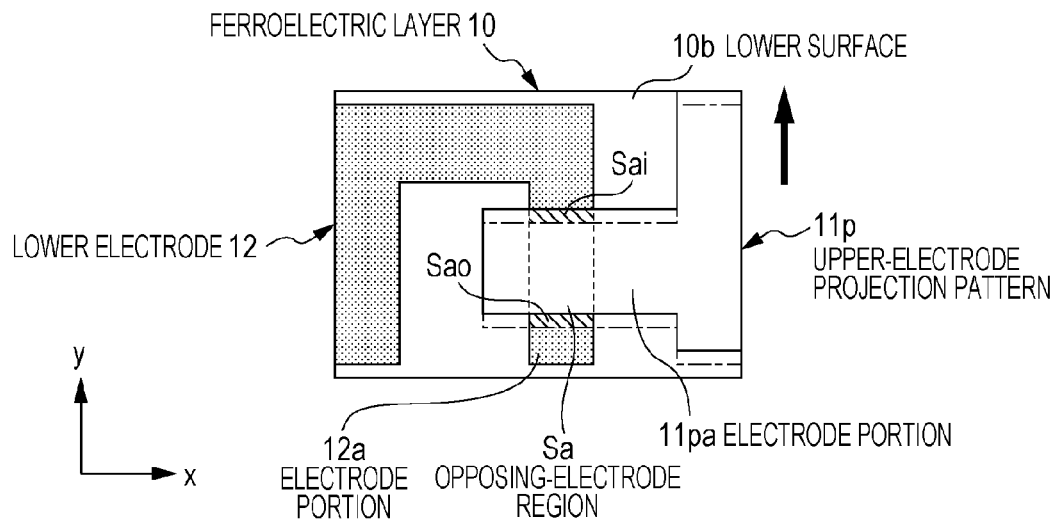
(B)
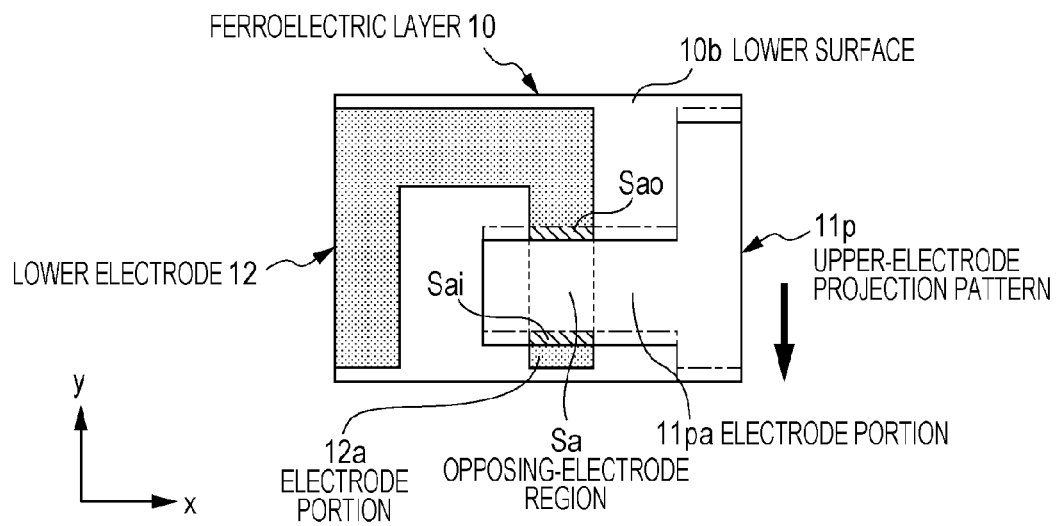

FIG. 10
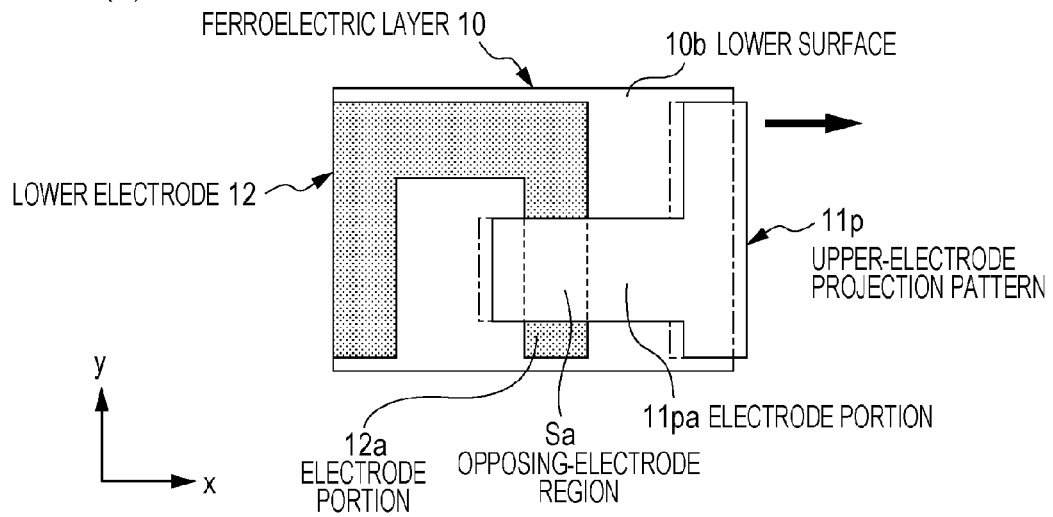
FIG. 11
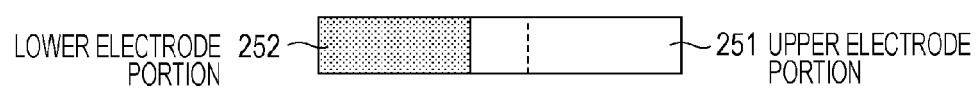
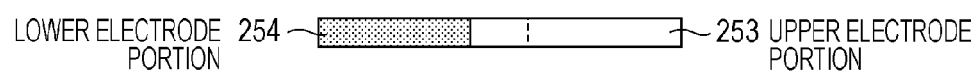

FIG. 15
(A)
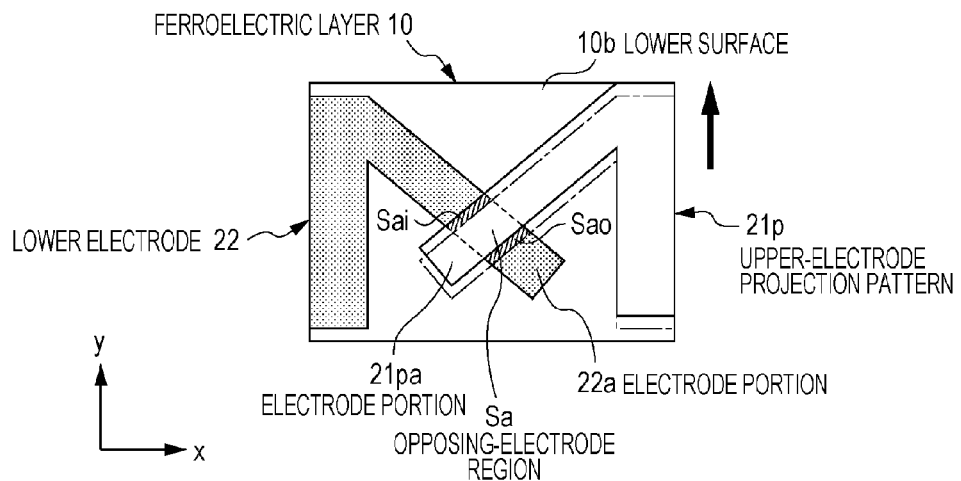
(B)
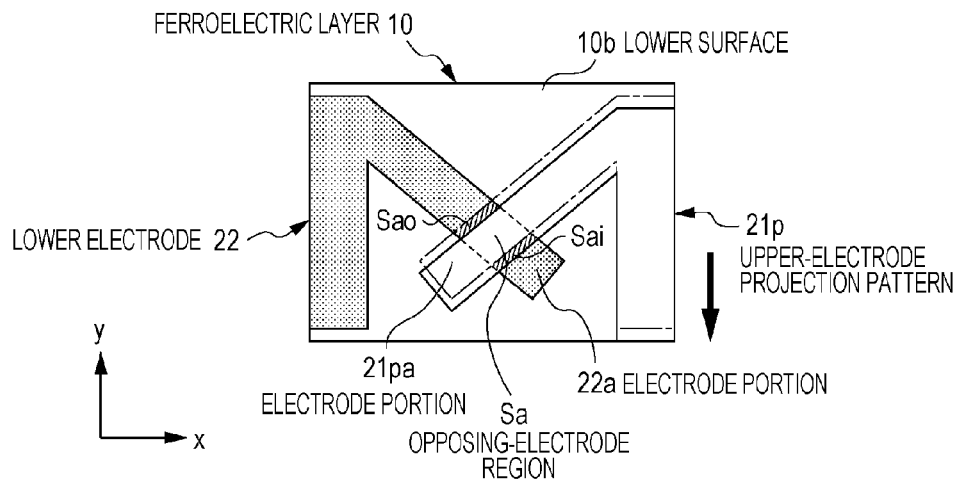

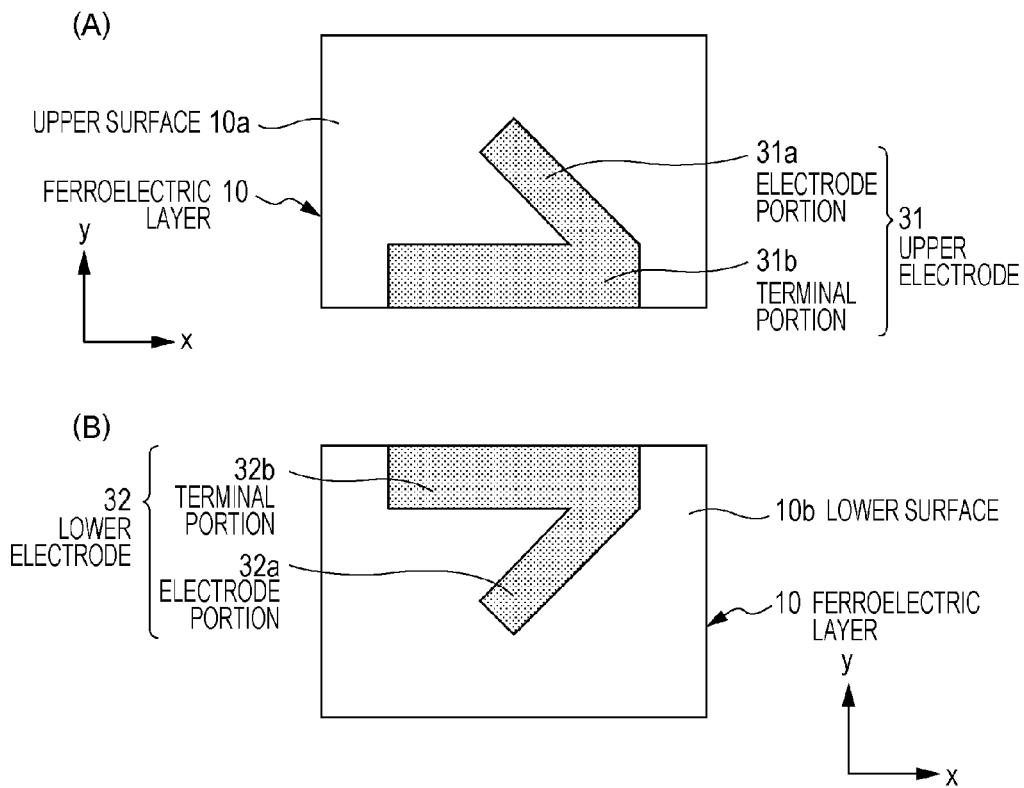
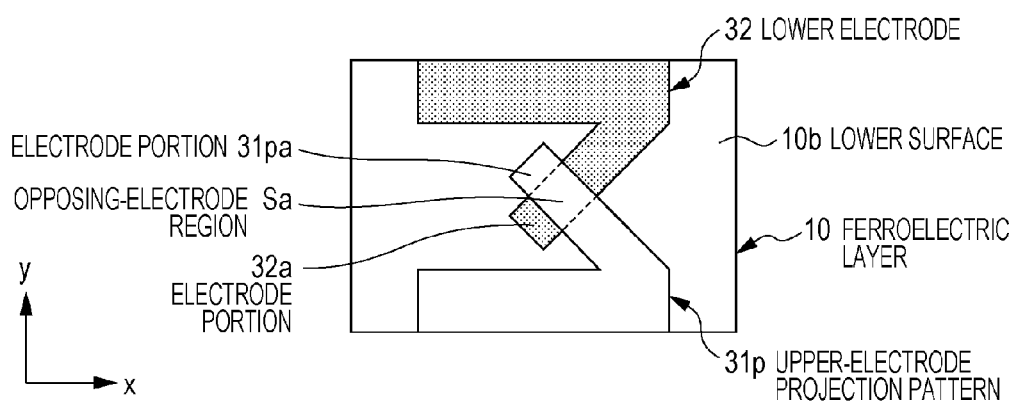

FIG. 19
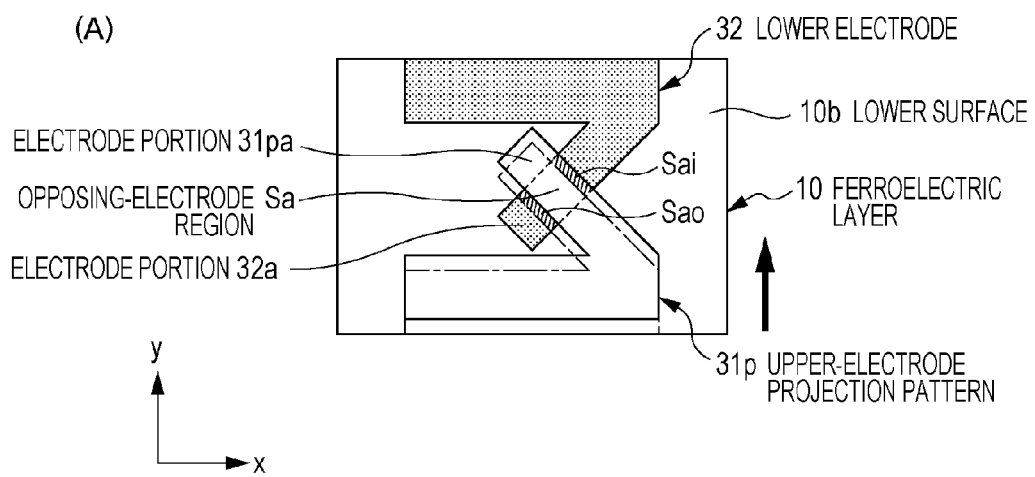
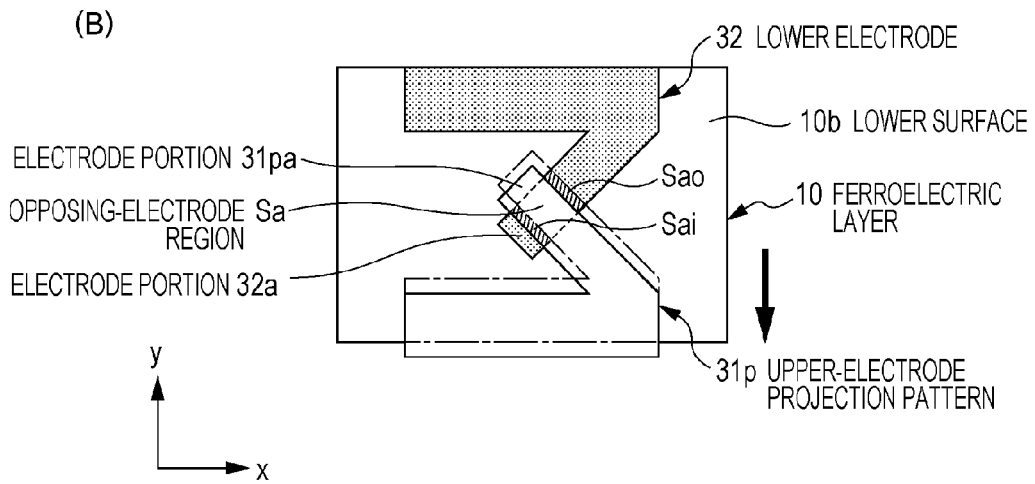

FIG. 20
(A)
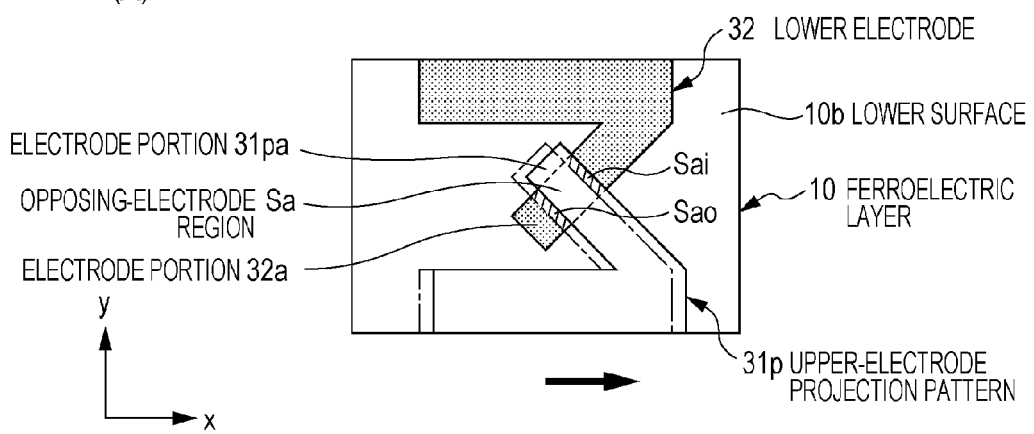
(B)
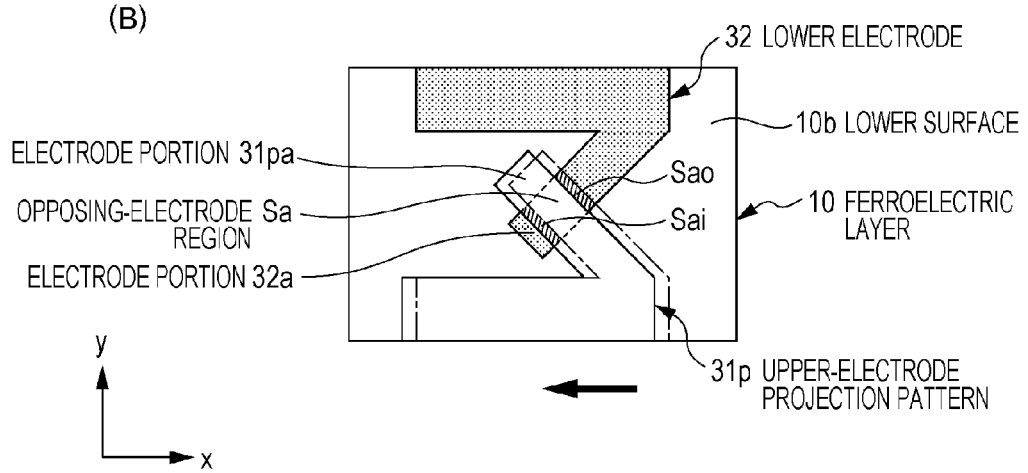

FIG. 21
(A)
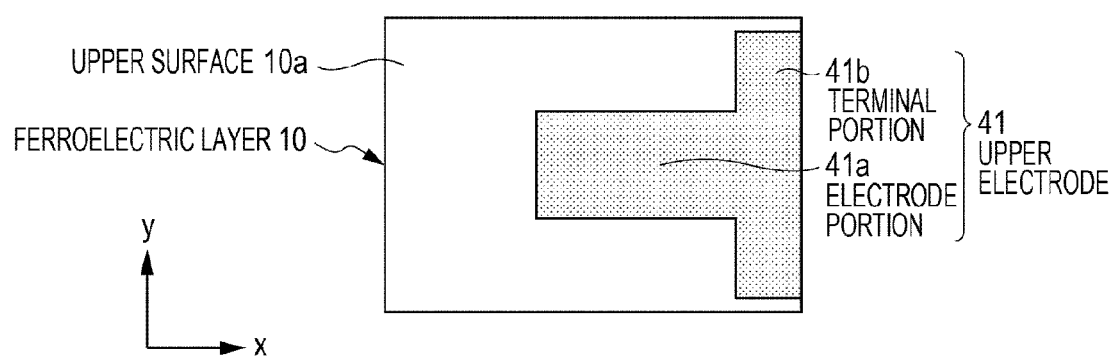
(B)
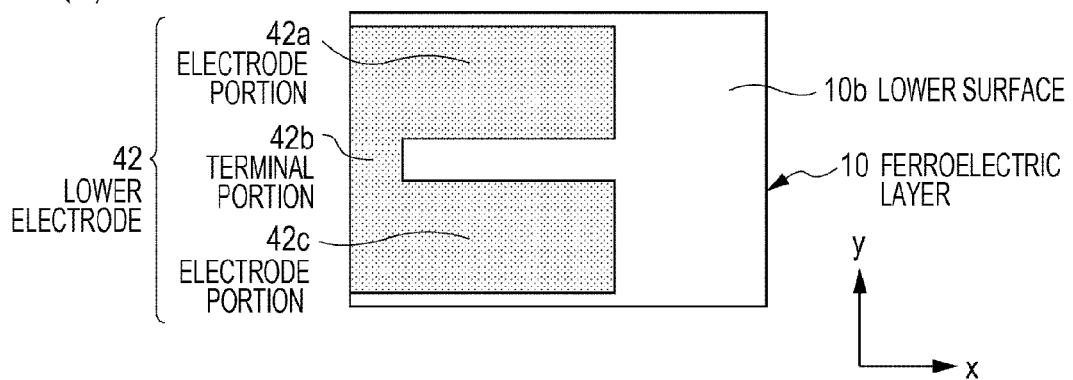

FIG. 34
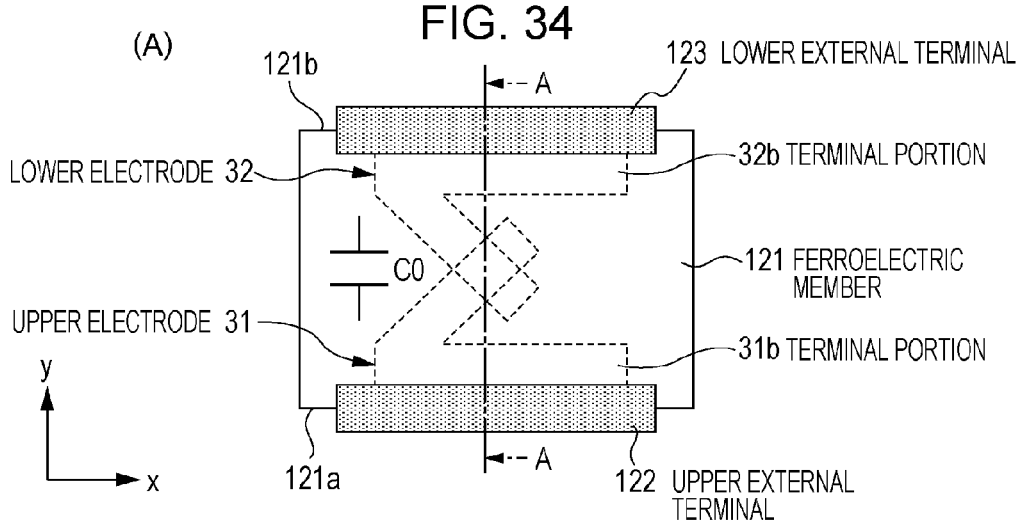
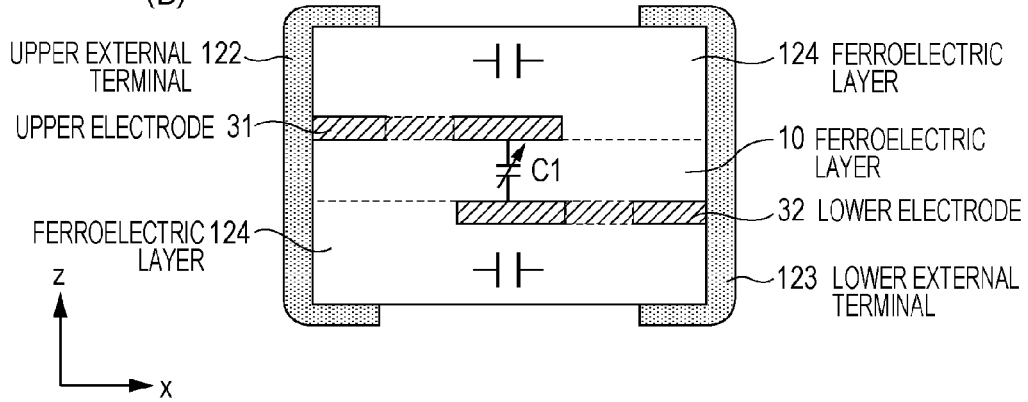
FIG. 35
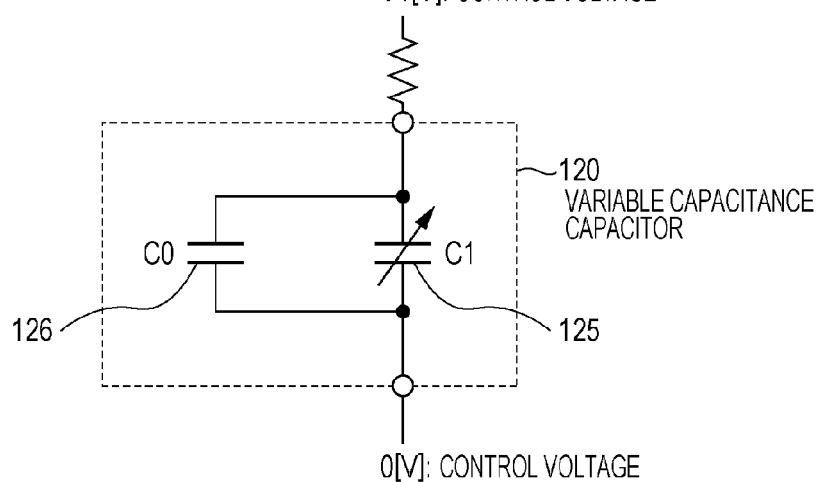

FIG. 36
(A)
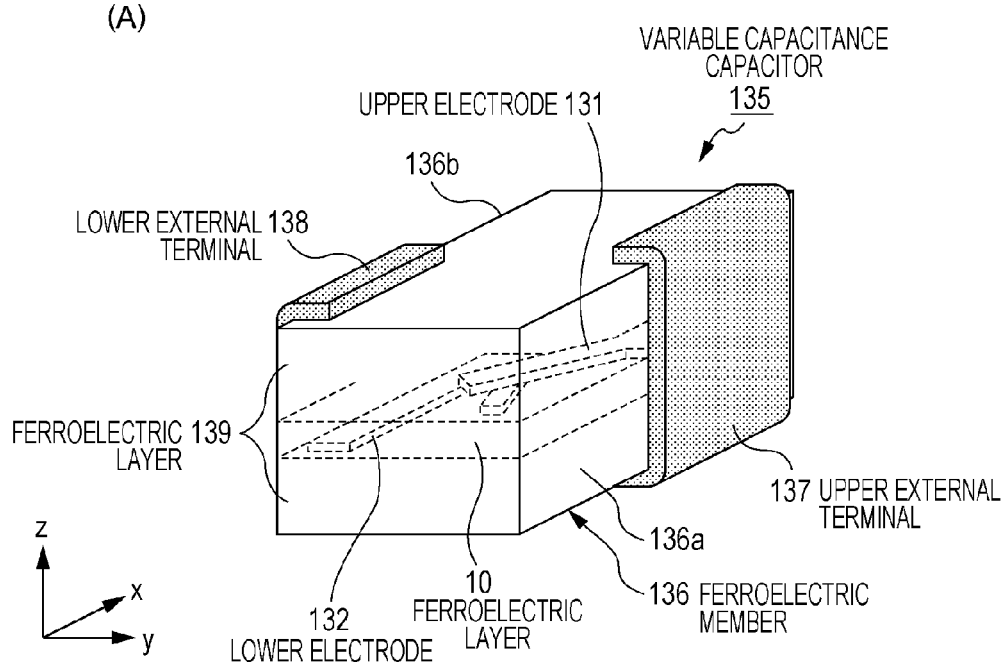
(B)
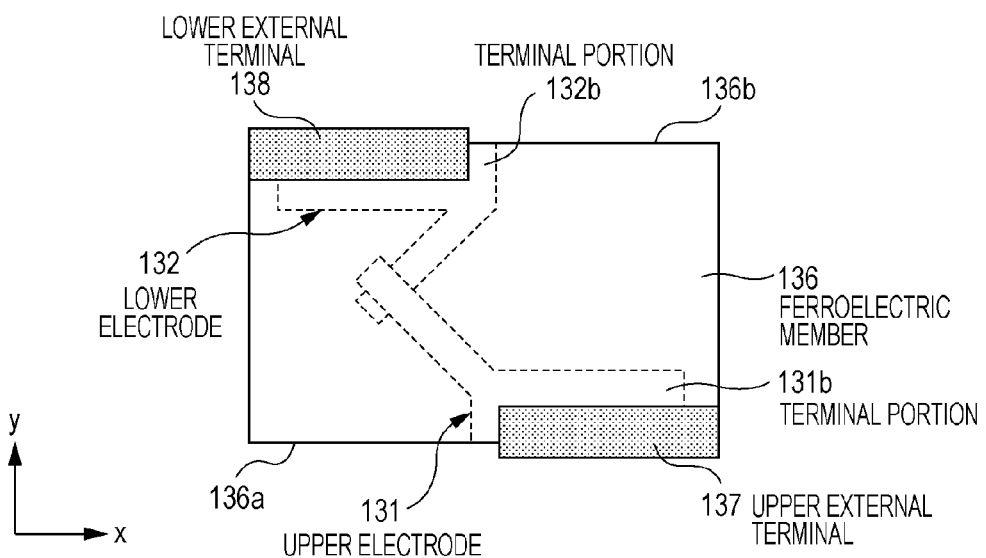

FIG. 39
(A)
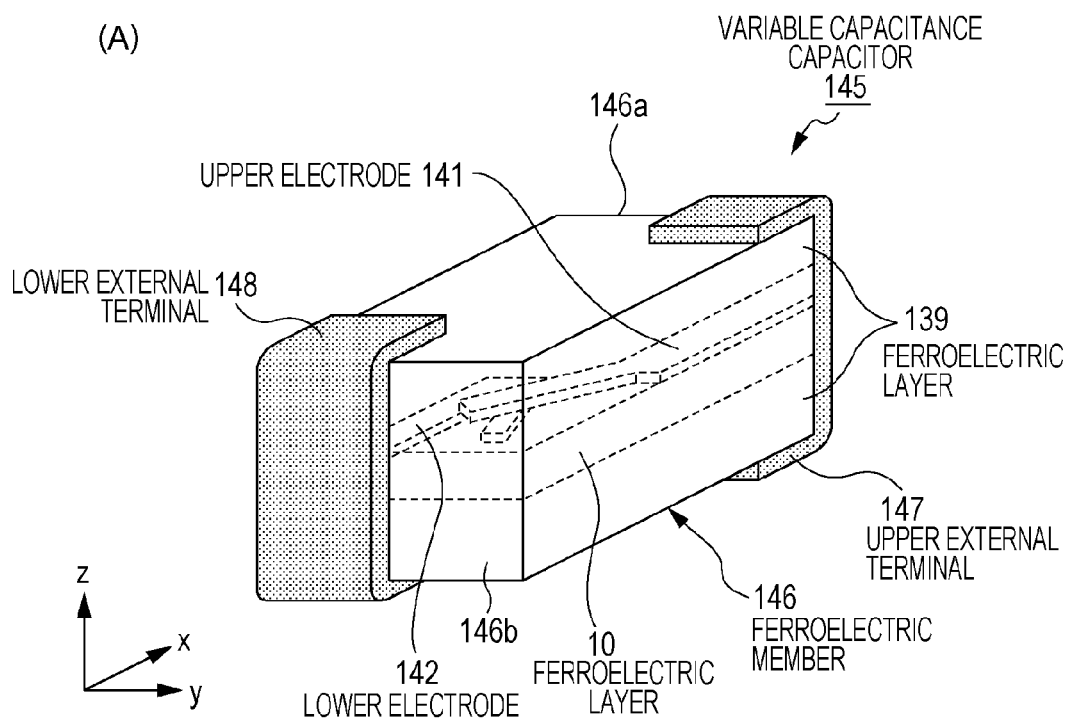
(B)
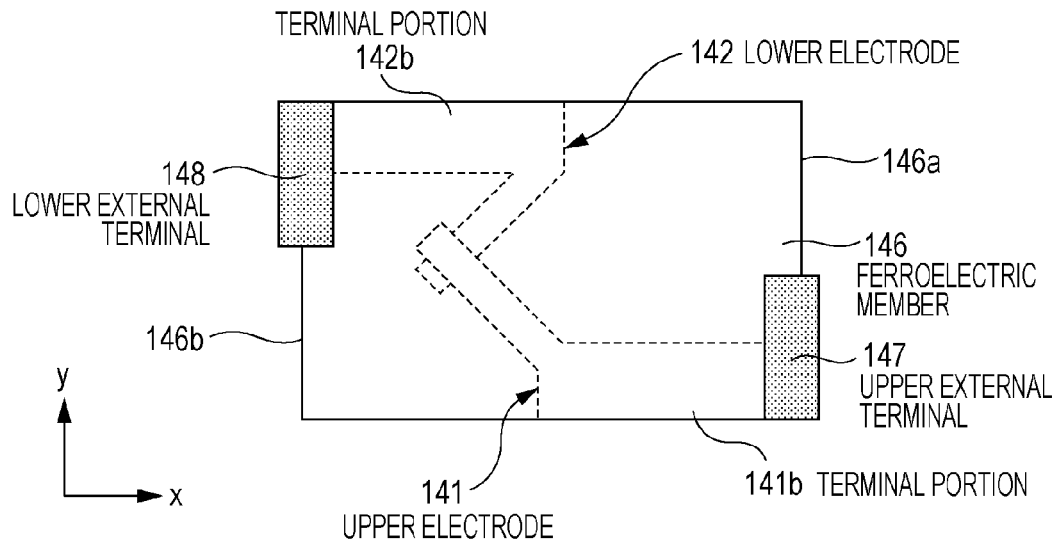

FIG. 45
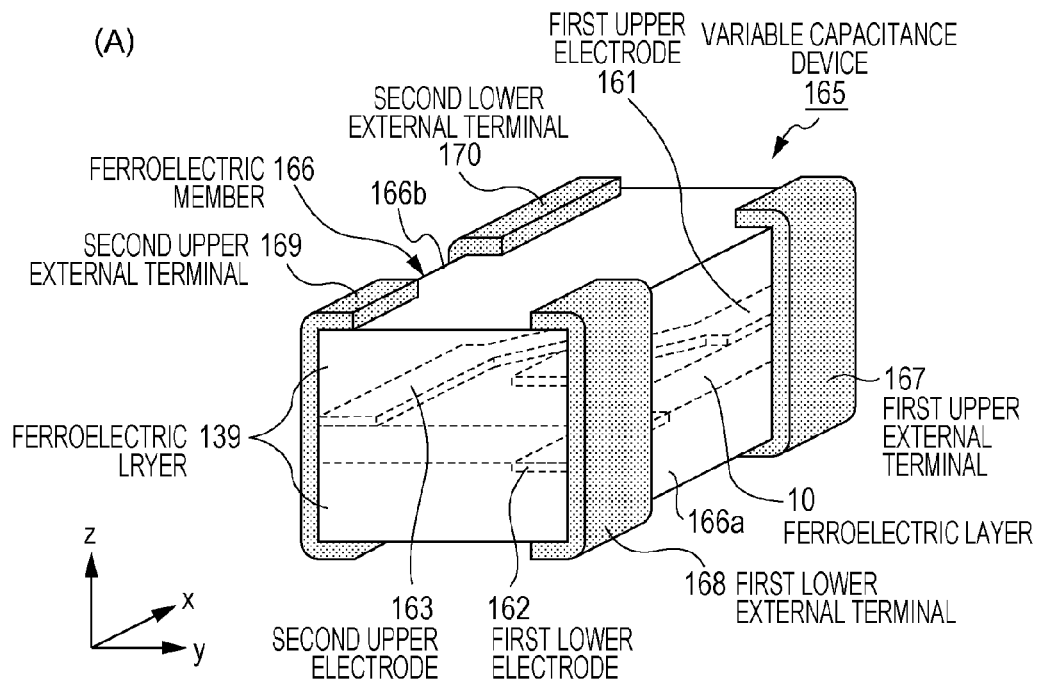
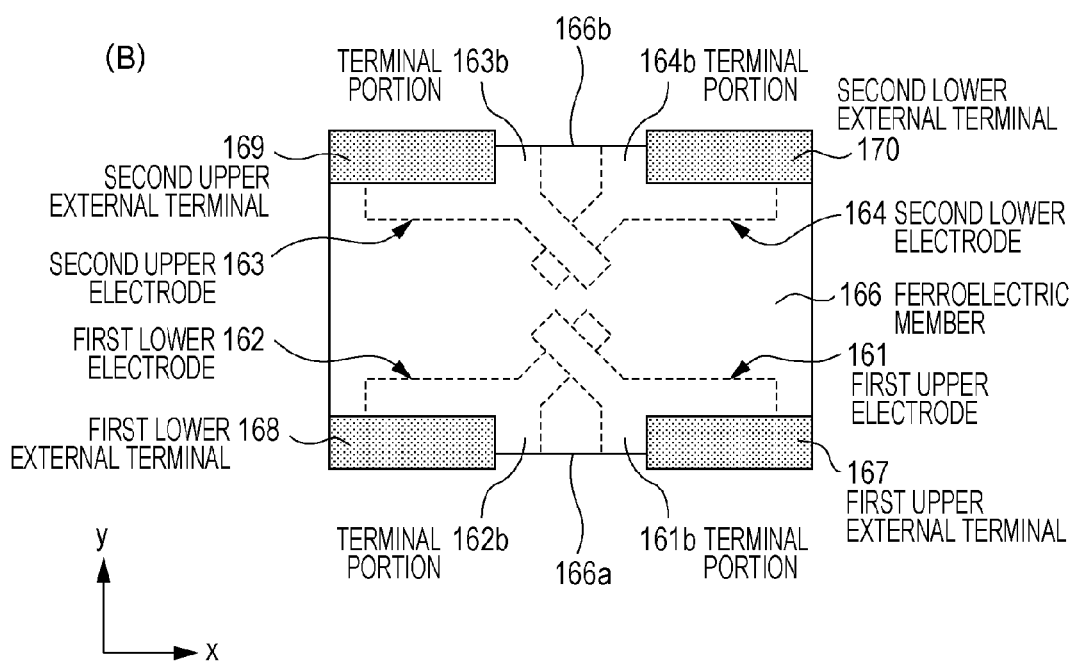

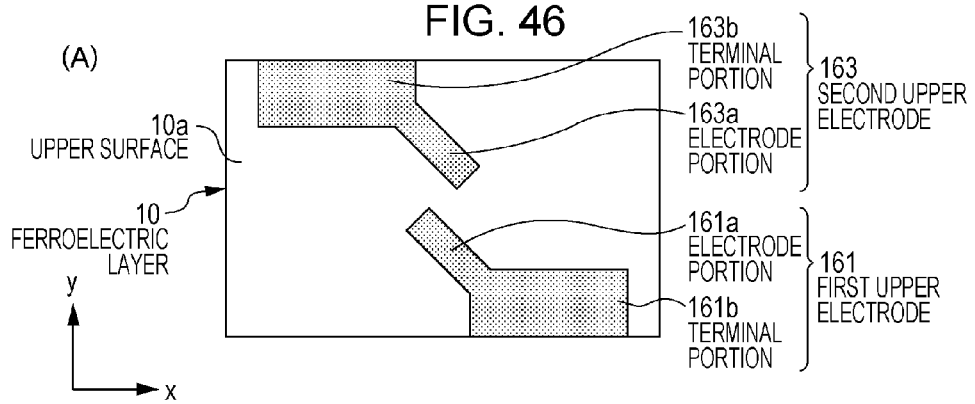
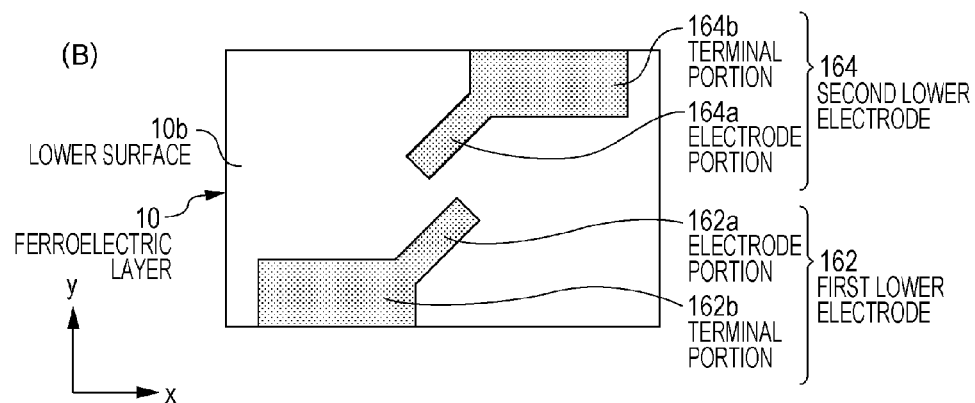
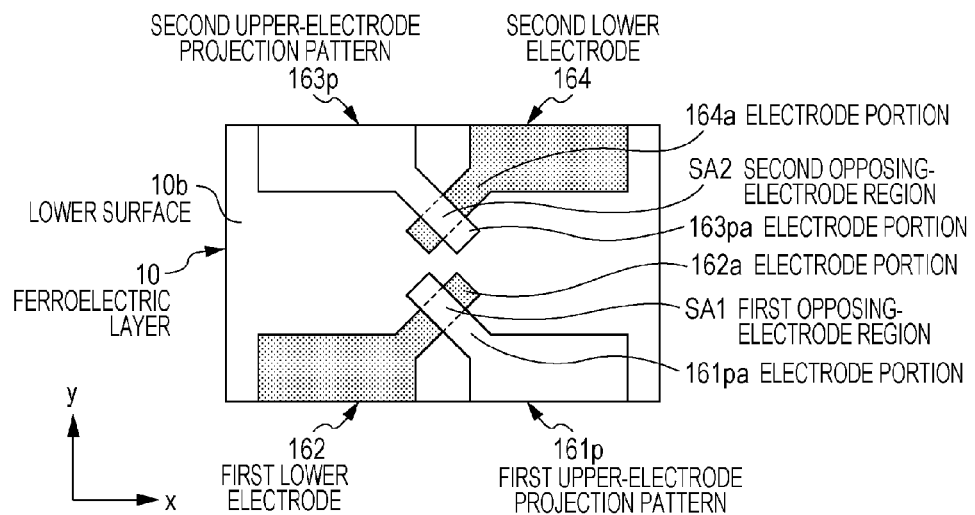

FIG. 51
(A)
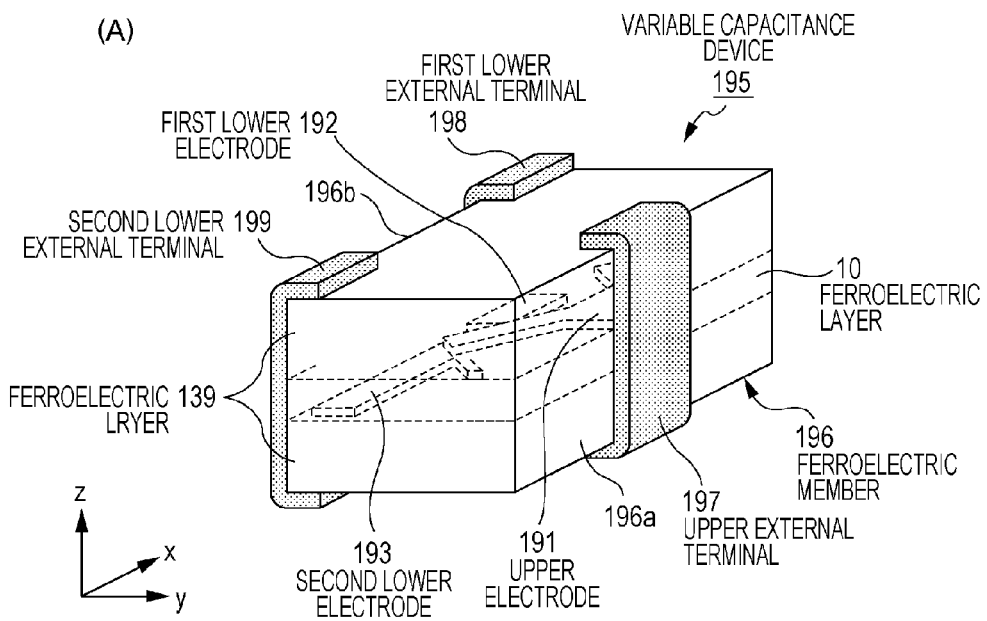
(B)
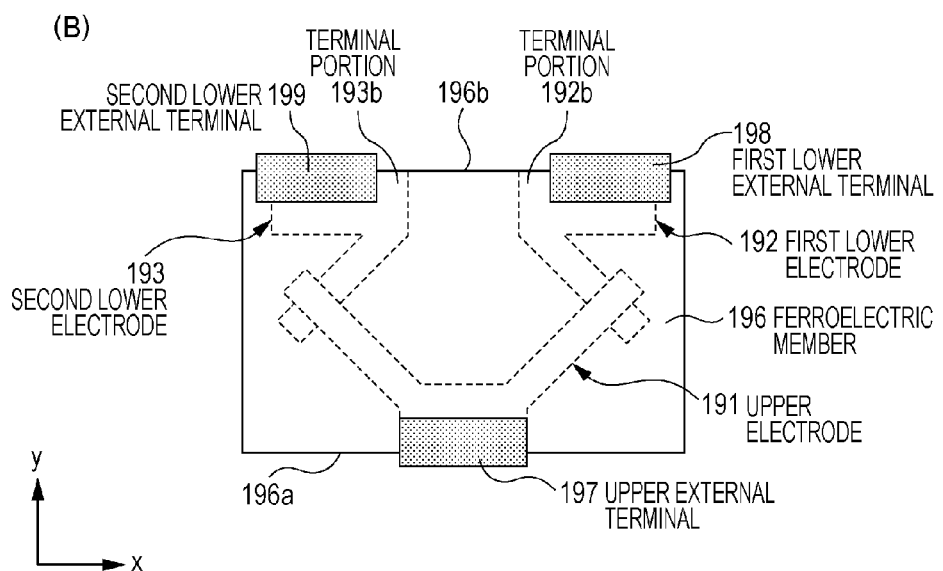

FIG. 52
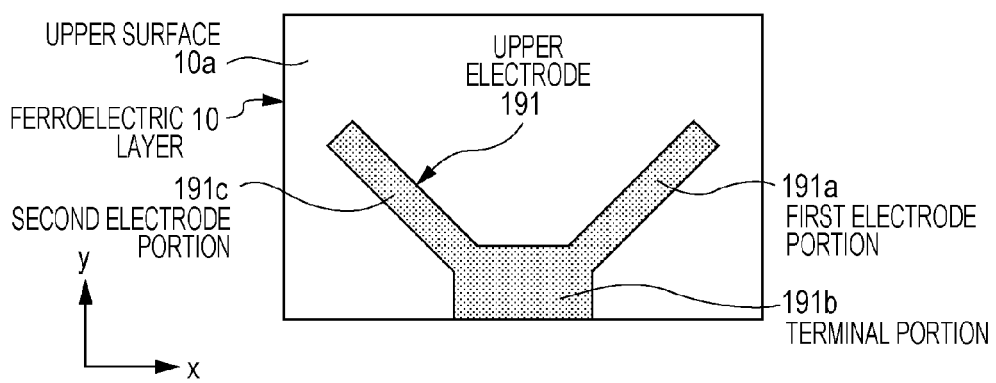
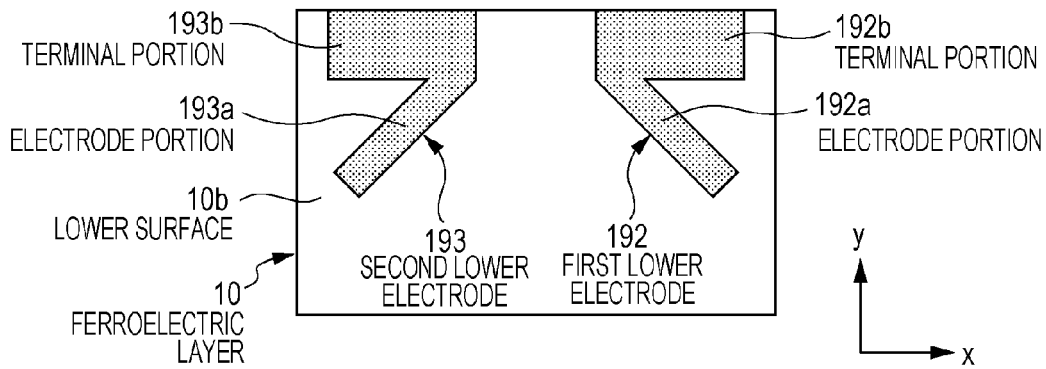
FIG. 53
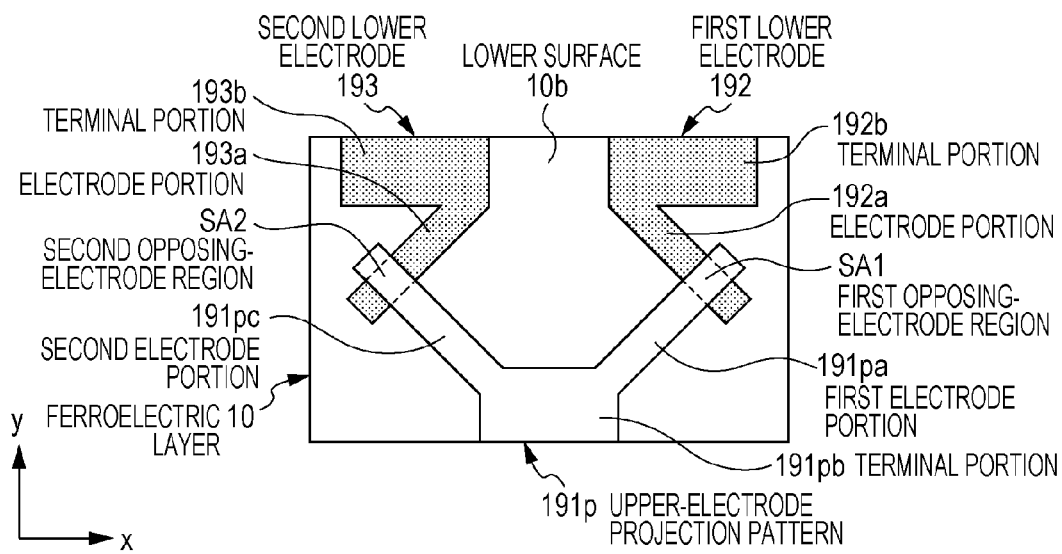

FIG. 61
PRIOR ART
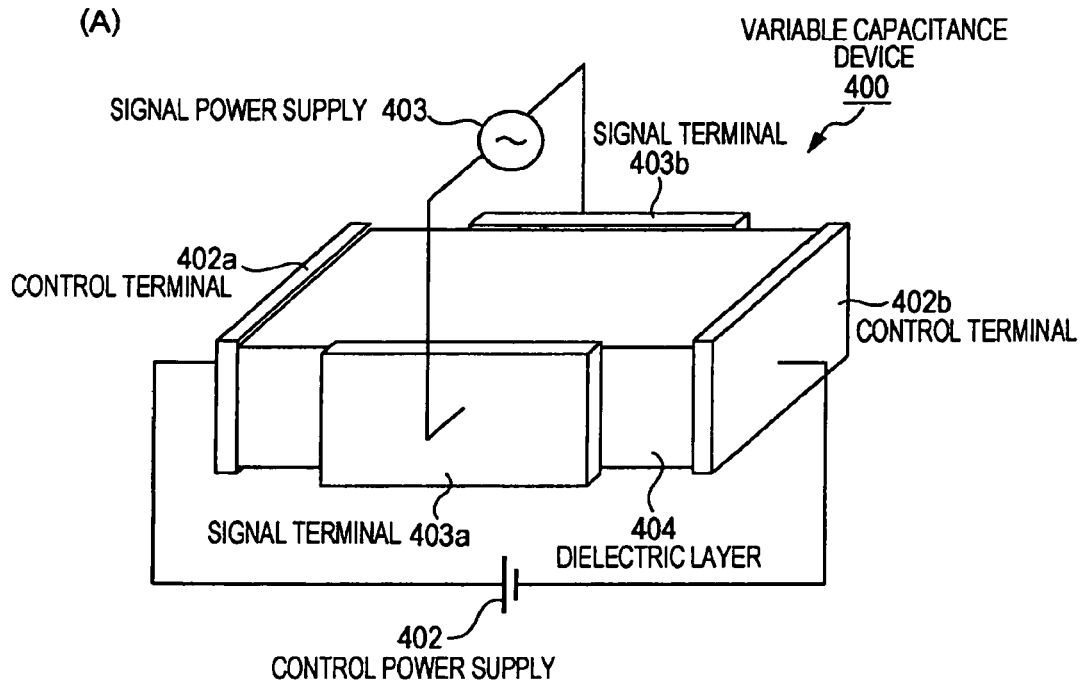
(A)
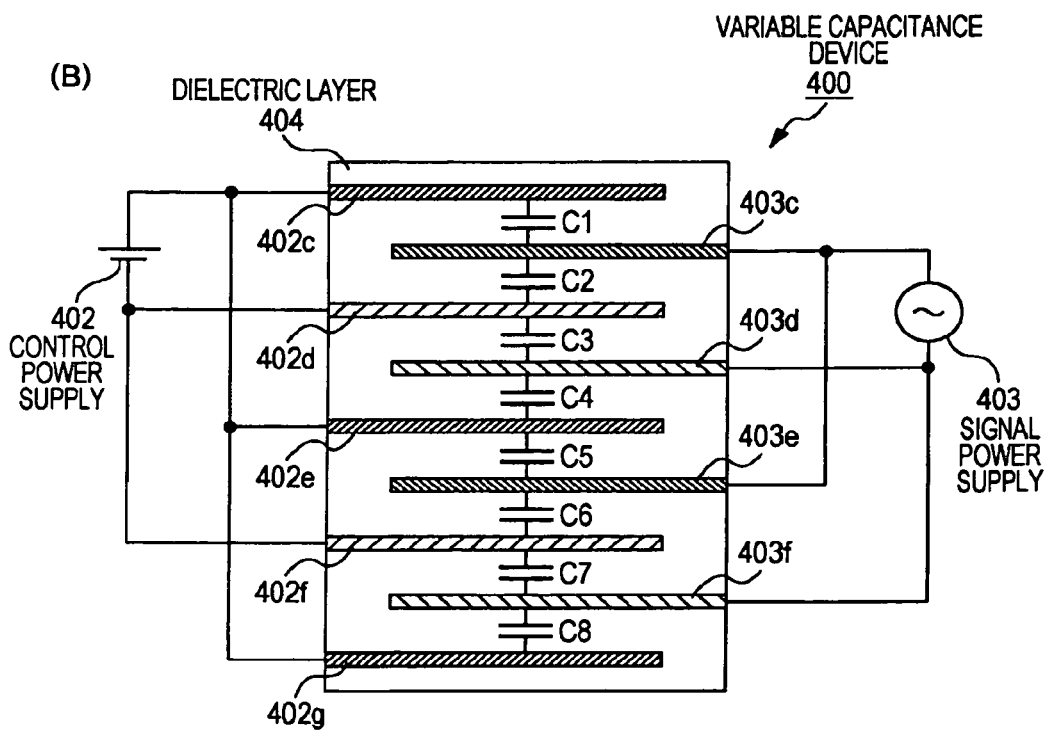
(B)

CAPACITANCE DEVICE AND RESONANCE CIRCUIT

TECHNICAL FIELD

The present invention relates to a capacitance device and a resonance circuit including the same, and more specifically to a capacitance device and a resonance circuit including the same, having a small capacitance in pF order, for example.

BACKGROUND ART

Conventionally, variable capacitance devices have been used whose capacitance is changed by application of external bias signals to thereby control the frequency, time period, or the like of an input signal. Such variable capacitance devices have been made commercially available as, for example, variable capacitance diodes (varicaps) and MEMS (Micro Electro Mechanical Systems).

In addition, conventionally, there has been proposed a technique for using the above-described variable capacitance device as a protection circuit in a non-contact IC (Integrated Circuit) card (see, for example, PTL 1). According to the technique described in PTL 1, a variable capacitance device is used as a protection circuit in order to prevent a control circuit made of a semiconductor device with a low withstand voltage from being destroyed by an excessively large received signal when a non-contact IC card is brought closer to its reader/writer.

FIG. 60 is a block diagram of the non-contact IC card proposed in PTL 1. In PTL 1, a variable capacitance diode 303d is used as a variable capacitance device. A series circuit of a bias removal capacitor 303c and the variable capacitance diode 303d is connected in parallel to a resonance circuit including a coil 303a and a capacitor 303b.

In PTL 1, a DC voltage Vout obtained by detecting a received signal in a detector circuit 313 is subjected to resistive division between resistors 314a and 314b. Then, the DC voltage after the resistive division (DC voltage applied across the resistor 314b) is applied to the variable capacitance diode 303d via a coil 315 provided to eliminate fluctuations in the DC voltage, thereby adjusting the capacitance of the variable capacitance diode 303d. That is, the DC voltage that has been subjected to resistive division is used as a control voltage for the variable capacitance diode 303d.

In PTL 1, when the received signal is excessively large, the capacitance of the variable capacitance diode 303d becomes small due to the control voltage, so the resonance frequency of a reception antenna 303 becomes high. As a result, the response of the received signal at resonance frequency $f_0$ of the reception antenna 303 before change in capacitance becomes lower than that prior to the decrease in capacitance, thereby enabling suppression of the received signal level. According to the technique proposed in PTL 1, a signal processing unit 320 (control circuit) is protected by the variable capacitance device in this way.

The present inventors have also proposed a device using a ferroelectric material as a variable capacitance device (see, for example, PTL 2). PTL 2 proposes a variable capacitance device 400 having an electrode structure as shown in FIG. 61(A) and FIG. 61(B) to achieve an improvement in reliability and productivity. FIG. 61(A) is a schematic perspective view of the variable capacitance device 400, and FIG. 61(B) is a cross-sectional diagram of the variable capacitance device 400. In the variable capacitance device 400 according to PTL 2, a terminal is provided in each of the four faces of a rectangular parallelepiped dielectric layer 404. Of the four terminals, two opposing terminals on one side are signal terminals 403a and 403b connected to a signal power supply 403, and two opposing terminals on the other side are control terminals 402a and 402b connected to a control power supply 402.

As shown in FIG. 61(B), the internal structure of the variable capacitance device 400 is such that a plurality of control electrodes 402c to 402g and a plurality of signal electrodes 403c to 403f are layered alternately via the dielectric layer 404. Specifically, from the bottom layer, a control electrode 402g, signal electrode 403f, control electrode 402f, signal electrode 403e, control electrode 402e, signal electrode 403d, control electrode 402d, signal electrode 403c, and control electrode 402c are layered in this order via the dielectric layer 404. In the example shown in FIG. 61(B), the control electrode 402g, the control electrode 402e, and the control electrode 402c are connected to the control terminal 402a, the control electrode 402f and the control electrode 402d are connected to the other control terminal 402b, and the signal electrode 403f and the signal electrode 403d are connected to the signal terminal 403a. Also, the signal electrode 403e and the signal electrode 403c are connected to the other signal terminal 403b.

In the case of the variable capacitance device 400 according to PTL 2, voltages can be individually applied to the control terminals and signal terminals, and a plurality of signal electrodes and control electrodes are layered inside the variable capacitance device 400, which advantageously enables increasing capacitance at low cost. In addition, the variable capacitance device 400 having a structure as described in PTL 2 can be manufactured easily and is low in cost. Further, no bias removal capacitor is necessary in the case of the variable capacitance device 400 according to PTL 2.

CITATION LIST

PTL 1: Japanese Unexamined Patent Application Publication No. 08-7059

PTL 2: Japanese Unexamined Patent Application Publication No. 2007-287996

SUMMARY OF INVENTION

To fabricate a variable capacitance device with a small capacitance by using a ferroelectric material with a large relative permittivity, it is necessary to increase the distance between electrodes by increasing the thickness of the dielectric layer, or reduce the area of opposing electrodes. However, an increase in the thickness of the dielectric layer causes a decrease in the intensity of the electric field applied to the dielectric layer, so the control voltage necessary for changing the capacitance of the variable capacitance device becomes high.

On the other hand, if the electrode area is reduced instead of increasing the thickness of the dielectric layer, the resistance value of the variable capacitance device increases. Since the resistance of the variable capacitance device is inversely proportional to the number of layers of electrodes, to overcome the above problem, conventionally, the number of dielectric layers is increased to increase the number of layers of electrodes that are formed across those dielectric layers. However, in this case, if displacement occurs between electrodes opposing each other across each dielectric layer, the capacitance at each layer changes. As a result, there is a problem that capacitance variations among individual variable capacitance devices become large, so a variable capacitance device having a desired capacitance cannot be stably manufactured.

The above problem occurs similarly in the case of both the two-terminal type variable capacitance device with no control terminal additionally provided as proposed in PTL 1, and the four-terminal type variable capacitance device with control terminals additionally provided as proposed in PTL 2.

Further, the problem of capacitance variations among individual variable capacitance devices is not restricted to variable capacitance devices, and occurs similarly with capacitance devices regarding which the capacitance hardly changes at all, regardless of the type of input signal (AC or DC) and the signal level thereof.

The present invention has been made to solve the above problem, and it is an object of the present invention to suppress changes in capacitance due to displacement between electrodes opposing each other across a dielectric layer, thereby allowing stable manufacturing of a capacitance device having a desired capacitance.

To solve the above problem, a capacitance device according to the present invention includes a dielectric layer, a first electrode formed on a predetermined surface of the dielectric layer, and a second electrode formed on an opposite surface of the dielectric layer opposite to the predetermined surface. The first electrode is formed in a predetermined first shape. The second electrode has a first region overlapping a projection pattern obtained by projecting the first electrode onto the opposite surface, and is formed in a second shape such that the area of the first region does not change even when the first electrode undergoes relative displacement in a predetermined direction within the predetermined surface.

With the present invention, even when the first electrode undergoes relative displacement in a predetermined direction with respect to the second electrode, the area of the region (first region) in which the projection pattern obtained by projecting the first electrode onto the second electrode side, and the second electrode overlap each other does not change. Therefore, according to an embodiment of the present invention, changes in capacitance due to displacement between electrodes formed across a dielectric layer can be suppressed, thereby allowing stable manufacturing of a capacitance device having a desired capacitance.

BRIEF DESCRIPTION OF DRAWINGS

FIG. 3(A) is a top view of a variable capacitance capacitor, and FIG. 3(B) is a bottom view of the variable capacitance capacitor.

FIG. 6 is a schematic cross-sectional view of a variable capacitance capacitor according to a first embodiment.

FIG. 7(A) is a top view of the variable capacitance capacitor according to the first embodiment, and FIG. 7(B) is a bottom view of the variable capacitance capacitor according to the first embodiment.

FIG. 9(A) is a diagram showing an overlapping state between the projection pattern of an upper electrode and a lower electrode in a case when the upper electrode is displaced in the +y direction, in accordance with the first embodiment, and FIG. 9(B) is a diagram showing an overlapping state between the projection pattern of the upper electrode and the lower electrode in a case when the upper electrode is displaced in the −y direction, in accordance with the first embodiment.

FIG. 10(A) is a diagram showing an overlapping state between the projection pattern of an upper electrode and a lower electrode in a case when the upper electrode is displaced in the +x direction, in accordance with the first embodiment, and FIG. 10(B) is a diagram showing an overlapping state between the projection pattern of the upper electrode and the lower electrode in a case when the upper electrode is displaced in the −x direction, in accordance with the first embodiment.

FIG. 11(A) and FIG. 11(B) are diagrams showing an overlapping state between an upper electrode and a lower electrode in a case when the extending direction of the upper electrode and the extending direction of the lower electrode are parallel to each other.

FIG. 15(A) is a diagram showing an overlapping state between the projection pattern of an upper electrode and a lower electrode in a case when the upper electrode is displaced in the +y direction, in accordance with Modification 1, and FIG. 15(B) is a diagram showing an overlapping state between the projection pattern of the upper electrode and the lower electrode in a case when the upper electrode is displaced in the −y direction, in accordance with Modification 1.

FIG. 17(A) is a configuration diagram of an upper electrode of a variable capacitance capacitor according to Modification 2, and FIG. 17(B) is a configuration diagram of a lower electrode of the variable capacitance capacitor according to Modification 2.

FIG. 18 is a diagram showing an overlapping state between the projection pattern of an upper electrode and a lower electrode in a case when there is no displacement, in accordance with Modification 2.

FIG. 19(A) is a diagram showing an overlapping state between the projection pattern of an upper electrode and a lower electrode in a case when the upper electrode is displaced in the +y direction, in accordance with Modification 2, and FIG. 19(B) is a diagram showing an overlapping state between the projection pattern of the upper electrode and the lower electrode in a case when the upper electrode is displaced in the −y direction, in accordance with Modification 2.

FIG. 20(A) is a diagram showing an overlapping state between the projection pattern of an upper electrode and a lower electrode in a case when the upper electrode is displaced in the +x direction, in accordance with Modification 2, and FIG. 20(B) is a diagram showing an overlapping state between the projection pattern of the upper electrode and the lower electrode in a case when the upper electrode is displaced in the −x direction, in accordance with Modification 2.

FIG. 21(A) is a configuration diagram of an upper electrode of a variable capacitance capacitor according to a second embodiment, and FIG. 21(B) is a configuration diagram of a lower electrode of the variable capacitance capacitor according to the second embodiment.

FIG. 34(A) is a top view of the variable capacitance capacitor shown in FIG. 33, and FIG. 34(B) is a cross-sectional view taken along the line A-A in FIG. 34(A).

FIG. 35 is an equivalent circuit diagram of the variable capacitance capacitor shown in FIG. 33.

FIG. 36(A) is a schematic perspective view of a variable capacitance capacitor according to a fifth embodiment, and FIG. 36(B) is a top view of the variable capacitance capacitor according to the fifth embodiment.

FIG. 39(A) is a schematic perspective view of a variable capacitance capacitor according to Modification 5, and FIG. 39(B) is a top view of the variable capacitance capacitor according to Modification 5.

FIG. 45(A) is a schematic perspective view of a variable capacitance device according to a seventh embodiment, and FIG. 45(B) is a top view of the variable capacitance device according to the seventh embodiment.

FIG. 46(A) is a configuration diagram of upper electrodes of the variable capacitance capacitor according to the seventh embodiment, and FIG. 46(B) is a configuration diagram of lower electrodes of the variable capacitance capacitor according to the seventh embodiment.

FIG. 47 is a diagram showing an overlapping state between the projection patterns of upper electrodes and lower electrodes in a case when there is no displacement, in accordance with the seventh embodiment.

FIG. 51(A) is a schematic perspective view of a variable capacitance device according to Modification 7, and FIG. 51(B) is a top view of the variable capacitance device according to Modification 7.

FIG. 52(A) is a configuration diagram of an upper electrode of the variable capacitance capacitor according to Modification 7, and FIG. 52(B) is a configuration diagram of lower electrodes of the variable capacitance capacitor according to Modification 7.

FIG. 53 is a diagram showing an overlapping state between the projection pattern of an upper electrode and lower electrodes in a case when there is no displacement, in the variable capacitance device according to Modification 7.

FIG. 61(A) is a schematic perspective view of a conventional four-terminal type variable capacitance device, and FIG. 61(B) is a cross-sectional diagram of the conventional four-terminal type variable capacitance device.

DESCRIPTION OF EMBODIMENTS

Figure 1:
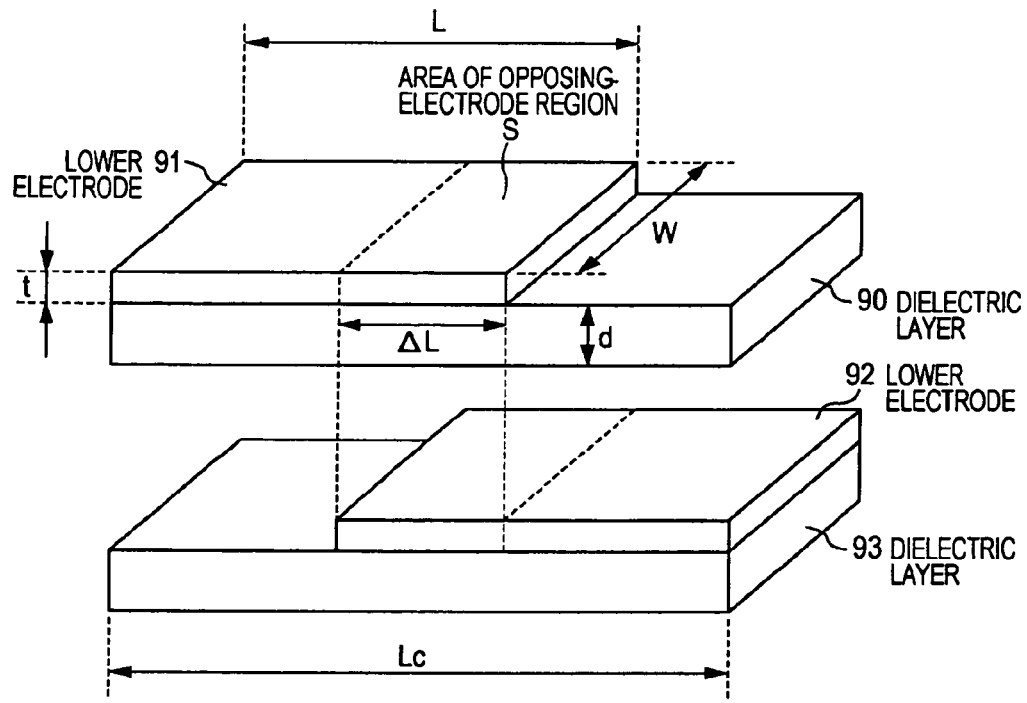
FIG. 1 is a schematic configuration diagram of a layered capacitor.

Hereinafter, examples of a capacitance device according to embodiments of the present invention will be described with reference to the drawings, in the following order. Description will be made with variable capacitance devices as examples of capacitance devices in the following examples, but the present invention is not restricted to this.
1. First Embodiment: Example of configuration of a two-terminal type variable capacitance device
2. Second Embodiment: Example of configuration of a two-terminal type variable capacitance device adapted for displacement in one direction
3. Third Embodiment: Example of configuration of a four-terminal type variable capacitance device
4. Fourth Embodiment: Example of configuration of a variable capacitance device which allows a further reduction in electrode resistance value
5. Fifth Embodiment: Example of configuration of a variable capacitance device which allows a reduction in the stray capacitance between external terminals;
6. Sixth Embodiment: Another example of configuration of a variable capacitance device which allows a reduction in the stray capacitance between external terminals;
7. Seventh Embodiment: Example of configuration of a variable capacitance device in which a plurality of variable capacitance capacitors are arrayed in a single ferroelectric layer
8. Eighth Embodiment: Example of configuration of non-contact reception device having the capacitance device of the present invention <1. First Embodiment>

In a first embodiment, a description will be given of an example of two-terminal type variable capacitance device with no control terminal additionally provided to control changes in capacitance.

[Influence of Displacement Between Electrodes]

Before describing the configuration of a variable capacitance device according to this embodiment, first, the above-described problem of displacement which is to be solved by the present invention will be described more specifically with reference to the drawings.

FIG. 1 shows the schematic configuration of a typical layered variable capacitance capacitor. An exploded view of the layered variable capacitance capacitor is shown in FIG. 1. The layered variable capacitance capacitor has a configuration in which a layer formed by a dielectric layer 90 and an upper electrode 91 formed on the dielectric layer 90, and a layer formed by a dielectric layer 93 and an lower electrode 92 formed on the dielectric layer 93 are layered.

The dielectric layer 90 has a plate-like shape. The upper electrode 91 is formed on the surface of the dielectric layer 90 so as to extend from its short side portion by a length L along the long sides of the dielectric layer 90. The layer formed by the dielectric layer 93 and the lower electrode 92 is of the same configuration as the layer formed by the dielectric layer 90 and the upper electrode 91.

When layering the layer formed by the dielectric layer 90 and the upper electrode 91 and the layer formed by the dielectric layer 93 and the lower electrode 92, the two layers are overlapped in such a way that their respective surface portions where electrodes are not formed (the surface regions where the dielectric layers 90 and 93 are exposed) do not overlap each other. Thus, there is formed a region in which a projection pattern obtained by projecting the upper electrode 91 onto the lower electrode 92 side, and the lower electrode 92 overlap (hereinafter, also referred to as opposing-electrode region). In the case of the two-terminal type variable capacitance capacitor shown in FIG. 1, electrode regions of the respective electrodes other than the opposing-electrode region are connected to a signal power supply and a control power supply via lead wires or the like.

With the area of the opposing-electrode region as S, the thickness of the dielectric layer 90 (electrode-to-electrode distance) d, the relative permittivity of the dielectric layer 90 $\in_r$, and the permittivity of vacuum $\in_0$, the capacitance C between the upper electrode 91 and the lower electrode 92 is represented by $C=\varepsilon_0 \times \varepsilon_r \times (S/d)$. In addition, with the width of each electrode as W, the thickness of each electrode t, the number of layers of electrodes N, and the resistivity of the electrode ρ, the DC resistance R of the variable capacitance capacitor is represented by $R=\rho \times L/(W \times t \times N)$.

To form a variable capacitance capacitor with a small capacitance (for example, 470 pF or less) by using a ferroelectric material whose relative permittivity ∈r is, for example, 1000 or higher, it is necessary to increase the electrode-to-electrode distance d (thickness of the dielectric layer 90) and/or reduce the area S of the opposing-electrode region. However, if the electrode-to-electrode distance d is increased as described above, the control voltage necessary for changing the capacitance becomes large (for example, about 50 to 100 V), which is not suitable for low-voltage drive (for example, about 5V or less) applications. Therefore, to drive a variable capacitance device at low voltage, it is necessary to make the area S of the opposing-electrode region small, that is, form each electrode small.

The area S of the opposing-electrode region can be made small by shortening the length ΔL of the opposing-electrode region with respect to the extending direction of the electrodes. With the capacitor length as Lc, the length ΔL of the opposing-electrode region is obtained by ΔL=2L−Lc (where L is the electrode length; see FIG. 1). Supposing that the capacitor length Lc is fixed, the length ΔL of the opposing-electrode region can be made smaller by shortening the electrode length L. In addition, the area S of the opposing-electrode region can be also made smaller by narrowing the electrode width W.

However, forming each electrode small causes a problem in that the resistance value R of the electrode becomes large. In particular, since, as described above, the resistance value R of an electrode is proportional to the electrode length L, and inversely proportional to the electrode width W, a decrease in the electrode width W leads to an increase in the resistance value R of each electrode. Accordingly, in a case of making the resistance value R of an electrode smaller, as for the shape of the electrode, it is desirable to make its length L short and make its width W wide.

The above-described problem about the resistance value of an electrode can be overcome by increasing the number N of layers of electrodes. However, if the number N of layers of electrodes increases, relative displacement between electrodes opposing each other across the dielectric layer will exert a greater influence on capacitance variations. It should be noted that the amount and direction of relative displacement between electrodes opposing each other across the dielectric layer varies in accordance with the precision of the manufacturing process (for example, mask positioning or the like) at the time of electrode formation.

Figure 2:
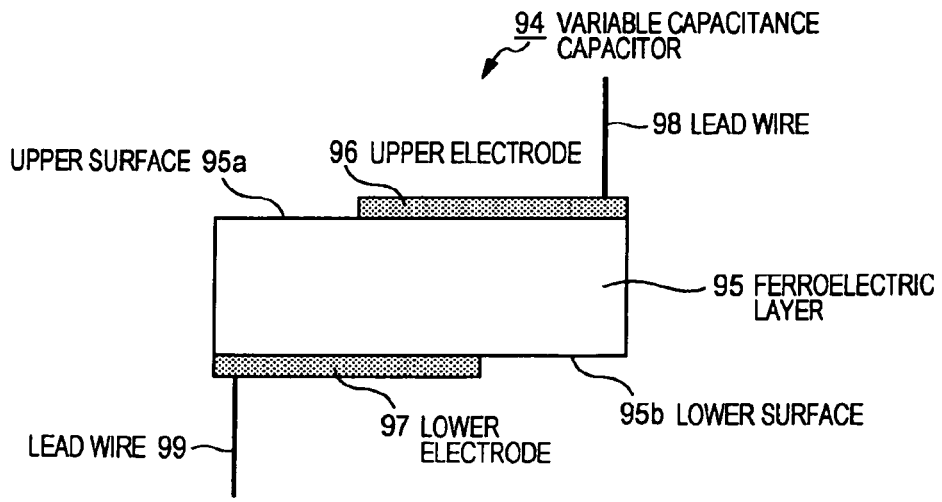
FIG. 2 is a schematic cross-sectional view of a variable capacitance capacitor.

Now, a description will be given of displacement between electrodes opposing each other across the dielectric layer, with reference to the drawings. FIG. 2 shows the schematic configuration of a conventional variable capacitance capacitor. In this case, for the simplicity of description, the description relates to the case of a variable capacitance capacitor with a single dielectric layer. A variable capacitance capacitor 94 includes a rectangular parallelepiped ferroelectric layer 95, and an upper electrode 96 and a lower electrode 97 that are formed so as to sandwich the ferroelectric layer 95. The variable capacitance capacitor 94 shown in FIG. 2 is a two-terminal type variable capacitance device. The upper electrode 96 and the lower electrode 97 are connected to a signal power supply and a control power supply via lead wires 98 and 99, respectively.

FIGS. 3(A) and (B) show the configurations of the upper electrode 96 and lower electrode 97 of the variable capacitance capacitor 94, respectively. FIGS. 3(A) and (B) are a top view and a bottom view of the variable capacitance capacitor 94, respectively.

The upper electrode 96 has a T-shape, and is formed on an upper surface 95a of the ferroelectric layer 95. The upper electrode 96 includes a terminal portion 96b formed along one short side of the upper surface 95a of the ferroelectric layer 95, and an electrode portion 96a that extends from the center of the terminal portion 96b in a direction (x direction) orthogonal to the extending direction (the y direction in FIG. 3(A)) of the terminal portion 96b. The lead wire 98 is connected to the terminal portion 96b.

On the other hand, the lower electrode 97 has a T-shape in the same way as with the upper electrode 96, and is formed on a lower surface 95b of the ferroelectric layer 95. The lower electrode 97 includes a terminal portion 97b formed along the other short side of the lower surface 95b of the ferroelectric layer 95, and an electrode portion 97a that extends from the center of the terminal portion 97b in a direction (x direction) orthogonal to the extending direction (the y direction in FIG. 3(B)) of the terminal portion 97b. The lead wire 99 is connected to the terminal portion 97b.

FIG. 4(A) to (C) and FIG. 5(A) to (C) show the relationship between the overlapping region of a projection pattern 96p of the upper electrode 96, which is obtained by projecting the upper electrode 96b onto the lower electrode 97 side (lower surface 95b of the ferroelectric layer 95), and the lower electrode 97, and displacement between the upper electrode 96 and the lower electrode 97.

Figure 4:
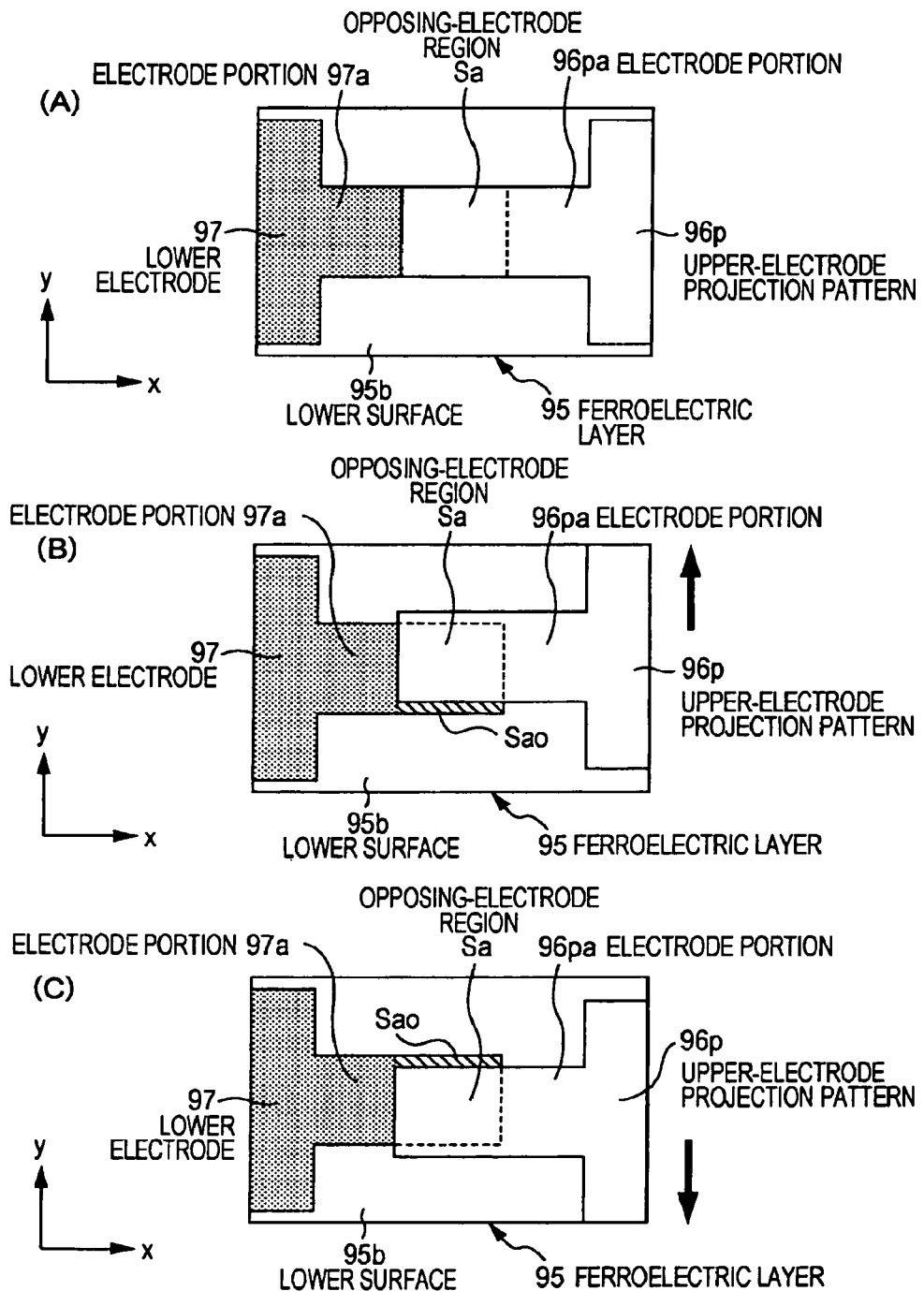
FIG. 4(A) is a diagram showing an overlapping state between the projection pattern of an upper electrode and a lower electrode in a case when there is no displacement.
FIG. 4(B) is a diagram showing an overlapping state between the projection pattern of the upper electrode and the lower electrode in a case when the upper electrode is displaced in the +y direction.
FIG. 4C is a diagram showing an overlapping state between the projection pattern of the upper electrode and the lower electrode in a case when the upper electrode is displaced in the −y direction.

FIG. 4(A) is a diagram showing the overlapping state of the projection pattern 96p of the upper electrode 96 (hereinafter, also referred to as upper-electrode projection pattern 96p) and the lower electrode 97 in a case when there is no relative displacement between the upper electrode 96 and the lower electrode 97. FIG. 4(B) is a diagram showing the overlapping state of the upper-electrode projection pattern 96p and the lower electrode 97 in a case when the upper electrode 96 is displaced in the +y direction (the upward direction in the drawing) relative to the lower electrode 97. FIG. 4C is a diagram showing the overlapping state of the upper-electrode projection pattern 96p and the lower electrode 97 in a case when the upper electrode 96 is displaced in the −y direction (the downward direction in the drawing) relative to the lower electrode 97. In each of FIGS. 4(B) and (C), the direction of displacement of the upper electrode 96 with respect to the lower electrode 97 is indicated by a heavy solid arrow.

Figure 5:
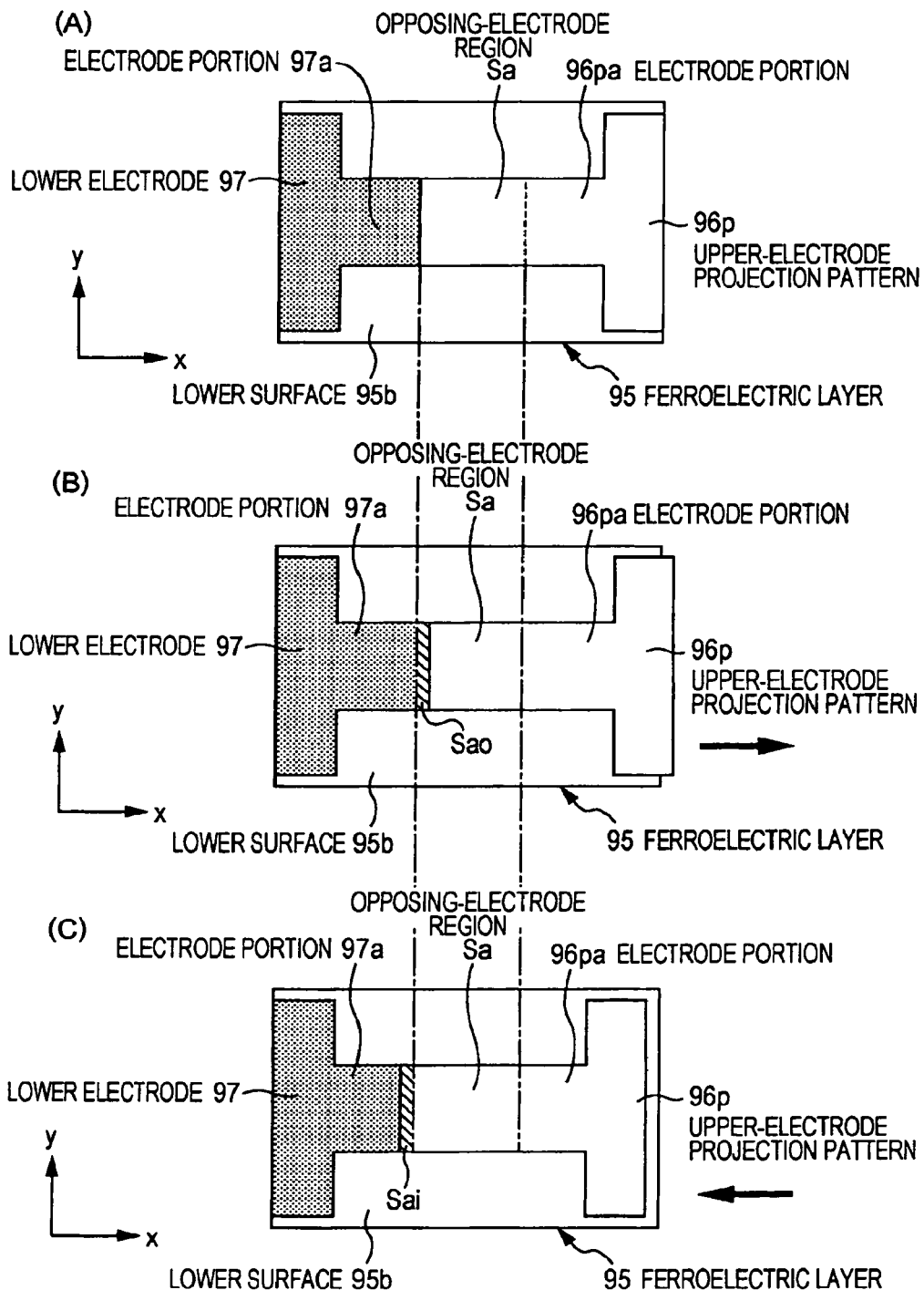
FIG. 5(A) is a diagram showing an overlapping state between the projection pattern of an upper electrode and a lower electrode in a case when there is no displacement.
FIG. 5(B) is a diagram showing an overlapping state between the projection pattern of the upper electrode and the lower electrode in a case when the upper electrode is displaced in the +x direction.
FIG. 5C is a diagram showing an overlapping state between the projection pattern of the upper electrode and the lower electrode in a case when the upper electrode is displaced in the −x direction.

Like FIG. 4(A), FIG. 5(A) is a diagram showing the overlapping state of the upper-electrode projection pattern 96p and the lower electrode 97 in a case when there is no relative displacement between the upper electrode 96 and the lower electrode 97. FIG. 5(B) is a diagram showing the overlapping state of the upper-electrode projection pattern 96p and the lower electrode 97 in a case when the upper electrode 96 is displaced in the +x direction (the rightward direction in the drawing) relative to the lower electrode 97. FIG. 5C is a diagram showing the overlapping state of the upper-electrode projection pattern 96p and the lower electrode 97 in a case when the upper electrode 96 is displaced in the −x direction (the leftward direction in the drawing) relative to the lower electrode 97. In each of FIG. 5(B) and (C), the direction of displacement of the upper electrode 96 with respect to the lower electrode 97 is indicated by a heavy solid arrow.

When the upper electrode 96 and the lower electrode 97 are displaced relative to each other as shown in, for example, FIGS. 4(B) and (C) and FIG. 5(B), an electrode region Sao that comes to lie outside the opposing-electrode region Sa is produced. In this case, the area of the opposing-electrode region Sa becomes smaller than that in the case when there is no displacement. In the case of, for example, FIG. 5C, due to the displacement between the upper electrode 96 and the lower electrode 97, an electrode region Sai that is newly added to the opposing-electrode region Sa is produced, and the area of the opposing-electrode region Sa becomes larger than that in the case when there is no displacement.

The layered variable capacitance capacitor 94 described above is fabricated by fabricating a plurality of dielectric layers with electrodes in advance, and layering those dielectric layers sequentially. Then, by connecting upper electrodes together by an external electrode and connecting lower electrodes together by the other external electrode, and connecting capacitor components formed for individual dielectric layers in parallel, a large capacitance (proportional to the number of layers) and a small resistance (inversely proportional to the number of layers) are attained.

The amount of displacement between electrodes opposing each other across the dielectric layer at the time of layering each layer varies in accordance with the precision of mask positioning or the like at the time of electrode formation, but under the current manufacturing process, the amount of displacement is about 10 µl, for example. In the case of, for example, fabricating a large capacitance capacitor with an electrode length of about 800 µm, the influence of displacement on capacitance variations is very small. However, in the case of, for example, fabricating a layered variable capacitance capacitor with a capacitance of about 66 pF by setting the relative permittivity $\in_y$ and thickness d of the dielectric layer to 3000 and 2 µl, respectively, the size of the opposing-electrode region Sa becomes about 50 µm×50 µm. In this case, the above-described amount of displacement (about 10 µm) becomes non-negligible, so a variable capacitance capacitor with a desired capacitance cannot be stably fabricated.

Accordingly, according to an embodiment of the present invention, the above problem is overcome by suppressing changes in the opposing-electrode region Sa due to relative displacement between electrodes opposing each other across the dielectric layer formed of a ferroelectric material.

[Configuration of Variable Capacitance Capacitor]

FIG. 6 shows the schematic configuration of a variable capacitance capacitor according to this embodiment. FIGS. 7(A) and (B) each show the configuration of an electrode according to this embodiment. FIGS. 7(A) and (B) are a top view and a bottom view, respectively, of the variable capacitance capacitor.

A variable capacitance capacitor 1 (variable capacitance device) mainly includes a ferroelectric layer 10, and an upper electrode 11 and a lower electrode 12 that are formed so as to sandwich the ferroelectric layer 10. The upper electrode 11 and the lower electrode 12 are connected to a signal power supply and a control power supply (not shown) via lead wires 13 and 14, respectively. As will be described later, when fabricating the variable capacitance capacitor 1 according to this embodiment, the ferroelectric layer 10 with the upper electrode 11 formed thereon, and another ferroelectric layer with the lower electrode 12 formed thereon are layered (a configuration such as shown in FIG. 1). It should be noted, however, that for the simplicity of description, FIG. 6 does not show the other ferroelectric layer on which the lower electrode 12 is formed.

The ferroelectric layer 10 (dielectric layer) is formed of a dielectric material of which the capacitance changes in accordance with externally-applied control signals. For example, this may be configured of a sheet-like member formed of such a ferroelectric material whose relative permittivity exceeds 1000 (the thickness is, for example, about 2 µl). The shape of each of a surface 10a of the ferroelectric layer 10 on which an electrode is formed, and a surface 10b opposite to the surface 10a (hereinafter, respectively referred to as upper surface 10a and lower surface 10b) is rectangular. The ratio between the long and short sides of the rectangle can be set as, for example, 2:1.

As for the material forming the ferroelectric layer 10, a ferroelectric material that exhibits ion polarization can be used. The ferroelectric material that exhibits ion polarization is a ferroelectric material that is formed from an ion crystal material, and undergoes electrical polarization as the atoms of positive and negative ions are displaced. With two predetermined elements as A and B, this ferroelectric material exhibiting ion polarization is represented by a chemical formula $ABO_3$ (O is an oxygen element), and has a perovskite structure. Examples of such ferroelectric material include barium titanate ($BaTiO_3$), potassium niobate ($KNbO_3$), and lead titanate ($PbTiO_3$). Examples of materials which can be used to form the ferroelectric layer 10 include PZT (lead zirconate titanate) obtained by mixing lead zirconate ($PbZrO_3$) with lead titanate ($PbTiO_3$).

As for the material forming the ferroelectric layer 10, a ferroelectric material that exhibits electronic polarization may be used as well. In this ferroelectric material, an electric dipole moment occurs due to separation between positive and negative charge portions, causing polarization. As an example of such a material, there has conventionally been proposed a rare-earth iron oxide that exhibits ferroelectric characteristics by forming polarization through formation of a $Fe^{2+}$ charge surface and a $Fe^{3+}$ charge surface. It has been reported that in this system, with a rare-earth element as RE, and an iron group element as TM, a material represented by a molecular formula $(RE).(TM)_2.O_4$ (O: oxygen element) has a high permittivity. Examples of rare-earth element include Y, Er, Yb, and Lu (in particular, Y and a heavy rare-earth element), and examples of iron group element include Fe, Co, and Ni (in particular, Fe). In addition, examples of $(RE).(TM)_2.O_4$ include $ErFe_2O_4$, $LuFe_2O_4$, and $YFe_2O_4$. As the material forming the ferroelectric layer 10, a ferroelectric material having anisotropy may be used.

The upper electrode 11 (first electrode) is formed on the upper surface 10a of the ferroelectric layer 10. As shown in FIG. 7(A), the upper electrode 11 has a substantially L-shape (first shape). The upper electrode 11 includes an electrode portion 11a (first electrode portion), and a terminal portion 11b. The terminal portion 11b is formed along one short side (the right short side in the drawing) of the upper surface 10a of the ferroelectric layer 10. The electrode portion 11a is formed so as to extend from a position on one long side (the lower long side in the drawing) of the terminal portion 11b in a direction (x direction: first direction) orthogonal to the extending direction (the y direction in FIG. 7(A)) of the terminal portion 11b.

The lower electrode 12 (second electrode) is formed on the lower surface 10b of the ferroelectric layer 10. As shown in FIG. 7(B), the lower electrode 12 has a substantially U-shape (second shape). The lower electrode 12 includes an electrode portion 12a (second electrode portion), and a terminal portion 12b. The terminal portion 12b has an L-shape, and includes a short side portion formed along the other short side (the left short side in the drawing) of the lower surface 10b of the ferroelectric layer 10, and a long side portion formed along one long side (the upper long side in the drawing) of the lower surface 10b. The electrode portion 12a is formed so as to extend from the ends of the long side portion of the terminal portion 12b in a direction (y direction: second direction) orthogonal to the extending direction (the x direction in FIG. 7(B)) of the long side portion of the terminal portion 12b.

The upper electrode 11 and the lower electrode 12 are formed by using, for example, a conductive paste containing impalpable metallic powder (such as Pd, Pd/Ag, or Ni). This enables reduction in the manufacturing cost of the variable capacitance capacitor 1.

[Method of Fabricating Variable Capacitance Capacitor]

Now, an example of method of fabricating the variable capacitance capacitor 1 according to this embodiment will be briefly described. First, a sheet member made of the ferroelectric material described above is prepared. This sheet member serves as the ferroelectric layer 10 described above.

Next, for example, a conductive paste of metallic impalpable powder such as Pd, Pd/Ag/ or Ni is prepared. Then, the conductive paste is coated (by silk-screen printing or the like) onto one surface of the sheet member via a mask in which an opening corresponding to an electrode shape is formed, thereby forming the upper electrode 11. Then, in the same manner as the upper electrode 11, the lower electrode 12 is formed on one surface of another sheet member (not shown).

Then, the sheet member coated with the upper electrode 11 (conductive paste layer), and the other sheet member coated with the lower electrode 12 (conductive paste layer) are layered in such a way that the sheet members and the conductive paste layers are placed alternately. Then, the resulting layered member is subjected to thermal compression bonding. Then, the member that has undergone thermal compression bonding is fired at high temperature in reducing atmosphere, thereby integrating the sheet members and the conductive paste layers (the upper electrode 11 and the lower electrode 12) together. In this embodiment, the variable capacitance capacitor 1 according to this embodiment is fabricated in this way.

While this embodiment relates to the example of a configuration in which there is a single ferroelectric layer 10 serving as a capacitor, the present invention is not limited to this, and a plurality of ferroelectric layers 10 may be layered via electrodes. In this case, a plurality of sheet members each made of a ferroelectric material with an electrode formed on one surface (ferroelectric layers with an electrode) are fabricated in the same manner as the above-described manufacturing method, for example, and those sheet members are layered sequentially to thereby fabricate the variable capacitance capacitor 1. In this case, an external electrode terminal that connects between a plurality of upper electrodes 11, and another external terminal that connects between a plurality of lower electrodes 12 are provided, and capacitor components formed for individual ferroelectric layers 10 are connected in parallel by the external electrode terminals. In this way, the capacitance (proportional to the number of layers) of the variable capacitance capacitor can be made larger, and its resistance value (inversely proportional to the number of layers) can be made smaller.

[Design Overview of Electrode Shape]

Figure 8:
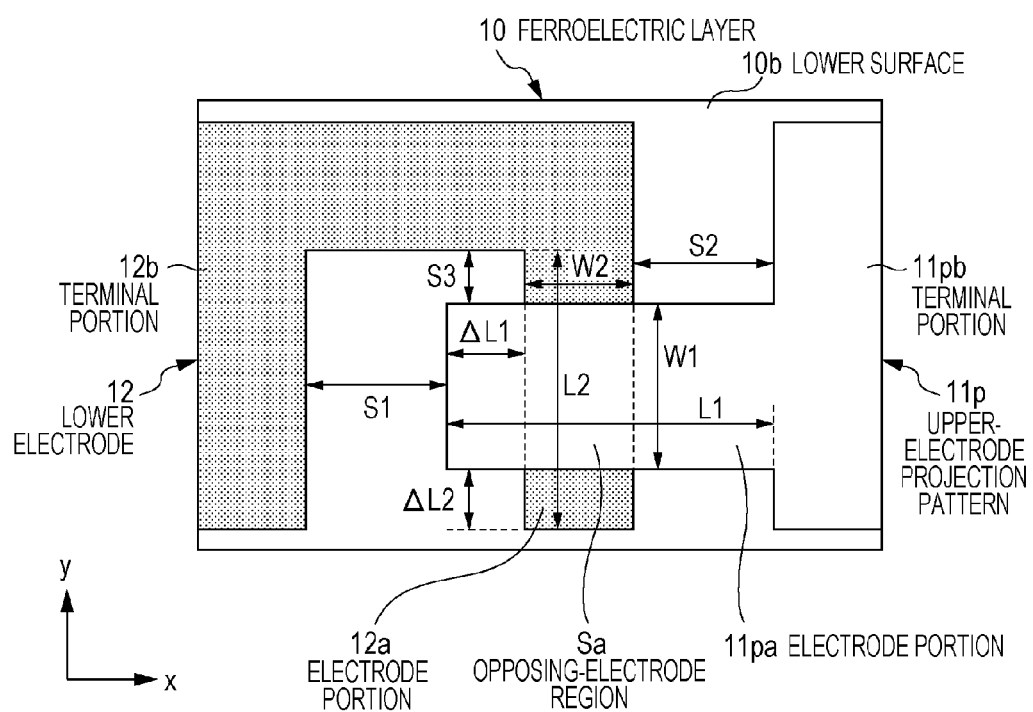
FIG. 8 is a diagram showing an overlapping state between the projection pattern of an upper electrode and a lower electrode in a case with no displacement, in accordance with the first embodiment.

Next, a design overview of the upper electrode 11 and the lower electrode 12 in the variable capacitance capacitor 1 according to this embodiment will be described with reference to FIG. 8. FIG. 8 shows an overlapping state between an upper-electrode projection pattern 11p, which is obtained by projecting the upper electrode 11 onto the lower surface 10b of the ferroelectric layer 10, and the lower electrode 12. FIG. 8 shows an overlapping state between the upper-electrode projection pattern 11p and the lower electrode 12 in a case when the upper electrode 11 is not displaced with respect to the lower electrode 12. FIG. 8 also shows an example of main dimensional parameters ($\Delta L1$, $\Delta L2$, S1 to S3, L1, L2, W1, and W2) that are to be considered when designing the shapes and dimensions of electrodes in accordance with this embodiment. It should be noted that the dimensional parameters to be considered when designing the electrodes are not limited to those of the example shown in FIG. 8.

In this embodiment, a description will be given of a case in which the upper electrode 11 undergoes displacement with respect to the lower electrode 12 in the extending directions of the long and short sides of the lower surface 10b of the ferroelectric layer 10, that is, in the x direction and the y direction in FIG. 8.

In this embodiment, the upper electrode 11 and the lower electrode 12 are formed in such a way that the extending direction (x direction) of an electrode portion 11pa of the upper-electrode projection pattern 11p and the extending direction (y direction) of the electrode portion 12a of the lower electrode 12 are orthogonal to each other. In addition, the shapes and dimensions of the upper electrode 11 and lower electrode 12 are designed by taking into consideration the necessary capacitance value and resistance value, and the assumed maximum amount of displacement between the electrodes. More specifically, the respective electrodes are designed so that the dimensional parameters as shown in FIG. 8 satisfy the following conditions, for example.

(1) $\Delta L1$ $\Delta L1$ is the distance between the distal end of the electrode portion 11pa of the upper-electrode projection pattern 11p, and the electrode portion 12a of the lower electrode 12. In this embodiment, the length L1 of the electrode portion 11a of the upper electrode 11 is set such that $\Delta L1 \geq 0$ even when the amount of relative displacement of the upper electrode 11 in the +x direction with respect to the lower electrode 12 becomes an assumed maximum value.

(2) $\Delta L2$ $\Delta L2$ is the distance between the distal end of the electrode portion 12a of the lower electrode 12, and the electrode portion 11pa of the upper-electrode projection pattern 11p. In this embodiment, the length L2 of the electrode portion 12a of the lower electrode 12 is set such that $\Delta L2 \geq 0$ even when the amount of relative displacement of the upper electrode 11 in the −y direction with respect to the lower electrode 12 becomes an assumed maximum value.

(3) S1

S1 is the distance between the distal end of the electrode portion 11pa of the upper-electrode projection pattern 11p, and the short side portion of the terminal portion 12b of the lower electrode 12. In this embodiment, S1 is set such that the condition $S1 \geq 0$ is satisfied even when the amount of relative displacement of the upper electrode 11 in the −x direction with respect to the lower electrode 12 becomes an assumed maximum value. That is, S1 is set such that the distal end of the electrode portion 11pa of the upper-electrode projection pattern 11p does not overlap the short side portion of the terminal portion 12b of the lower electrode 12, when the relative displacement of the upper electrode 11 in the −x direction with respect to the lower electrode 12 becomes maximum.

(4) S2

S2 is the distance between the terminal portion 11pb of the upper-electrode projection pattern 11p, and the electrode portion 12a of the lower electrode 12. In this embodiment, S2 is set such that the condition $S2 \geq 0$ is satisfied even when the amount of relative displacement of the upper electrode 11 in the −x direction with respect to the lower electrode 12 becomes an assumed maximum value. That is, S2 is set such that the terminal portion 11pb of the upper-electrode projection pattern 11p does not overlap the electrode portion 12a of the lower electrode 12 when the amount of relative displacement of the upper electrode 11 in the −x direction with respect to the lower electrode 12 becomes maximum.

(5) S3

S3 is the distance between the electrode portion 11pa of the upper-electrode projection pattern 11p, and the long side portion of the terminal portion 12b of the lower electrode 12. In this embodiment, S3 is set such that the condition S≥0 is satisfied even when the amount of relative displacement of the upper electrode 11 in the +y direction with respect to the lower electrode 12 becomes an assumed maximum value. That is, S3 is set such that the electrode portion 11pa of the upper-electrode projection pattern 11p does not overlap the long side portion of the terminal portion 12b of the lower electrode 12 when the amount of relative displacement of the upper electrode 11 in the +y direction with respect to the lower electrode 12 becomes maximum.

(6) L1 and L2

L1 and L2 are the length of the electrode portion 11a of the upper electrode 11 and the length of the electrode portion 12a of the lower electrode 12, respectively. In this embodiment, L1 and L2 are set by taking into consideration, for example, their relation with the dimensional parameters (1) to (5) mentioned above (ΔL1, ΔL2, and S1 to S3), and the necessary capacitance value and resistance value of the variable capacitance capacitor.

(7) W1 and W2

W1 and W2 are the width of the electrode portion 11a of the upper electrode 11 and the width of the electrode portion 12a of the lower electrode 12, respectively. In this embodiment, W1 and W2 are set by taking into consideration, for example, their relation with the dimensional parameters (1) to (5) mentioned above (ΔL1, ΔL2, and S1 to S3), and the necessary capacitance value and resistance value of the variable capacitance capacitor.

It should be noted that the shapes of the upper electrode 11 and lower electrode 12 are not limited to the shapes according to this embodiment (the shapes shown in FIGS. 7(A) and (B). Any shape that satisfies the conditions described above with reference to the design overview can be employed.

[Relationship Between Displacement and Area of Opposing-Electrode Region]

By forming the upper electrode 11 and the lower electrode 12 in the manner as described above, the area of the opposing-electrode region Sa can be made to be constant even when the relative position between the upper electrode 11 and the lower electrode 12 is displaced in one or both of the x direction and the y direction. This is illustrated in FIGS. 9(A) and (B) and FIGS. 10(A) and (B). FIGS. 9(A) and (B) and FIGS. 10(A) and (B) are diagrams showing the relationship between the overlapping region Sa (opposing-electrode region) of the upper-electrode projection pattern 11p and the lower electrode 12, and displacement between the upper electrode 11 and the lower electrode 12.

FIG. 9(A) is a diagram showing a state in which the upper electrode 11 is displaced in the +y direction (the upward direction in the drawing) relative to the lower electrode 12. FIG. 9(B) is a diagram showing a state in which the upper electrode 11 is displaced in the −y direction (the downward direction in the drawing) relative to the lower electrode 12. The alternate long and short dash line in each of FIGS. 9(A) and (B) indicates the position of the upper-electrode projection pattern 11p in a case when the upper electrode 11 is not displaced with respect to the lower electrode 12. In each of FIGS. 9(A) and (B), the direction of displacement of the upper electrode 11 with respect to the lower electrode 12 is indicated by a heavy solid arrow.

FIG. 10(A) is a diagram showing a state in which the upper electrode 11 is displaced in the +x direction (the rightward direction in the drawing) relative to the lower electrode 12. FIG. 10(B) is a diagram showing a state in which the upper electrode 11 is displaced in the −x direction (the leftward direction in the drawing) relative to the lower electrode 12. The alternate long and short dash line in each of FIG. (A) and (B) indicates the position of the upper-electrode projection pattern 11p in a case when the upper electrode 11 is not displaced with respect to the lower electrode 12. In each of FIGS. 10(A) and (B), the direction of displacement of the upper electrode 11 with respect to the lower electrode 12 is indicated by a heavy solid arrow.

As is apparent from FIGS. 9(A) and (B) and FIGS. 10(A) and (B), even when the relative position between the upper electrode 11 and lower electrode 12 of the variable capacitance capacitor 1 according to this embodiment is displaced in either of the x direction and the y direction, the area of the opposing-electrode region Sa (first region) does not change. Stated more specifically, the area of an electrode portion where the upper electrode 11 and the lower electrode 12 newly overlap (for example, the region Sai in FIGS. 9(A) and (B)) due to displacement, and the area of an electrode portion that comes to lie outside the opposing-electrode region Sa due to displacement (for example, the region Sao in FIGS. 9(A) and (B)) are equal to each other. Thus, the area of the opposing-electrode region Sa does not change.

Therefore, in the case of the variable capacitance capacitor 1 according to this embodiment, even when the relative position between the upper electrode 11 and the lower electrode 12 is displaced in either of the x direction and the y direction, the area of the opposing-electrode region Sa does not change, nor does the capacitance. Thus, according to this embodiment, in the case of manufacturing a variable capacitance capacitor with a small capacitance in pF order by using a ferroelectric material, a variable capacitance capacitor with a desired capacitance can be fabricated in a stable manner irrespective of the displacement between electrodes opposing each other across a dielectric layer.

In addition, according to this embodiment, by narrowing the width of the electrode portion of the upper electrode 11 and/or the lower electrode 12, a variable capacitance capacitor with a smaller capacitance can be easily fabricated.

Further, according to this embodiment, the opposing electrode area can be made to be constant (make the capacitance invariant) even when displacement occurs between electrodes opposing each other across a ferroelectric layer. Therefore, the electrode area per layer can be made smaller to increase the number of layers. This enables making the capacitance of the variable capacitance capacitor larger and its resistance value lower. In addition, according to this embodiment, the electrodes can be formed easily and at low cost.

Now, a description will be given in detail of the reason why a larger capacitance and a lower resistance value can be achieved in the case of a variable capacitance capacitor of a type in which the extending directions of the electrode portions of upper and lower electrodes opposing each other across a ferroelectric layer are made to cross each other as in this embodiment.

FIGS. 11(A) and (B) show an overlapping state between the electrode portion of the upper electrode (hereinafter, referred to as upper electrode portion) and the electrode portion of the lower electrode (hereinafter, referred to as lower electrode portion), in a case when the extending directions of the two electrode portions coincide with each other. The widths of an upper electrode portion 253 and a lower electrode portion 254 shown in FIG. 11(B) are ½ of the widths of an upper electrode portion 251 and a lower electrode portion 252 according to the electrode configuration (hereinafter, referred to as reference configuration) shown in FIG. 11(A), respectively. In addition, the lengths of the upper electrode portion 253 and the lower electrode portion 254 shown in FIG. 11(B) are the same as the lengths of the upper electrode portion 251 and the lower electrode portion 252 according to the reference configuration shown in FIG. 11(A), respectively.

In this case, the opposing area between the upper electrode portion 253 and the lower electrode portion 254 shown in FIG. 11(B) is ½ of that according to the reference configuration shown in FIG. 11(A). As a result, in the case of the electrode configuration shown in FIG. 11(B), the capacitance and the resistance of the electrode portions are ½ and twice, respectively, of those according to the reference configuration. That is, in the case of a capacitor of a type in which the extending direction of the upper electrode portion and the extending direction of the lower electrode portion are made to coincide with each other, if only the width of each of the electrode portions is set to 1/n of that according to the reference configuration, the capacitance becomes 1/n of that according to the reference configuration, and the resistance of each of the electrode portions becomes n times of that according to the reference configuration. Therefore, in the case of a capacitor of a type in which the upper electrode and the lower electrode are placed in parallel as shown in FIGS. 11(A) and (B), to obtain the same capacitance as that according to the reference configuration by using an electrode configuration in which only the width of each of the electrode portions is set to 1/n, it is necessary to layer n layers of the capacitor whose width of each of the electrode portions is set to 1/n. In this case, the resistance of the capacitor as a whole becomes the same as that according to the reference configuration.

Figure 12:
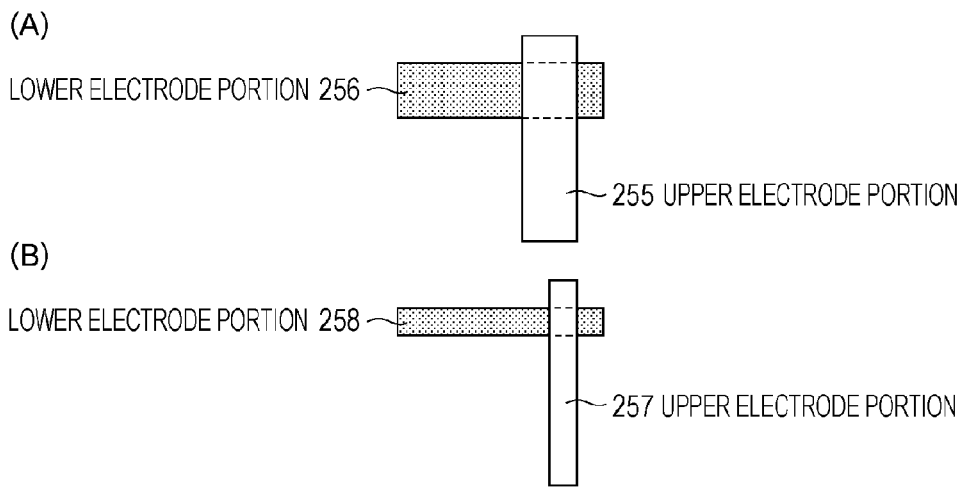
FIG. 12(A) and FIG. 12(B) are diagrams showing an overlapping state between an upper electrode and a lower electrode in a case when the extending direction of the upper electrode and the extending direction of the lower electrode cross each other.

FIGS. 12(A) and (B) show an overlapping state between the upper electrode portion and the lower electrode portion in a case when the extending directions of the two electrode portions are orthogonal to each other. The widths of an upper electrode portion 257 and a lower electrode portion 258 shown in FIG. 12(B) are ½ of the widths of an upper electrode portion 255 and a lower electrode portion 256 according to the electrode configuration (hereinafter, referred to as reference configuration) shown in FIG. 12(A), respectively. In addition, the lengths of the upper electrode portion 257 and the lower electrode portion 258 shown in FIG. 12(B) are the same as the lengths of the upper electrode portion 255 and the lower electrode portion 256 according to the reference configuration shown in FIG. 12(A), respectively.

In this case, the opposing area between the upper electrode portion 257 and the lower electrode portion 258 shown in FIG. 12(B) is ¼ of that according to the reference configuration shown in FIG. 12(A). As a result, in the case of the electrode configuration shown in FIG. 12(B), the capacitance and the resistance of the electrode portions are ¼ and twice, respectively, of those according to the reference configuration. That is, in the case of a capacitor of a type in which the extending direction of the upper electrode portion and the extending direction of the lower electrode portion are made to cross each other, if only the width of each of the electrode portions is set to 1/n of that according to the reference configuration, the capacitance becomes $1/n^2$ of that according to the reference configuration, and the resistance of each of the electrode portions becomes n times of that according to the reference configuration. Therefore, in the case of a capacitor of a type in which the upper electrode and the lower electrode are made to cross each other as shown in FIGS. 12(A) and (B), to obtain the same capacitance as that according to the reference configuration by using an electrode configuration in which only the width of each of the electrode portions is set to 1/n, it is necessary to layer $n^2$ layers of the capacitor whose width of each of the electrode portions is set to 1/n. In this case, the resistance of the capacitor as a whole becomes 1/n of that according to the reference configuration.

From the foregoing, in the case of a layered capacitor of a type in which the upper electrode and the lower electrode are made to cross each other, the resistance value of the layered capacitor as a whole can be made smaller in comparison to a layered capacitor of a type in which the upper electrode and the lower electrode are placed in parallel.

[Modification 1]

While description has been made in the above first embodiment relating to the case in which the extending direction (x direction) of the electrode portion 11a of the upper electrode 11 and the extending direction (y direction) of the electrode portion 12a of the lower electrode 12 are orthogonal to each other, the present invention is not limited to this. In Modification 1, a description will be given of an example of configuration in which the extending direction of the electrode portion of the upper electrode and the extending direction of the electrode portion of the lower electrode are not orthogonal to each other.

[Electrode Configuration]

Figure 13:
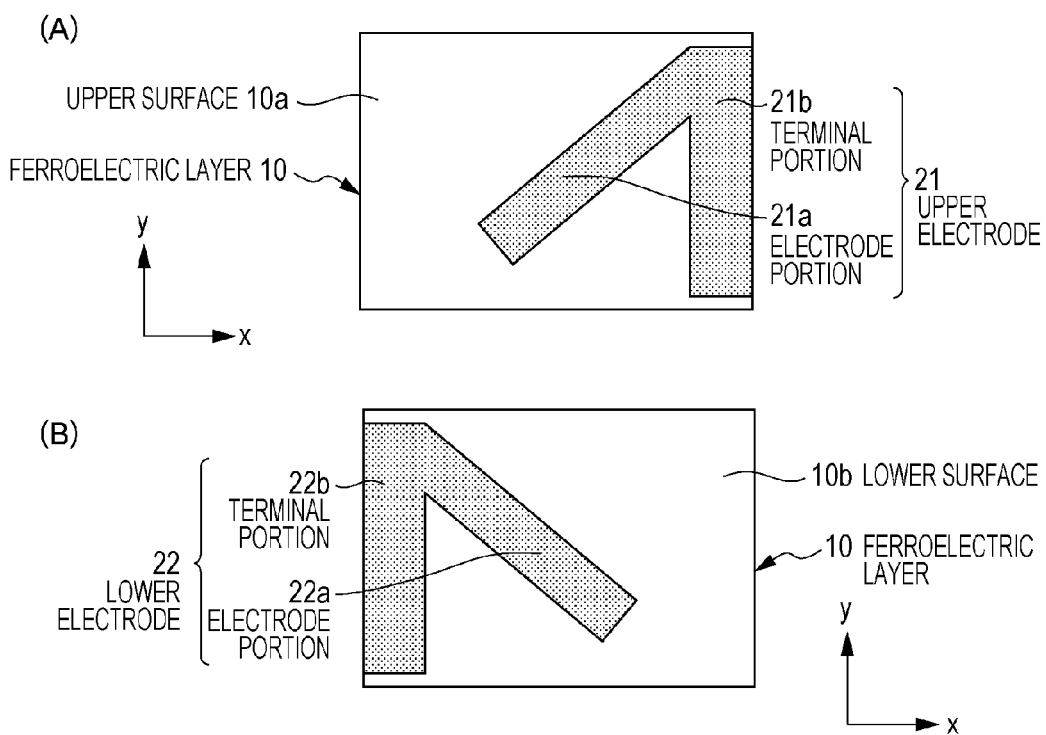
FIG. 13(A) is a configuration diagram of an upper electrode of a variable capacitance capacitor according to Modification 1.
FIG. 13(B) is a configuration diagram of a lower electrode of the variable capacitance capacitor according to Modification 1.

FIGS. 13(A) and (B) show the configurations of an upper electrode and lower electrode of a variable capacitance capacitor according to Modification 1, respectively. FIGS. 13(A) and (B) are a top view and a bottom view of the variable capacitance capacitor according to Modification 1, respectively. Modification 1 is of the same configuration as the variable capacitance capacitor 1 according to the above first embodiment (FIG. 6 and FIGS. 7(A) and (B)), except that the configurations (shapes) of an upper electrode 21 and lower electrode 22 are changed. In FIGS. 13(A) and (B), the same components as those according to the above first embodiment (FIGS. 7(A) and (B)) are denoted by the same symbols.

The upper electrode 21 has a V-shape, and includes an electrode portion 21a and a terminal portion 21b. The terminal portion 21b is formed along one short side (the right short side in the drawing) of the upper surface 10a of the ferroelectric layer 10. The electrode portion 21a is formed so as to extend from one end of the terminal portion 21b in an oblique direction (non-orthogonal direction) with respect to the extending direction of the terminal portion 11b (the y direction in FIG. 13(A)). In the drawing in FIG. 13(A), the electrode portion 21a extends in a direction from the upper right corner portion of the upper surface 10a of the ferroelectric layer 10 toward the opposing lower left corner portion.

The lower electrode 22 has a V-shape, and has a symmetrical shape as to the upper electrode 21 with respect to the y direction in the plane of FIG. 13(B). In addition, the lower electrode 22 includes an electrode portion 22a and a terminal portion 22b. The terminal portion 22b is formed along the other short side (the left short side in the drawing) of the lower surface 10b of the ferroelectric layer 10. The electrode portion 22a is formed so as to extend from one end of the terminal portion 22b in an oblique direction (non-orthogonal direction) with respect to the extending direction of the terminal portion 21b (the y direction in FIG. 13(B)). In the drawing of FIG. 13(B), the electrode portion 22a extends in a direction from the upper left corner portion of the lower surface 10b of the ferroelectric layer 10 toward the opposing lower right corner portion. The extending direction of the electrode portion 22a of the lower electrode 22 is not orthogonal to the extending direction of the electrode portion 21a of the upper electrode 21.

The variable capacitance capacitor according to Modification 1 can be fabricated in the same manner as, for example, the manufacturing method according to the first embodiment described above. While in Modification 1 the description relates to the case of configuration in which there is a single ferroelectric layer 10, the present invention is not limited to this, and a plurality of ferroelectric layers 10 may be layered via electrodes.

[Design Overview of Electrode Shape]

Figure 14:
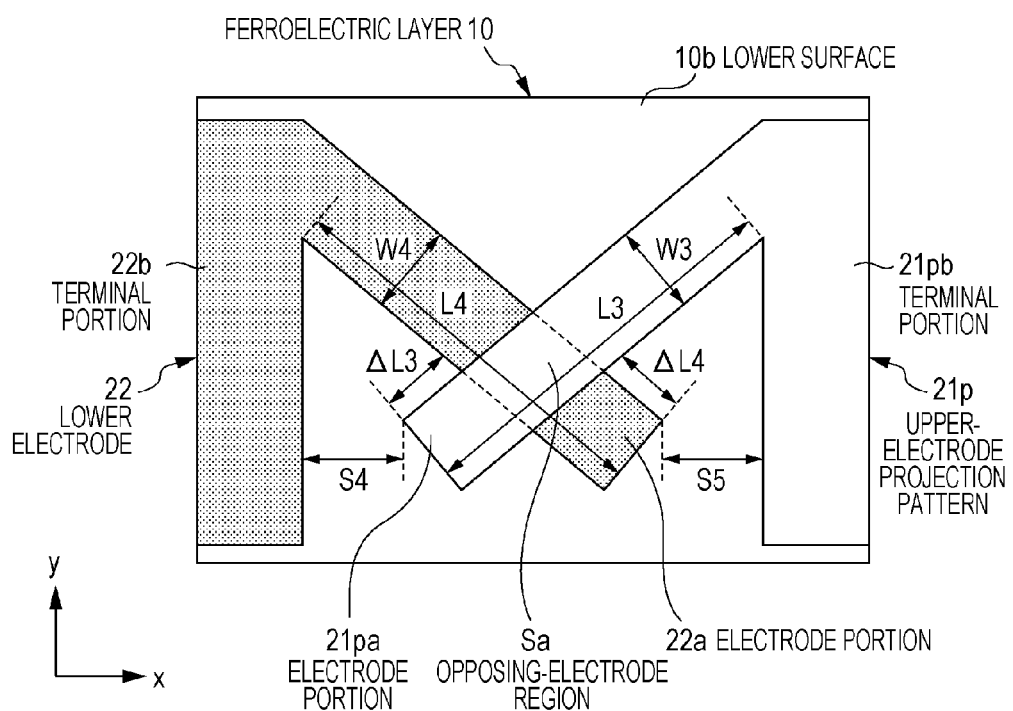
FIG. 14 is a diagram showing an overlapping state between the projection pattern of an upper electrode and a lower electrode in a case when there is no displacement, in accordance with Modification 1.

Next, a design overview of the upper electrode 21 and the lower electrode 22 in the variable capacitance capacitor according to Modification 1 will be described with reference to FIG. 14. FIG. 14 shows an overlapping state between an upper-electrode projection pattern 21p, which is obtained by projecting the upper electrode 21 according to Modification 1 onto the lower surface 10b of the ferroelectric layer 10, and the lower electrode 22. FIG. 14 shows an overlapping state between the upper-electrode projection pattern 21p and the lower electrode 22 in a case when the upper electrode 21 is not displaced with respect to the lower electrode 22. FIG. 14 also shows an example of main dimensional parameters ($\Delta L3$, $\Delta L4$, S4, S5, L3, L4, W3, and W4) that are to be considered when designing the shapes and dimensions of electrodes in accordance with Modification 1. It should be noted that the dimensional parameters to be considered when designing the electrodes are not limited to those of the example shown in FIG. 14.

In Modification 1, the upper electrode 21 and the lower electrode 22 are formed in such a way that the extending direction of an electrode portion 21pa of the upper-electrode projection pattern 21p and the extending direction of the electrode portion 22a of the lower electrode 22 cross (but are not orthogonal to) each other. In addition, the shapes and dimensions of the upper electrode 21 and lower electrode 22 are designed by taking into consideration the necessary capacitance value and resistance value, and the assumed maximum amount of displacement between the electrodes. More specifically, the respective electrodes are designed so that the dimensional parameters as shown in FIG. 14 satisfy the following conditions, for example.

(1) $\Delta L3$ $\Delta L3$ is the minimum distance between the distal end of the electrode portion 21pa of the upper-electrode projection pattern 21p, and the electrode portion 22a of the lower electrode 22. In this example, the minimum length L3 of the electrode portion 21a of the upper electrode 21 is set such that $\Delta L \geq 0$ even when the amount of relative displacement of the upper electrode 21 in each of the +x and +y directions with respect to the lower electrode 22 becomes an assumed maximum value.

(2) $\Delta L4$ $\Delta L4$ is the minimum distance between the distal end of the electrode portion 22a of the lower electrode 22, and the electrode portion 21pa of the upper-electrode projection pattern 21p. In this example, the minimum length L4 of the electrode portion 22a of the lower electrode 22 is set such that $\Delta L4 \geq 0$ even when the amount of relative displacement of the upper electrode 21 in each of the +x and −y directions with respect to the lower electrode 22 becomes an assumed maximum value.

(3) S4

S4 is the minimum distance between the distal end of the electrode portion 21pa of the upper-electrode projection pattern 21p, and the terminal portion 22b of the lower electrode 22. In this example, S4 is set such that the condition $S4 \geq 0$ is satisfied even when the amount of relative displacement of the upper electrode 21 in the −x direction with respect to the lower electrode 22 becomes an assumed maximum value. That is, S4 is set such that the distal end of the electrode portion 21pa of the upper-electrode projection pattern 21p does not overlap the terminal portion 22b of the lower electrode 22 when the amount of relative displacement of the upper electrode 21 in the −x direction with respect to the lower electrode 22 becomes maximum.

(4) S5

S5 is the minimum distance between the terminal portion 21pb of the upper-electrode projection pattern 21p, and the distal end of the electrode portion 22a of the lower electrode 22. In this example, S5 is set such that the condition $S5 \geq 0$ is satisfied even when the amount of relative displacement of the upper electrode 21 in the −x direction with respect to the lower electrode 22 becomes an assumed maximum value. That is, S5 is set such that the terminal portion 21pb of the upper-electrode projection pattern 21p does not overlap the distal end of the electrode portion 22a of the lower electrode 22 when the amount of relative displacement of the upper electrode 21 in the −x direction with respect to the lower electrode 22 becomes maximum.

(5) L3 and L4

L3 and L4 are the minimum length of the electrode portion 21a of the upper electrode 21 and the minimum length of the electrode portion 22a of the lower electrode 22, respectively. In this example, L3 and L4 are set by taking into consideration, for example, their relation with the dimensional parameters (1) to (4) mentioned above ($\Delta L3$, $\Delta L4$, S4 and S5), and the necessary capacitance value and resistance value of the variable capacitance capacitor.

(6) W3 and W4

W3 and W4 are the width of the electrode portion 21a of the upper electrode 21 and the width of the electrode portion 22a of the lower electrode 22, respectively. In this example, W3 and W4 are set by taking into consideration, for example, their relation with the dimensional parameters (1) to (4) mentioned above ($\Delta L3$, $\Delta L4$, S4 and S5), and the necessary capacitance value and resistance value of the variable capacitance capacitor.

It should be noted that the shapes of the upper electrode 21 and lower electrode 22 are not limited to the shapes shown in FIGS. 13(A) and (B). Any shape that satisfies the conditions described above with reference to the design overview can be employed. For example, the upper electrode 21 and the lower electrode 22 may have symmetric shapes with respect to the y direction, and the extending directions of the respective electrodes may be orthogonal to each other. Further, for example, the upper electrode 21 and the lower electrode 22 may not have symmetric shapes, and the width of the electrode portion of one of the electrodes may be narrower than the width of the electrode portion of the other.

[Relationship Between Displacement and Area of Opposing-Electrode Region]

By forming the upper electrode 21 and the lower electrode 22 in the manner as described above, the area of the opposing-electrode region Sa can be made to be constant even when the relative position between the upper electrode 21 and the lower electrode 22 is displaced in one or both of the x direction and the y direction. This is illustrated in FIGS. 15(A) and (B) and FIGS. 16(A) and (B). FIGS. 15(A) and (B) and FIGS. 16(A) and (B) are diagrams showing the relationship between the overlapping region Sa (opposing-electrode region) of the upper-electrode projection pattern 21p and the lower electrode 22, and displacement between the upper electrode 21 and the lower electrode 22.

FIG. 15(A) is a diagram showing a state in which the upper electrode 21 is displaced in the +y direction (the upward direction in the drawing) relative to the lower electrode 22. FIG. 15(B) is a diagram showing a state in which the upper electrode 21 is displaced in the −y direction (the downward direction in the drawing) relative to the lower electrode 22. The alternate long and short dash line in each of FIGS. 15(A) and (B) indicates the position of the upper-electrode projection pattern 21p in a case when the upper electrode 21 is not displaced with respect to the lower electrode 22. In each of FIGS. 15(A) and (B), the direction of displacement of the upper electrode 21 with respect to the lower electrode 22 is indicated by a heavy solid arrow.

Figure 16:
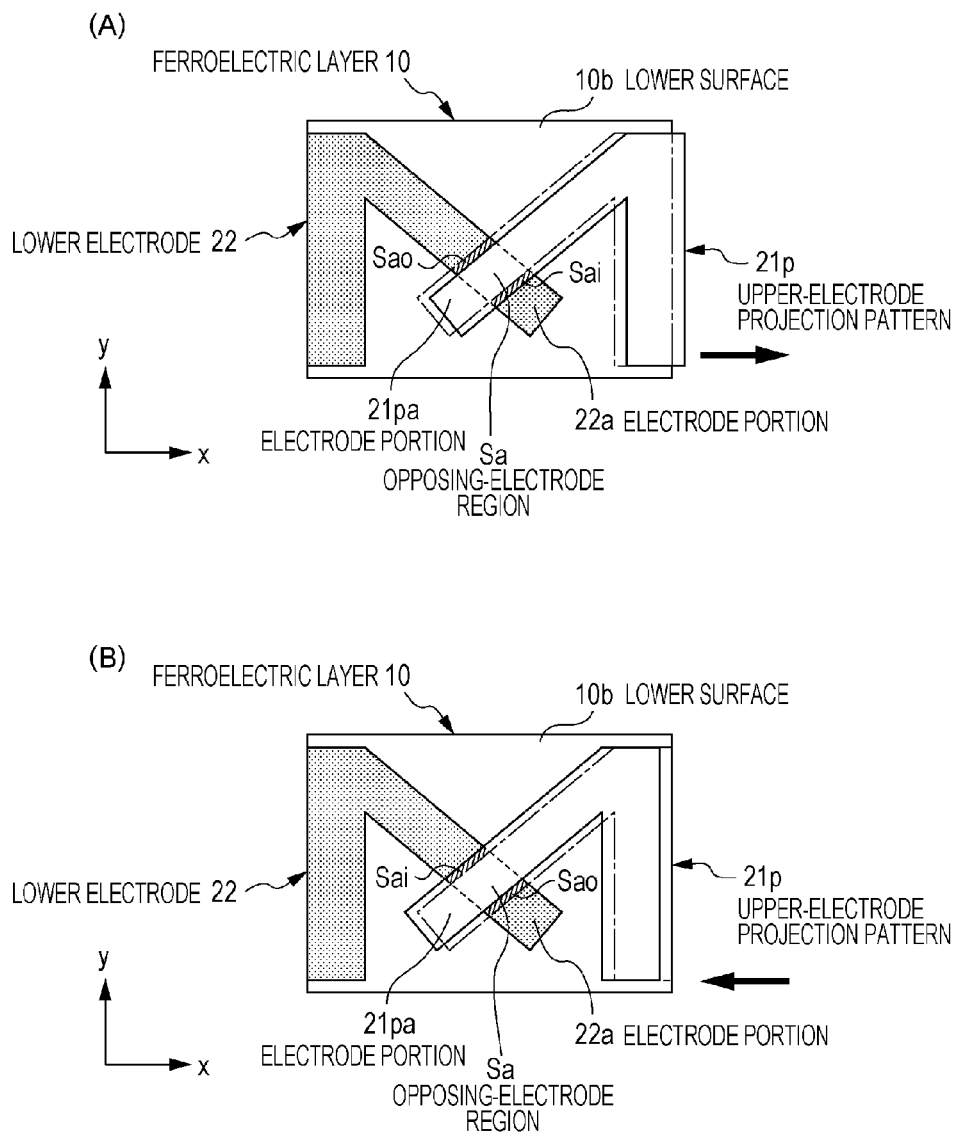
FIG. 16(A) is a diagram showing an overlapping state between the projection pattern of an upper electrode and a lower electrode in a case when the upper electrode is displaced in the +x direction, in accordance with Modification 1.
FIG. 16(B) is a diagram showing an overlapping state between the projection pattern of the upper electrode and the lower electrode in a case when the upper electrode is displaced in the −x direction, in accordance with Modification 1.

FIG. 16(A) is a diagram showing a state in which the upper electrode 21 is displaced in the +x direction (the rightward direction in the drawing) relative to the lower electrode 22. FIG. 16(B) is a diagram showing a state in which the upper electrode 21 is displaced in the −x direction (the leftward direction in the drawing) relative to the lower electrode 22. The alternate long and short dash line in each of FIGS. 16(A) and (B) indicates the position of the upper-electrode projection pattern 21p in a case when the upper electrode 21 is not displaced with respect to the lower electrode 22. In each of FIGS. 16(A) and (B), the direction of displacement of the upper electrode 21 with respect to the lower electrode 22 is indicated by a heavy solid arrow.

As is apparent from FIGS. 15(A) and (B) and FIGS. 16(A) and (B), even when the relative position between the upper electrode 21 and lower electrode 22 of the variable capacitance capacitor according to Modification 1 is displaced in either of the x direction and the y direction, the area of the opposing-electrode region Sa does not change. Stated more specifically, the area of an electrode portion where the upper electrode 21 and the lower electrode 22 newly overlap (for example, the region Sai in FIGS. 15(A) and (B)) due to displacement, and the area of an electrode portion that comes to lie outside the opposing-electrode region Sa due to displacement (for example, the region Sao in FIGS. 15(A) and (B)) are equal to each other. As a result, the area of the opposing-electrode region Sa does not change.

Therefore, since the variable capacitance capacitor according to Modification 1 does not change in capacitance even when the upper electrode 21 undergoes displacement with respect to the lower electrode 22, the same effect as that of the above first embodiment is attained. Further, in Modification 1, the shape of the upper electrode 21 and the shape of the lower electrode 22 are symmetric with respect to the y direction, thereby facilitating designing of the upper electrode 21 and the lower electrode 22.

It should be noted, however, that in the case of forming the upper electrode 21 and the lower electrode 22 by the above-mentioned coating method (silk-screen printing or the like) via a mask, the coating direction is, for example, the x direction or the y direction. In Modification 1, since the electrode portions extend in an oblique direction (are not parallel or orthogonal) with respect to the x direction or the y direction, when forming electrode portions with a narrower width by the coating method, there is also a possibility that the thickness distribution or edge shape of each electrode portion may not become a desired one. Accordingly, when forming electrode portions with a narrower width by the coating method, it is preferable that the extending direction of each electrode portion be parallel or orthogonal to the coating direction.

[Modification 2]

Modification 1 mentioned above relates to the case in which the terminal portions of the upper electrode and lower electrode are formed along the extending direction (y direction) of the short sides of the upper and lower surfaces of the ferroelectric layer, and near the short sides. However, the present invention is not limited to this. In Modification 2, a description will be given of a case in which the terminal portions of the upper electrode and lower electrode are formed along the extending direction (x direction) of the long sides of the upper and lower surfaces of the ferroelectric layer, and near the long sides.

[Electrode Configuration]

FIGS. 17(A) and (B) show the configurations of an upper electrode and lower electrode according to Modification 2, respectively. FIGS. 17(A) and (B) are a top view and a bottom view of a variable capacitance capacitor according to Modification 2, respectively. Modification 2 is of the same configuration as the variable capacitance capacitor 1 according to the above first embodiment (FIG. 6 and FIGS. 7(A) and (B)), except that the configurations (shapes) of an upper electrode 31 and lower electrode 32 are changed. In FIGS. 17(A) and (B), the same components as those according to the above first embodiment (FIGS. 7(A) and (B)) are denoted by the same symbols.

As in Modification 1, the upper electrode 31 has a V-shape, and includes an electrode portion 31a and a terminal portion 31b (first terminal portion). The terminal portion 31b is formed along one long side (the lower long side in the drawing) of the upper surface 10a of the ferroelectric layer 10. The electrode portion 31a is formed so as to extend from one end of the terminal portion 31b in an oblique direction with respect to the extending direction of the terminal portion 31b (the x direction in FIG. 17(A)). In the drawing of FIG. 17(A), the electrode portion 31a extends in a direction from the lower right corner portion of the upper surface 10a of the ferroelectric layer 10 toward the opposing upper left corner portion.

The lower electrode 32 has a V-shape, and is symmetric to the upper electrode 31 with respect to the x direction in the plane of FIG. 17(B). In addition, the lower electrode 32 includes an electrode portion 32a and a terminal portion 32b (second terminal portion). The terminal portion 32b is formed along the other long side (the upper short side in the drawing) of the lower surface 10b of the ferroelectric layer 10. The electrode portion 32a is formed so as to extend from one end of the terminal portion 32b in an oblique direction with respect to the extending direction of the terminal portion 31b (the x direction in FIG. 17(B)). In the plane of FIG. 17(B), the electrode portion 32a extends in a direction from the upper right corner portion of the lower surface 10b of the ferroelectric layer 10 toward the opposing lower left corner portion. In Modification 3, the extending direction of the electrode portion 32a of the lower electrode 32 is orthogonal to the extending direction of the electrode portion 31a of the upper electrode 31.

Note that the variable capacitance capacitor according to Modification 2 can be fabricated in the same manner as, for example, the manufacturing method according to the first embodiment described above. While in Modification 2 the description relates to the case of configuration in which there is a single ferroelectric layer 10, the present invention is not limited to this, and a plurality of ferroelectric layers 10 may be layered via electrodes.

FIG. 18 shows an overlapping state between an upper-electrode projection pattern 31p, which is obtained by projecting the upper electrode 31 of the variable capacitance capacitor of Modification 2 onto the lower surface 10b of the ferroelectric layer 10, and the lower electrode 32. FIG. 18 shows an overlapping state between the upper-electrode projection pattern 31p and the lower electrode 32 in a case when the upper electrode 31 is not displaced with respect to the lower electrode 32.

In Modification 2, the upper electrode 31 and the lower electrode 32 are formed in such a shape that the extending direction of an electrode portion 31pa of the upper-electrode projection pattern 31p and the extending direction of the electrode portion 32a of the lower electrode 32 are orthogonal to each other. As in Modification 1, the shapes and dimensions of the upper electrode 31 and lower electrode 32 are designed by taking into consideration the necessary capacitance value and resistance value, and the assumed maximum amount of displacement between the electrodes.

[Relationship Between Displacement and Area of Opposing-Electrode Region]

By forming the upper electrode 31 and the lower electrode 32 in the manner as described above, the area of the opposing-electrode region Sa can be made to be constant even when the relative position between the upper electrode 31 and the lower electrode 32 is displaced in one or both of the x direction and the y direction. This is illustrated in FIGS. 19(A) and (B) and FIGS. 20(A) and (B). FIGS. 19(A) and (B) and FIGS. 20(A) and (B) are diagrams showing the relationship between the overlapping region Sa (opposing-electrode region) of the upper-electrode projection pattern 31p and the lower electrode 32, and displacement between the upper electrode 31 and the lower electrode 32.

FIG. 19(A) is a diagram showing a state in which the upper electrode 31 is displaced in the +y direction (the upward direction in the drawing) relative to the lower electrode 32. FIG. 19(B) is a diagram showing a state in which the upper electrode 31 is displaced in the −y direction (the downward direction in the drawing) relative to the lower electrode 32. The alternate long and short dash line in each of FIGS. 19(A) and (B) indicates the position of the upper-electrode projection pattern 31p in a case when the upper electrode 31 is not displaced with respect to the lower electrode 32. In each of FIGS. 19(A) and (B), the direction of displacement of the upper electrode 31 with respect to the lower electrode 32 is indicated by a heavy solid arrow.

FIG. 20(A) is a diagram showing a state in which the upper electrode 31 is displaced in the +x direction (the rightward direction in the drawing) relative to the lower electrode 32. FIG. 20(B) is a diagram showing a state in which the upper electrode 31 is displaced in the −x direction (the leftward direction in the drawing) relative to the lower electrode 32. The alternate long and short dash line in each of FIGS. 20(A) and (B) indicates the position of the upper-electrode projection pattern 31p in a case when the upper electrode 31 is not displaced with respect to the lower electrode 32. In each of FIGS. 20(A) and (B), the direction of displacement of the upper electrode 31 with respect to the lower electrode 32 is indicated by a heavy solid arrow.

As is apparent from FIGS. 19(A) and (B) and FIGS. 20(A) and (B), even when the relative position between the upper electrode 31 and lower electrode 32 of the variable capacitance capacitor according to Modification 2 is displaced in either of the x direction and the y direction, the area of the opposing-electrode region Sa does not change. Stated more specifically, the newly overlapping area (for example, the region Sai in FIGS. 19(A) and (B)) due to displacement, and the area of an electrode portion that comes to lie outside the opposing-electrode region Sa due to displacement (for example, the region Sao in FIGS. 19(A) and (B)) are equal to each other. Thus, the area of the opposing-electrode region Sa does not change.

Therefore, since the variable capacitance capacitor according to Modification 2 does not change in capacitance even when the upper electrode 31 undergoes displacement with respect to the lower electrode 32, the same effect as that of the above first embodiment is attained. Further, in Modification 2, the shape of the upper electrode 31 and the shape of the lower electrode 32 are symmetric with respect to the x direction, thereby facilitating designing of the upper electrode 31 and the lower electrode 32.

Further, in Modification 2, the terminal portions of the upper electrode 31 and lower electrode 32 are formed along the extending direction (x direction) of the long sides of the upper and lower surfaces of the ferroelectric layer 10, and near the long sides. Thus, the lengths of the electrode portions of the upper electrode 31 and lower electrode 32 can be reduced in comparison to Modification 1. In this case, the resistance value of the variable capacitance capacitor can be reduced in comparison to Modification 1.

While description has been made in the first embodiment and Modifications 1 and 2 above with an example of a variable capacitance device (variable capacitance capacitor) as the capacitance device, the present invention is not restricted to this. The configurations of the upper electrode and lower electrode described with the first embodiment and Modifications 1 and 2 above can be similarly applied to capacitance devices (hereinafter referred to as constant-capacitance devices) regarding which the capacitance hardly changes at all, regardless of the type of input signal and the signal level thereof.

Note however, in this case, the dielectric layer is formed of a paraelectric material which has low relative permittivity. Examples of paraelectric materials which can be used include paper, polyethylene terephthalate, polypropylene, polyphenylene sulfide, polystyrene, polystyrene, $TiO_2$, $MgTiO_2$, $MgTiO_3$, $SrMgTiO_2$, $Al_2O_3$, $Ta_2O_5$, and so forth. Note that such a constant-capacity capacitor can be fabricated in the same manner as with the variable capacity capacitor according to the above first embodiment.

The above-described problem of capacitance variations among individual variable capacitance devices due to displacement between the upper electrode and lower electrode is not restricted to variable capacitance devices, and occurs similarly with constant-capacitance devices. In the event of applying the configuration of the upper electrode and lower electrode described with the first embodiment and Modifications 1 and 2 above to a constant-capacitance device, the above-described problem can be resolved, and advantages the same as those of the first embodiment can be obtained.

<2. Second Embodiment>

While description has been made in the first embodiment and Modifications 1 and 2 regarding application to the case in which the relative position between the upper electrode and the lower electrode is displaced in the x and y directions, the present invention is not limited to this. For example, depending on the apparatus for positioning the upper electrode and the lower electrode and the manufacturing process, displacement may become pronounced in the x direction or the y direction, i.e., in one direction. In such a case, it suffices to consider the influence of displacement between the upper electrode and the lower electrode only with respect to the x direction or the y direction. In this embodiment, a description will be given of an example of variable capacitance device applicable to a case in which displacement is pronounced in the x direction or the y direction as described above.

[Electrode Configuration]

FIGS. 21(A) and (B) show the configurations of an upper electrode and lower electrode of a variable capacitance capacitor (variable capacitance device) according to this embodiment, respectively. FIGS. 21(A) and (B) are a top view and a bottom view of the variable capacitance capacitor, respectively. This embodiment relates to a case in which displacement is pronounced in the y direction in FIGS. 21(A) and (B). In FIGS. 21(A) and (B), the same components as those according to the first embodiment (FIGS. 7(A) and (B)) are denoted by the same symbols.

The variable capacitance capacitor according to this embodiment is of the same configuration as the variable capacitance capacitor according to the above first embodiment (FIG. 6 and FIGS. 7(A) and (B)), except that the configurations (shapes) of an upper electrode 41 and lower electrode 42 are changed. Therefore, a description of components other than the electrodes is omitted here.

The upper electrode 41 (first electrode) is formed on the upper surface 10a of the ferroelectric layer 10. The upper electrode 41 has a T-shape (first shape), and includes an electrode portion 41a (first electrode portion), and a terminal portion 41b. The terminal portion 41b is formed along one short side (the right short side in the drawing) of the upper surface 10a of the ferroelectric layer 10, and near the short side. The electrode portion 41a is formed so as to extend from the center of the terminal portion 41b in a direction (x direction: first direction) orthogonal to the extending direction (the y direction in FIG. 21(A)) of the terminal portion 41b.

The lower electrode 42 (second electrode) is formed on the lower surface 10b of the ferroelectric layer 10. The lower electrode 42 has a substantially U-shape (second shape), and includes two electrode portions 42a and 42c (second electrode portion), and a terminal portion 42b. The terminal portion 42b is formed along the other short side (the left short side in the drawing) of the lower surface 10b of the ferroelectric layer 10, and near the short side. The electrode portions 42a and 42c are formed so as to extend from opposite ends of the terminal portion 42b in a direction (x direction: second direction) orthogonal to the extending direction (the y direction in FIG. 21(B)) of the terminal portion 42b. The shapes of the electrode portion 42a and electrode portion 42c are assumed to be the same.

That is, in this embodiment, the extending direction of the electrode portion 41a of the upper electrode 41, and the extending direction of the electrode portions 42a and 42c of the lower electrode 42 are parallel to each other. In this case, as will be described later, a plurality of opposing-electrode regions (Sa1 and Sa2 in FIG. 22) are formed between the upper electrode 41 and the lower electrode 42. In this embodiment, the extending direction (x direction) of each electrode portion is orthogonal to the direction (y direction) of displacement between the electrodes.

While description has been made in this embodiment relating to the example of a configuration in which there is a single ferroelectric layer 10, the present invention is not limited to this, and a plurality of ferroelectric layers 10 may be layered via electrodes. In this case, in the same manner as the manufacturing method according to the first embodiment described above, for example, a plurality of ferroelectric layers with an electrode are fabricated, and those ferroelectric layers are layered sequentially to thereby fabricate the variable capacitance capacitor. In this case, an external electrode terminal that connects between a plurality of upper electrodes 41, and another external electrode terminal that connects between a plurality of lower electrodes 42 are provided, and capacitor components formed for individual ferroelectric layers 10 are connected in parallel by these external electrode terminals. In this way, the capacitance (proportional to the number of layers) of the variable capacitance capacitor can be made larger, and its resistance value (inversely proportional to the number of layers) can be made smaller.

[Design Overview of Electrode Shape]

Figure 22:
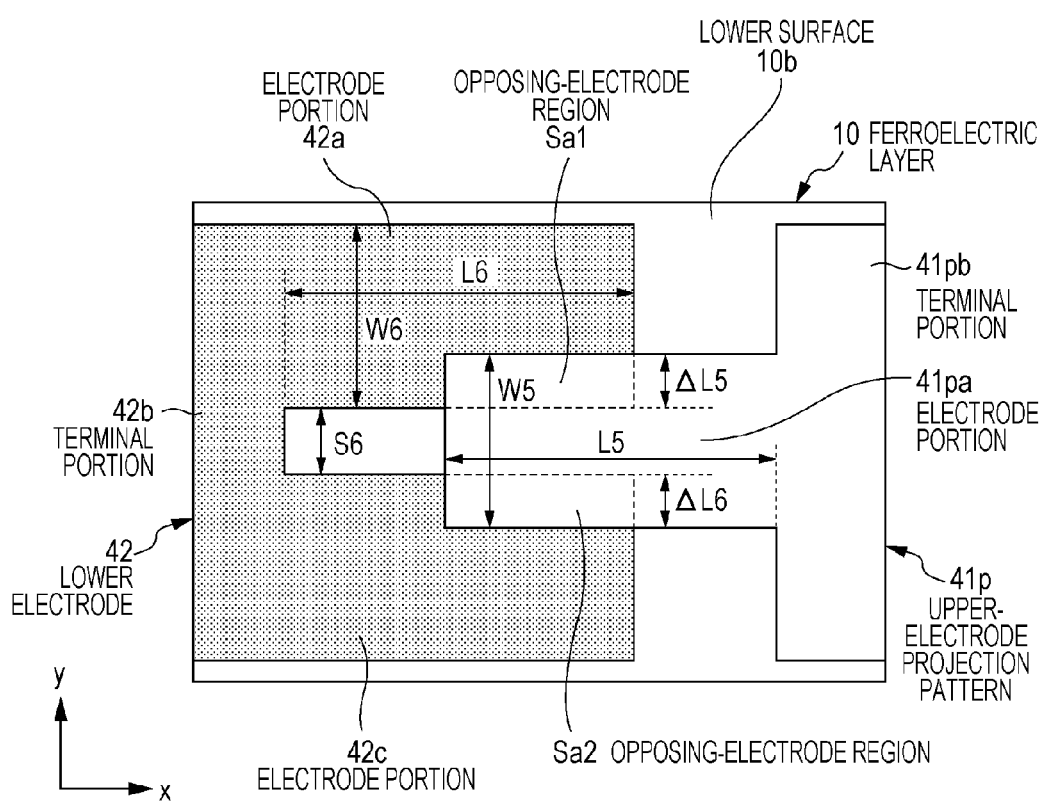
FIG. 22 is a diagram showing an overlapping state between the projection pattern of an upper electrode and a lower electrode in a case when there is no displacement, in accordance with the second embodiment.

Next, a design overview of the upper electrode 41 and the lower electrode 42 in the variable capacitance capacitor according to this embodiment will be described with reference to FIG. 22. FIG. 22 shows an overlapping state between an upper-electrode projection pattern 41p, which is obtained by projecting the upper electrode 41 of the variable capacitance capacitor according to the present embodiment onto the lower surface 10b of the ferroelectric layer 10, and the lower electrode 42. FIG. 22 shows an overlapping state between the upper-electrode projection pattern 41p and the lower electrode 42 in a case when the upper electrode 41 is not displaced with respect to the lower electrode 42. FIG. 22 also shows an example of main dimensional parameters ($\Delta L5$, $\Delta L6$, $S6$, $L5$, $L6$, $W5$, and $W6$) that are to be considered when designing the shapes and dimensions of electrodes in accordance with this embodiment.

In this embodiment, the upper electrode 41 and the lower electrode 42 are formed in such a way that an electrode portion 41pa of the upper-electrode projection pattern 41p overlaps the two electrode portions 42a and 42c of the lower electrode 42. In addition, the shapes and dimensions of the upper electrode 41 and lower electrode 42 are designed by taking into consideration the necessary capacitance value and resistance value, and the assumed maximum amount of displacement between the electrodes. More specifically, the respective electrodes are designed so that the dimensional parameters as shown in FIG. 22 satisfy the following conditions, for example. It should be noted that the dimensional parameters to be considered when designing the electrodes are not limited to those of the example shown in FIGS. 22.

(1) $\Delta L5$ and $\Delta L6$ $\Delta L5$ and $\Delta L6$ are the widths of the opposing-electrode regions Sa1 and Sa2 in the y direction, respectively. In this embodiment, the shapes and dimensions of the upper electrode 41 and lower electrode 42 are designed so that $\Delta L5 \geq 0$ and $\Delta L6 \geq 0$ even when the amount of relative displacement of the upper-electrode projection pattern 41p in the y direction with respect to the lower electrode 42 becomes an assumed maximum value. More specifically, the width W5 of the electrode portion 41a of the upper electrode 41, and the spacing S6 between the electrode portion 42a and electrode portion 42c of the lower electrode 42 are set so that $\Delta L5 \geq 0$ and $\Delta L6 \geq 0$ at all times.

(2) L5 and L6

L5 and L6 are the length of the electrode portion 41a of the upper electrode 41, and the length of the electrode portion 42a or electrode portion 42c of the lower electrode 42, respectively. In this embodiment, the lengths of the respective electrode portions of the upper electrode 41 and lower electrode 42 are set so that the electrode portion 41pa of the upper-electrode projection pattern 41p overlaps the two electrode portions 42a and 42c of the lower electrode 42. In addition, L5 and L6 are set by taking the necessary capacitance value and resistance value of the variable capacitance capacitor into consideration.

(3) W5 and W6

W5 and W6 are the width of the electrode portion 41a of the upper electrode 41, and the width of the electrode portion 42a or electrode portion 42c of the lower electrode 42, respectively. In this embodiment, W5 is set so as to be larger than the spacing S6 between the two electrode portions 42a and 42c of the lower electrode 42. In addition, W5 and W6 are set by taking the necessary capacitance value and resistance value of the variable capacitance capacitor into consideration.

It should be noted that the shapes of the upper electrode 41 and lower electrode 42 are not limited to those according to this embodiment (the shapes shown in FIGS. 21(A) and (B)). Any shape that satisfies the conditions described above with reference to the design overview can be employed.

[Relationship Between Displacement and Area of Opposing-Electrode Region]

Figure 23:
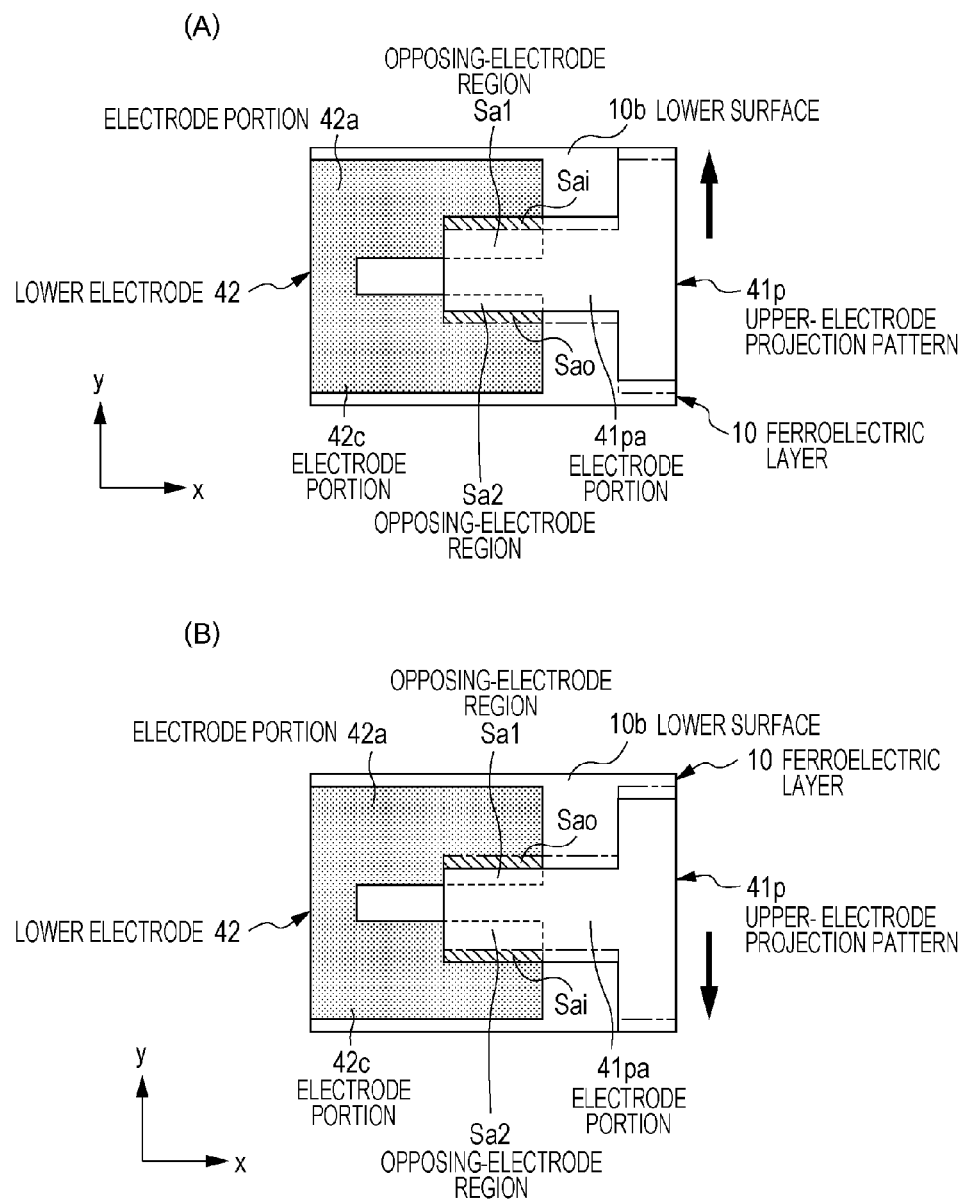
FIG. 23(A) is a diagram showing an overlapping state between the projection pattern of an upper electrode and a lower electrode in a case when the upper electrode is displaced in the +y direction, in accordance with the second embodiment.
FIG. 23(B) is a diagram showing an overlapping state between the projection pattern of the upper electrode and the lower electrode in a case when the upper electrode is displaced in the −y direction, in accordance with the second embodiment.

By forming the upper electrode 41 and the lower electrode 42 in the manner as described above, the total area of the opposing-electrode regions Sa1 and Sa2 can be made to be constant even when the relative position between the upper electrode 41 and the lower electrode 42 is displaced in the y direction. This is illustrated in FIGS. 23(A) and (B). FIGS. 23(A) and (B) are diagrams showing the relationship between the overlapping regions (opposing-electrode regions) Sa1 and Sa2 of the upper-electrode projection pattern 41p, which is obtained by projecting the upper electrode 41 onto the under surface 10b of the ferroelectric layer 10, and the lower electrode 42, and displacement between the upper electrode 41 and the lower electrode 42.

FIG. 23(A) is a diagram showing a state in which the upper electrode 41 is displaced in the +y direction (the upward direction in the drawing) relative to the lower electrode 42. FIG. 23(B) is a diagram showing a state in which the upper electrode 41 is displaced in the −y direction (the downward direction in the drawing) relative to the lower electrode 42. The alternate long and short dash line in each of FIGS. 23(A) and (B) indicates the position of the upper-electrode projection pattern 41p in a case when the upper electrode 41 is not displaced with respect to the lower electrode 42. In each of FIGS. 23(A) and (B), the direction of displacement of the upper electrode 41 with respect to the lower electrode 42 is indicated by a heavy solid arrow.

As is apparent from FIGS. 23(A) and (B), even when the relative position between the upper electrode 41 and lower electrode 42 of the variable capacitance capacitor according to this embodiment is displaced in the y direction, the total area of the opposing-electrode regions Sa1 and Sa2 does not change. Stated more specifically, for example, in the case of FIG. 23(A), the area of the region Sai that newly overlaps the opposing-electrode region Sa1 due to displacement, and the area of the region Sao that comes to lie outside the opposing-electrode region Sa2 due to displacement are equal to each other. Thus, the total area of the opposing-electrode regions Sa1 and Sa2 does not change.

Therefore, in the case of the variable capacitance capacitor according to this embodiment, the total area of the opposing-electrode regions Sa1 and Sa2 does not change even when the relative position between the upper electrode 41 and the lower electrode 42 is displaced in the y direction, so the capacitance does not change either. Therefore, according to this embodiment, the same effect as that of the first embodiment is attained.

Figure 24:
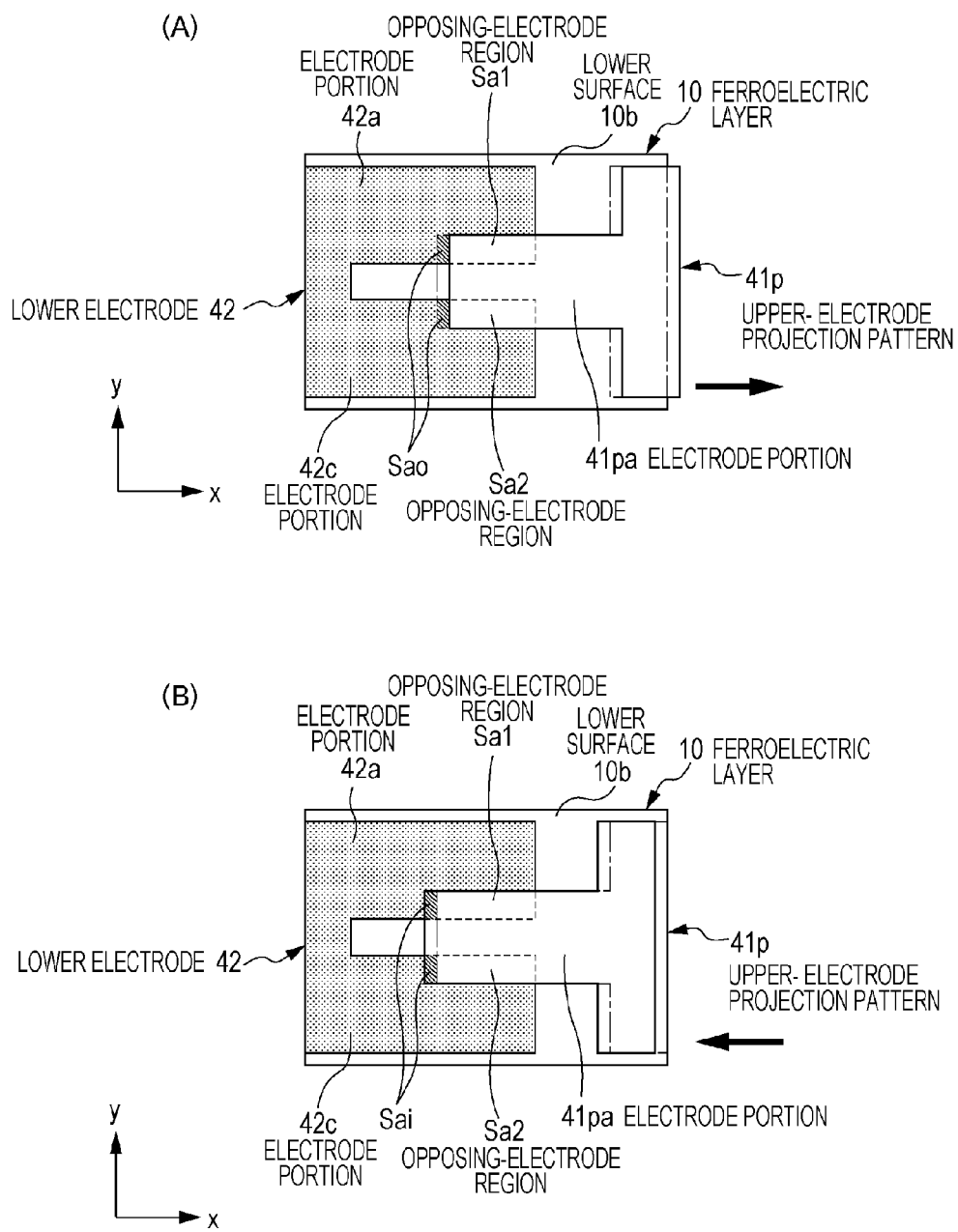
FIG. 24(A) is a diagram showing an overlapping state between the projection pattern of an upper electrode and a lower electrode in a case when the upper electrode is displaced in the +x direction, in accordance with the second embodiment.
FIG. 24(B) is a diagram showing an overlapping state between the projection pattern of the upper electrode and the lower electrode in a case when the upper electrode is displaced in the −x direction, in accordance with the second embodiment.

As described above, the variable capacitance capacitor according to this embodiment is applicable to a case in which displacement is pronounced in the y direction, and its capacitance changes with displacement in the x direction. This is illustrated in FIGS. 24(A) and (B). FIGS. 24(A) and (B) are diagrams showing the relationship between the overlapping regions (opposing-electrode regions) Sa1 and Sa2 of the upper-electrode projection pattern 41p, which is obtained by projecting the upper electrode 41 onto the under surface 10b of the ferroelectric layer 10, and the lower electrode 42, and displacement in the x direction.

FIG. 24(A) is a diagram showing a state in which the upper electrode 41 is displaced in the +x direction (the rightward direction in the drawing) relative to the lower electrode 42. FIG. 24(B) is a diagram showing a state in which the upper electrode 41 is displaced in the −x direction (the leftward direction in the drawing) relative to the lower electrode 42. The alternate long and short dash line in each of FIGS. 24(A) and (B) indicates the position of the upper-electrode projection pattern 41p in a case when the upper electrode 41 is not displaced with respect to the lower electrode 42. In each of FIGS. 24(A) and (B), the direction of displacement of the upper electrode 41 with respect to the lower electrode 42 is indicated by a heavy solid arrow.

As is apparent from FIGS. 24(A) and (B), in this embodiment, when the upper electrode 41 is displaced in the x direction relative to the lower electrode 42, the total area of the opposing-electrode regions Sa1 and Sa2 changes, and so does the capacitance. More specifically, in the case of FIG. 24(A), the region Sao in FIG. 24(A) comes to lie outside the opposing-electrode region due to displacement, so the total area of the opposing-electrode regions Sa1 and Sa2 becomes small in comparison to the case where there is no displacement. On the other hand, in the case of FIG. 24(B), the region Sai in FIG. 24(B) is newly added to the opposing-electrode region due to displacement, so the total area of the opposing-electrode regions Sa1 and Sa2 becomes large in comparison to the case where there is no displacement.

While description has been made in this embodiment regarding an example of the case in which displacement is pronounced in a single direction which is the y direction, the present invention is not limited to this. The present invention is also applicable to a case in which displacement is pronounced in another single direction which is the x direction. In that case, for example, the shapes of the electrodes may be those obtained by rotating the upper electrode 41 and the lower electrode 42 by 90 degrees within the upper surface 10a and the lower surface 10b, respectively.

While description has been made in the second embodiment above with an example of a variable capacitance device (variable capacitance capacitor) as the capacitance device, the present invention is not restricted to this. The configuration of the upper electrode and lower electrode described with the second embodiment can be similarly applied to constant-capacitance devices regarding which the capacitance hardly changes at all, regardless of the type of input signal and the signal level thereof, and the same advantages can be obtained. Note however, in this case, the dielectric layer is formed of a paraelectric material which has low relative permittivity. Materials the same as the paraelectric materials described with the first embodiment above may be used for paraelectric materials.

[Modification 3]

Since each of the above variable capacitance capacitors according to the first and second embodiments and Modifications 1 and 2 is a two-terminal type variable capacitance capacitor as described above, the variable capacitance capacitor does not have a dedicated terminal for applying a control bias signal for controlling its capacitance. Accordingly, when using such a variable capacitance capacitor for a non-contact IC card or the like, on the actual circuit, the variable capacitance capacitor is configured to have a four-terminal configuration.

Figure 25:
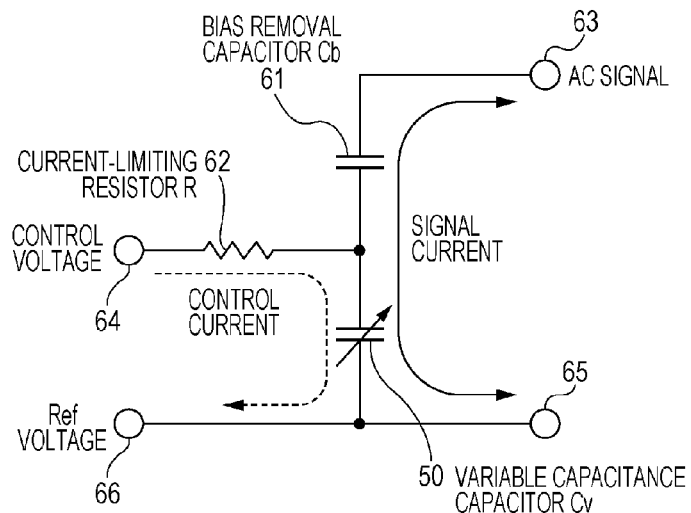
FIG. 25 is a circuit diagram of the vicinity of a two-terminal type variable capacitance capacitor.

FIG. 25 shows an example of circuit configuration in the vicinity of the variable capacitance capacitor on the actual circuit. On the actual circuit, one terminal of a variable capacitance capacitor 50 is connected to one AC-signal input/output terminal 63 via a bias removal capacitor 61, and is connected to a control-voltage input terminal 64 via a current-limiting resistor 62. The other terminal of the variable capacitance capacitor 50 is connected to the other AC-signal input/output terminal 65, and is connected to a control-voltage output terminal 66.

According to the circuit configuration of the variable capacitance capacitor 50 as described above, the signal current (AC signal) flows through the bias removal capacitor 61 and the variable capacitance capacitor 50, and the control current (DC bias current) flows only through the variable capacitance capacitor 50 via the current-limiting resistor 62. At this time, by changing the control voltage, the capacitance Cv of the variable capacitance capacitor 50 changes. As a result, the signal current also changes.

[Configuration of Variable Capacitance Device]

Figure 26:
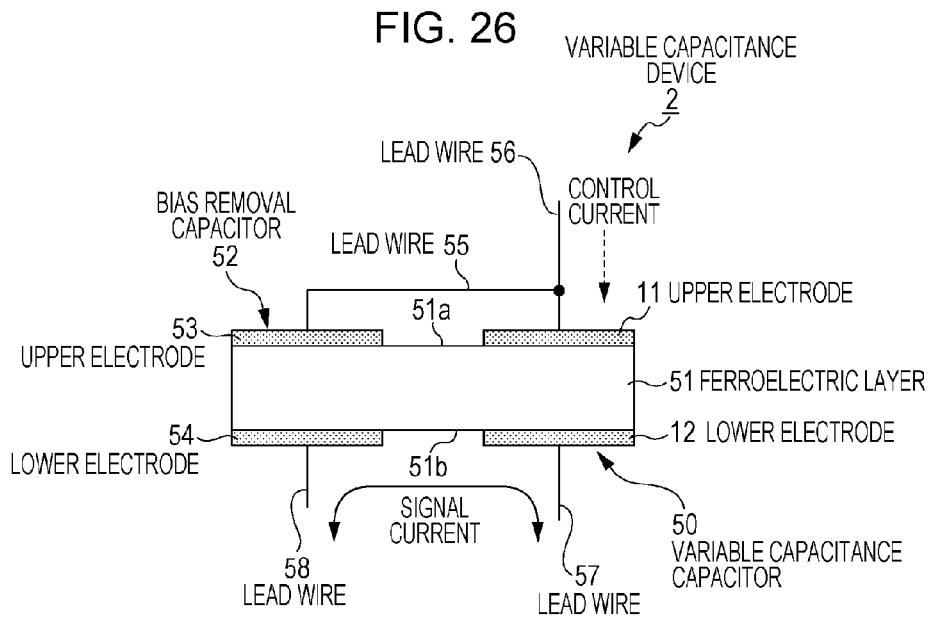
FIG. 26 is a schematic cross-sectional view of a variable capacitance device according to Modification 3.

Now, as Modification 3, a description will be given of an example of variable capacitance device in which the variable capacitance capacitor 50 and the bias removal capacitor 61 are integrated together. FIG. 26 shows an example of configuration of the variable capacitance device in which the variable capacitance capacitor 50 and the bias removal capacitor 61 are integrated together. In FIG. 26, the same components as those according to the first embodiment (FIG. 6) are denoted by the same symbols.

A variable capacitance device 2 includes a ferroelectric layer 51, and the upper electrode 11 and the lower electrode 12 for the variable capacitance capacitor 50 which are formed so as to sandwich the ferroelectric layer 51. Further, the variable capacitance device 2 includes an upper electrode 53 and a lower electrode 54 for the bias removal capacitor 61 which are formed so as to sandwich the ferroelectric layer 51.

The upper electrode 11 for the variable capacitance capacitor 50 and the upper electrode 53 for the bias removal capacitor 61 are formed on an upper surface 51a of the ferroelectric layer 51 at a predetermined spacing from each other. The lower electrode 12 for the variable capacitance capacitor 50 and the lower electrode 54 for the bias removal capacitor 61 are formed on a lower surface 51b of the ferroelectric layer 51 at a predetermined spacing from each other. That is, in this embodiment, the variable capacitance capacitor 50 and the bias removal capacitor 61 share a common dielectric layer.

The upper electrode 11 for the variable capacitance capacitor 50 and the upper electrode 53 for the bias removal capacitor 61 are connected via a lead wire 55 or the like. The upper electrode 11 for the variable capacitance capacitor 50 and the upper electrode 53 for the bias removal capacitor 61 may be connected by forming, on the upper surface 51a of the ferroelectric layer 51, a predetermined electrical wire pattern for connecting the two electrodes.

The upper electrode 11 for the variable capacitance capacitor 50 and the upper electrode 53 for the bias removal capacitor 61 are connected by a lead wire 56 to the control-voltage input terminal 64 via the current-limiting resistor 62 (see FIG. 25 and FIG. 26). The lower electrode 12 for the variable capacitance capacitor 50 is connected by a lead wire 57 to the other AC-signal input/output terminal 65 and the control-voltage output terminal 66. The lower electrode 54 for the bias removal capacitor 61 is connected by a lead wire 58 to the one AC-signal input/output terminal 63. Through these connections, as in the circuit configuration shown in FIG. 25, the signal current (AC signal) flows through the bias removal capacitor 61 and the variable capacitance capacitor 50, and the control current (DC bias current) flows only through the variable capacitance capacitor 50 via the current-limiting resistor 62.

The upper electrode 11 and the lower electrode 12 for the variable capacitance capacitor 50 can be formed in the same shapes as those of the upper electrode and lower electrode used in the variable capacitance capacitors according to the first and second embodiments and Modifications 1 and 2 mentioned above. On the other hand, the upper electrode 53 and the lower electrode 54 for the bias removal capacitor 61 can be formed in the same shapes as those of conventional capacitors.

By integrating the variable capacitance capacitor 50 and the bias removal capacitor 61 together as in this embodiment, the dimensions of an apparatus to which the variable capacitance capacitor according to an embodiment of the present invention is applied can be made smaller. In addition, since the number of parts can be reduced, a reduction in apparatus cost can be achieved.

<3. Third Embodiment>

While the first and second embodiments and Modifications 1 and 2 mentioned above relate to the case in which the present invention is applied to a two-terminal type variable capacitance capacitor, the present invention is not limited to this. The present invention is also applicable to a four-terminal type variable capacitance capacitor having a dedicated terminal for applying a control bias signal for capacitance control as proposed in PTL 2. In this embodiment, a description will be given of a case in which the present invention is applied to a four-terminal type variable capacitance capacitor.

[Configuration of Variable Capacitance Capacitor]

Figure 27:
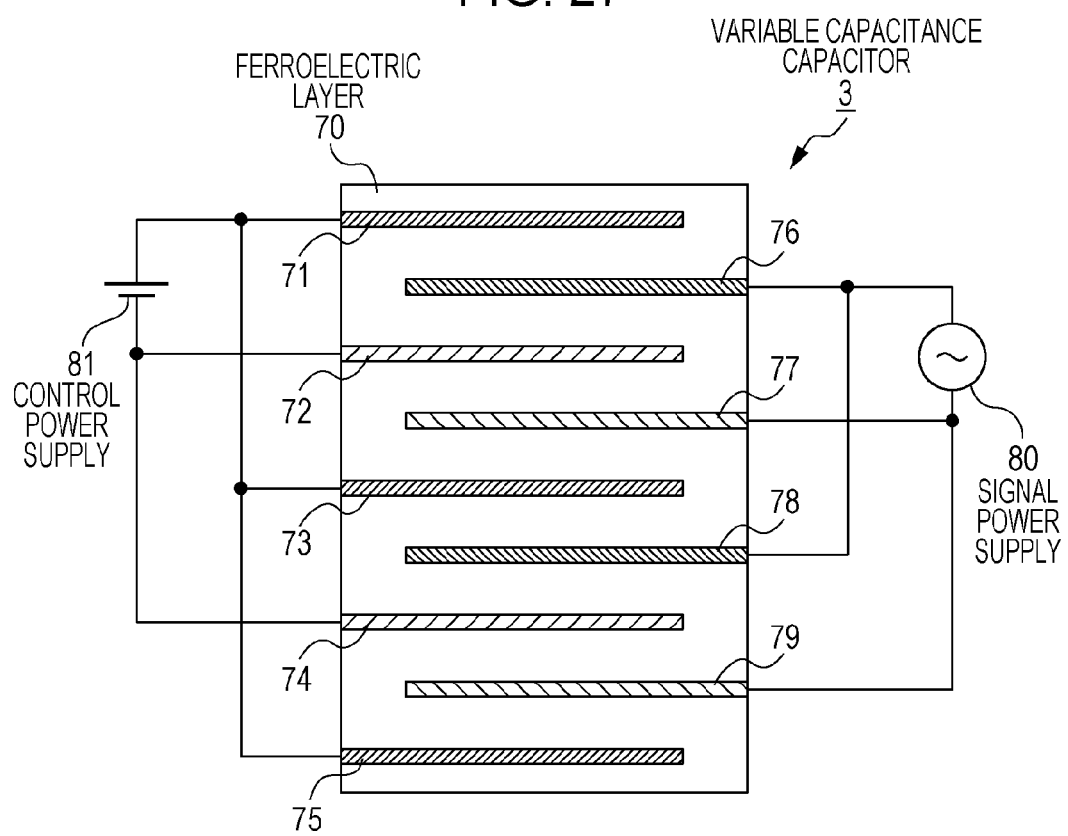
FIG. 27 is a schematic cross-sectional view of a variable capacitance capacitor according to a third embodiment.

FIG. 27 shows an example of four-terminal type variable capacitance capacitor according to this embodiment. A four-terminal variable capacitance capacitor 3 according to this embodiment is of the same configuration as the variable capacitance device proposed in PTL 2 (see FIGS. 61(A) and (B)), except for the electrode shape. Therefore, the outward appearance of the variable capacitance capacitor 3 according to this embodiment is the same as that shown in FIG. 61(A), and only a schematic cross-sectional view of the variable capacitance capacitor 3 is shown in FIG. 27.

The variable capacitance capacitor 3 according to this embodiment includes five control electrodes 71 to 75, four signal electrodes 76 to 79 provided between the control electrodes, and a ferroelectric layer 70 provided between each of adjacent control electrodes and signal electrodes. That is, the variable capacitance capacitor 3 according to this embodiment has a structure in which the five control electrodes 71 to 75 and the four signal electrodes 76 to 79 are alternately layered via the ferroelectric layer 70. In the following description, the control electrodes from the control electrode 71 located at the top in FIG. 27 to the control electrode 75 located at the bottom are respectively referred to as the first control electrode 71 to the fifth control electrode 75. In addition, the signal electrodes from the signal electrode 76 located at the top in FIG. 27 to the signal electrode 79 located at the bottom are respectively referred to as the first signal electrode 76 to the fourth signal electrode 79.

In this embodiment, the first control electrode 71, the third control electrode 73, and the fifth control electrode 75 are connected to a positive terminal of a control power supply 81, and the second control electrode 72 and the fourth control electrode are connected to a negative terminal of the control power supply 81. On the other hand, the first signal electrode 76 and the third signal electrode 78 are connected to one input/output terminal of a signal power supply 80 (AC power supply), and the second signal electrode 77 and the fourth signal electrode 79 are connected to the other input/output terminal of the signal power supply 80.

[Electrode Configuration]

Figure 28:
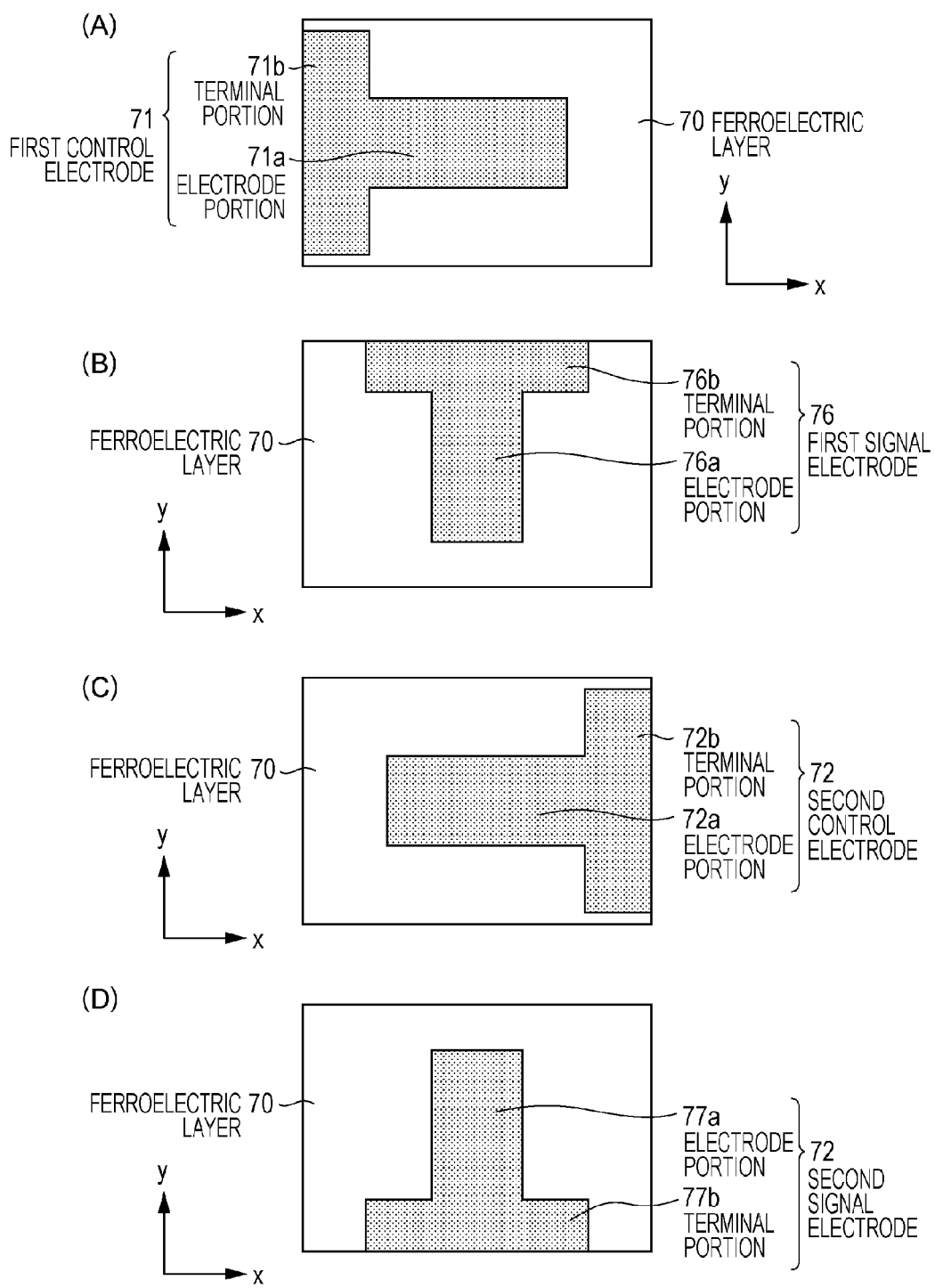
FIG. 28(A) is a configuration diagram of a first control electrode of the variable capacitance capacitor according to the third embodiment.
FIG. 28(B) is a configuration diagram of a first signal electrode.
FIG. 28(C) is a configuration diagram of a second control electrode according to the third embodiment.
FIG. 28(D) is a configuration diagram of a second signal electrode.

FIG. 28(A) to (D) show an example of configuration of each control electrode and each signal electrode according to this embodiment. FIG. 28(A) to (D) show the configurations of the four electrodes from the top in the drawing of the variable capacitance capacitor 3 shown in FIG. 27, in the order of their placement. FIG. 28(A) shows the electrode configuration of the first control electrode 71, and FIG. 28(B) shows the electrode configuration of the first signal electrode 76. FIG. 28(C) shows the electrode configuration of the second control electrode 72, and FIG. 28(D) shows the electrode configuration of the second signal electrode 77.

As shown in FIG. 28(A) to (D), each electrode has a T-shape. In addition, each electrode includes a terminal portion that is connected to the signal power supply 80 or the control power supply 81 via a lead wire or the like, and an electrode portion that extends from the center of the terminal portion in a direction orthogonal to the extending direction of the terminal portion. The individual electrodes are formed in such a way that the extending directions of their electrode portions adjacent to each other via the ferroelectric layer 70 are orthogonal to each other.

Stated more specifically, in the example of FIG. 28(A) to (D), a terminal portion 71b of the first control electrode 71 is formed along one short side (the left short side in the drawing) of the surface of the ferroelectric layer 70. An electrode portion 71a of the first control electrode 71 is formed so as to extend from the center of the terminal portion 71b in a direction (x direction) orthogonal to the extending direction (the y direction in the drawing) of the terminal portion 71b.

In the first signal electrode 76 formed adjacent to the first control electrode 71 across the ferroelectric layer 70, its terminal portion 76b is formed along one long side (the upper long side in the drawing) of the surface of the ferroelectric layer 70. An electrode portion 76a of the first signal electrode 76 is formed so as to extend from the center of the terminal portion 76b in a direction (y direction) orthogonal to the extending direction (the x direction in the drawing) of the terminal portion 76b. Thus, the electrode portion 71a of the first control electrode 71 and the electrode portion 76a of the first signal electrode 76 are orthogonal to each other.

In the second control electrode 72 formed adjacent to the first signal electrode 76 across the ferroelectric layer 70, its terminal portion 72b is formed along the other short side (the right short side in the drawing) of the surface of the ferroelectric layer 70. An electrode portion 72a of the second control electrode 72 is formed so as to extend from the center of the terminal portion 72b in a direction (x direction) orthogonal to the extending direction (the y direction in the drawing) of the terminal portion 72b. Thus, the electrode portion 76a of the first signal electrode 76 and the electrode portion 72a of the second control electrode 72 are orthogonal to each other.

In the second signal electrode 77 formed adjacent to the second control electrode 72 across the ferroelectric layer 70, its terminal portion 77b is formed along the other long side (the lower long side in the drawing) of the surface of the ferroelectric layer 70. An electrode portion 77a of the second signal electrode 77 is formed so as to extend from the center of the terminal portion 77b in a direction (y direction) orthogonal to the extending direction (the x direction in the drawing) of the terminal portion 77b. Thus, the electrode portion 72a of the second control electrode 72 and the electrode portion 77a of the second signal electrode 77 are orthogonal to each other.

In this embodiment, the third control electrode 73, the third signal electrode 78, the fourth control electrode 74, and the fourth signal electrode 79 are formed to have the electrode configurations shown in FIG. 28(A) to (D), respectively. Further, the fifth control electrode 75 is formed to have the electrode configuration shown in FIG. 28(A). By forming the respective electrodes in accordance with these configurations, the extending directions of their electrode portions can be made to be orthogonal to each other between all of the control electrodes and signal electrodes that are adjacent to each other via the ferroelectric layer 70.

As for the shapes of the individual electrodes, the shapes of each control electrode and each signal electrode are designed so that even when displacement occurs in the x direction and/or the y direction between adjacent control electrode and signal electrode, the area of the opposing-electrode region (overlapping region) between the adjacent control electrode and signal electrode does not change. In addition, the dimensions of the individual electrodes are designed by taking into consideration the necessary capacitance value and resistance value, and the assumed maximum amount of displacement between electrodes. For example, the dimensions of the individual electrodes are set in the same manner as that described above with reference to the design overview according to the first embodiment.

By setting the shapes of individual electrodes in the manner as described above, even when displacement occurs in the x direction and/or the y direction between adjacent control electrode and signal electrode, the area of the opposing-electrode region between the adjacent control electrode and signal electrode does not change, nor does the capacitance of the variable capacitance capacitor 3. Therefore, according to this embodiment, the same effect as that of the first embodiment is attained. Further, since the variable capacitance capacitor 3 according to this embodiment is a four-terminal type variable capacitance device, no bias removal capacitor is necessary.

While this embodiment relates to the case in which displacement in both the x and y directions is considered, the present invention is not limited to this. As in the second embodiment, the present invention is also applicable to a case in which displacement is pronounced in one of the x direction and the y direction. In that case, for example, the shapes of adjacent control and signal electrodes may be set as the shapes as shown in FIGS. 21(A) and (B).

This embodiment relates to the four-terminal type variable capacitance capacitor in which the direction of an electric field generated between signal electrodes due to the signal power supply 80, and the direction of an electric field generated between control electrodes due to the control voltage are parallel to each other. However, the present invention is not limited to this. For example, the present invention is also applicable to a four-terminal type variable capacitance capacitor (not shown) in which the direction of an electric field generated between signal electrodes due to the signal power supply, and the direction of an electric field generated between control electrodes due to the control voltage are orthogonal to each other. In this case, the signal electrodes and the control electrodes are not formed alternately as in this embodiment. Therefore, in the case of such a four-terminal type variable capacitance capacitor, the present invention may be applied to the electrode shape between adjacent signal electrodes.

<4. Fourth Embodiment>

As described above with reference to the first embodiment, with the variable capacitance device according to an embodiment of the present invention, a variable capacitance capacitor with a small capacitance in pF order can be fabricated in a stable manner, irrespective of the displacement between electrodes (upper and lower electrodes) opposing each other across a ferroelectric layer. It should be noted, however, that in order to drive the variable capacitance device at low voltage, it is necessary to make the ferroelectric layer thinner to increase the electric field intensity between electrodes. To this end, it is necessary to reduce the opposing electrode area between electrodes opposing each other across the ferroelectric layer. That is, to realize low-voltage drive of the variable capacitance device, it is necessary to use a ferroelectric layer with a small thickness, and fabricate a variable capacitance device with a very small capacitance C.

For example, in the case of driving the variable capacitance device at about 3 V, the thickness of the ferroelectric layer is about 2 μm, and the opposing electrode region is about 100 μm×100 μm. In such a case, the resistance value R of the electrodes of the variable capacitance device as a whole becomes large, which leads to a problem in that the Q value (=1/ωCR: Quality of factor) becomes small. Accordingly, in this embodiment, a description will be given of an example of a configuration of a variable capacitance capacitor wherein, with a two-terminal type variable capacitance device, the electrode resistance (ESR: Equivalent Series Resistance) can be further reduced.

Figure 29:
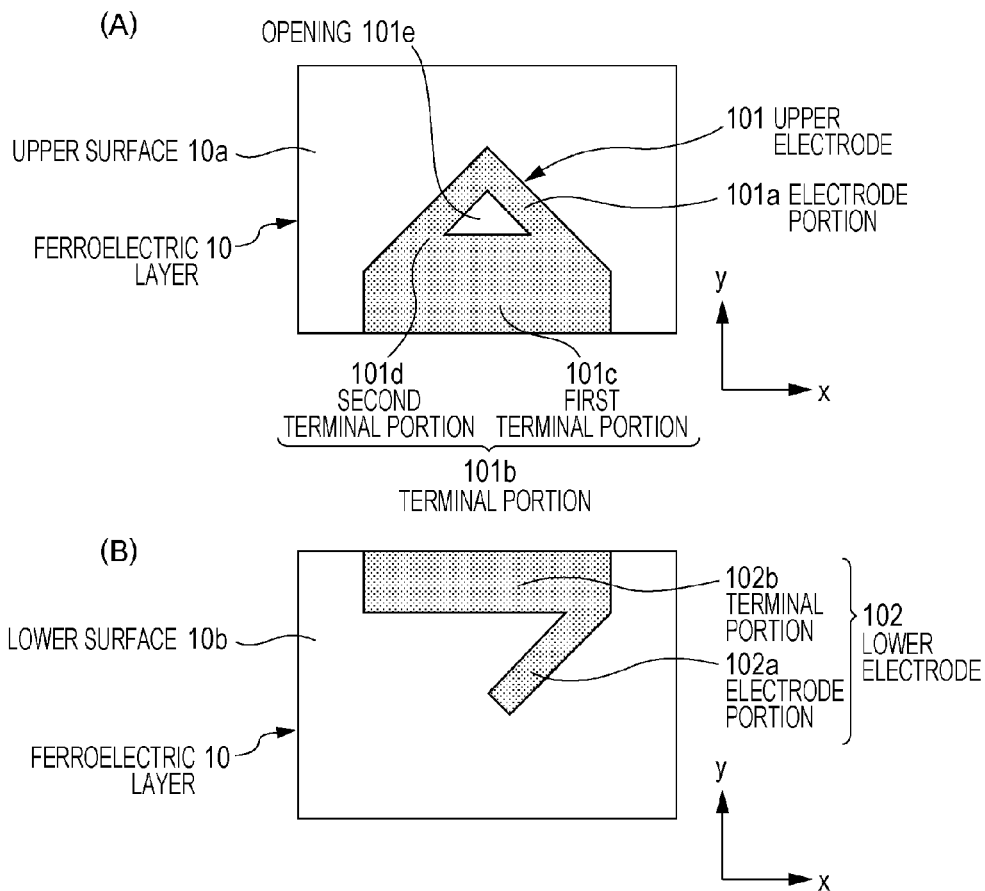
FIG. 29(A) is a configuration diagram of an upper electrode of a variable capacitance capacitor according to a fourth embodiment.
FIG. 29(B) is a configuration diagram of a lower electrode of the variable capacitance capacitor according to the fourth embodiment.

FIGS. 29(A) and (B) show an example of configuration of a variable capacitance capacitor (variable capacitance device) according to this embodiment. FIG. 29(A) is a top view of the variable capacitance capacitor according to this embodiment, illustrating the configuration of an upper electrode. On the other hand, FIG. 29(B) is a bottom view of the variable capacitance capacitor according to this embodiment, illustrating the configuration of a lower electrode. This embodiment is of the same configuration as the variable capacitance capacitor 1 according to the above first embodiment (FIG. 6 and FIGS. 7(A) and (B)), except that the configurations (shapes) of the upper electrode and lower electrode are changed. In FIGS. 29(A) and (B), the same components as those according to the first embodiment mentioned above (FIGS. 7(A) and (B)) are denoted by the same symbols.

An upper electrode 101 (first electrode) has a substantially triangular shape (first shape), and includes an electrode portion 101a and a terminal portion 101b. The electrode portion 101a is formed so as to extend in an oblique direction (non-orthogonal direction) with respect to the direction (the x direction in FIG. 29(A)) along the long sides of the upper surface 10a of the ferroelectric layer 10 (dielectric layer). Specifically, in the plane of FIG. 29(A), the electrode portion 101a extends in a direction from the upper left corner portion of the upper surface 10a of the ferroelectric layer 10 toward the opposing lower right corner portion.

The terminal portion 101b includes a first terminal portion 101c and a second terminal portion 101d. The first terminal portion 101c is formed along one long side (the lower long side in the drawing) of the upper surface 10a of the ferroelectric layer 10, and near the long side. One end of the first terminal portion 101c is connected to one end of the electrode portion 101a.

The second terminal portion 101d is formed so as to extend in an oblique direction (non-orthogonal direction) with respect to the direction (the x direction in FIG. 29(A)) along the long sides of the upper surface 10a of the ferroelectric layer 10, and extend in a direction crossing the extending direction of the electrode portion 101a. In the plane of FIG. 29(A), the second terminal portion 101d extends in a direction from the upper right corner portion of the upper surface 10a of the ferroelectric layer 10 toward the opposing lower left corner portion. One end of the second terminal portion 101d is connected to the other end of the electrode portion 101a (the end not connected to the first terminal portion 101c), and the other end is connected to the other end of the first terminal portion 101c.

By forming the electrode portion 101a, the first terminal portion 101c, and the second terminal portion 101d in the manner as described above, a triangular opening 101e is defined by these portions within the upper electrode 101. The shape of the opening 101e is not limited to this, and the opening 101e can be formed in any shape.

A lower electrode 102 (second electrode) has a V-shape (second shape), and includes an electrode portion 102a and a terminal portion 102b. The lower electrode 102 according to this embodiment is of the same configuration as the lower electrode 32 (FIG. 17(B)) described above with reference to Modification 2. The extending direction of the electrode portion 102a of the lower electrode 102 is substantially orthogonal to the extending direction of the electrode portion 101a of the upper electrode 101.

Figure 30:
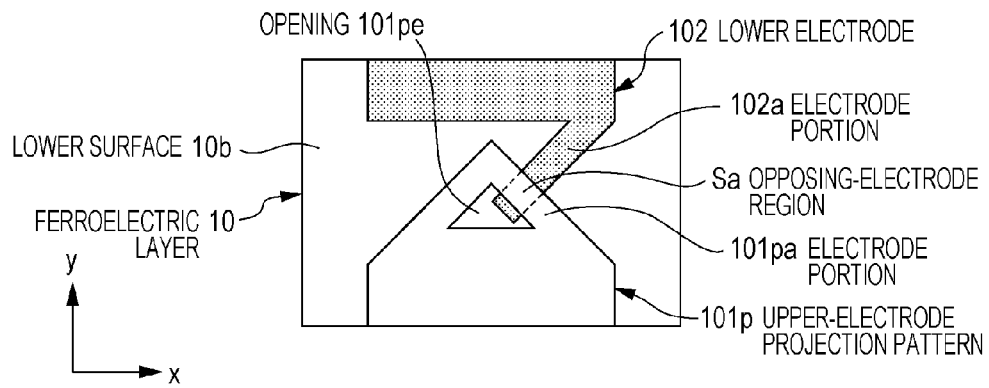
FIG. 30 is a diagram showing an overlapping state between the projection pattern of an upper electrode and a lower electrode in a case when there is no displacement, in accordance with the fourth embodiment.

FIG. 30 shows an overlapping state between an upper-electrode projection pattern 101p, which is obtained by projecting the upper electrode 101 of the variable capacitance capacitor according to the present embodiment onto the lower surface 10b of the ferroelectric layer 10, and the lower electrode 102. FIG. 30 shows an overlapping state between the upper-electrode projection pattern 101p and the lower electrode 32 in a case when the upper electrode 101 is not displaced with respect to the lower electrode 102. In this embodiment, an electrode portion 101pa of the upper-electrode projection pattern 101p, and the electrode portion 102a of the lower electrode 102 are made to cross each other, and the opposing-electrode region Sa (first region) is formed in the crossing region.

In this embodiment, the shapes and dimensions of the upper electrode 101 and lower electrode 102 are designed by taking the assumed maximum amount of displacement between internal electrodes (upper and lower electrodes) into consideration. Specifically, the shapes and dimensions of the upper electrode 101 and lower electrode 102 are designed so that the distal end of the electrode portion 102a of the lower electrode 102 is located inside an opening 101pe in the upper-electrode projection pattern 101p even when displacement occurs between the internal electrodes. Thus, the area of the opposing-electrode region Sa between the upper electrode 101 and the lower electrode 102 is constant irrespective of the displacement between the upper electrode 101 and the lower electrode 102.

In this embodiment, as in the first embodiment, the shapes and dimensions of the upper electrode 101 and lower electrode 102 are designed by taking into consideration not only the amount of displacement between the internal electrodes but the necessary capacitance value and electrode resistance value, and the like. In particular, in the designing of the upper electrode 101, although the width of the electrode portion 101a is narrowed to make the area of the opposing-electrode region Sa small, it is preferable to make the region (area) of the terminal portion 101b as wide as possible to make the electrode resistance lower.

The variable capacitance capacitor according to this embodiment can be fabricated in the same manner as, for example, the manufacturing method according to the first embodiment described above. While this embodiment relates to the case of configuration in which there is a single ferroelectric layer 10, the present invention is not limited to this, and a plurality of ferroelectric layers 10 may be layered via electrodes.

As described above, in this embodiment, both the internal electrodes are formed in such a way that the area of the opposing-electrode region Sa between the upper electrode 101 and the lower electrode 102 is constant even when displacement occurs between the upper electrode 101 and the lower electrode 102. Therefore, according to this embodiment, the same effect as that of the first embodiment is attained.

In addition, in this embodiment, the region (area) of the terminal portion 101b of the upper electrode 101 can be made wide, so the value of the electrode resistance of the variable capacitance capacitor can be made small. As a result, according to this embodiment, drop in Q value can be suppressed.

[Modification 4]

An example of configuration of a variable capacitance capacitor with which the electrode resistance can be made smaller is not limited to that according to the fourth embodiment mentioned above. Now, a description will be given of another example of configuration (Modification 4) of a variable capacitance capacitor with which the electrode resistance can be made smaller.

Figure 31:
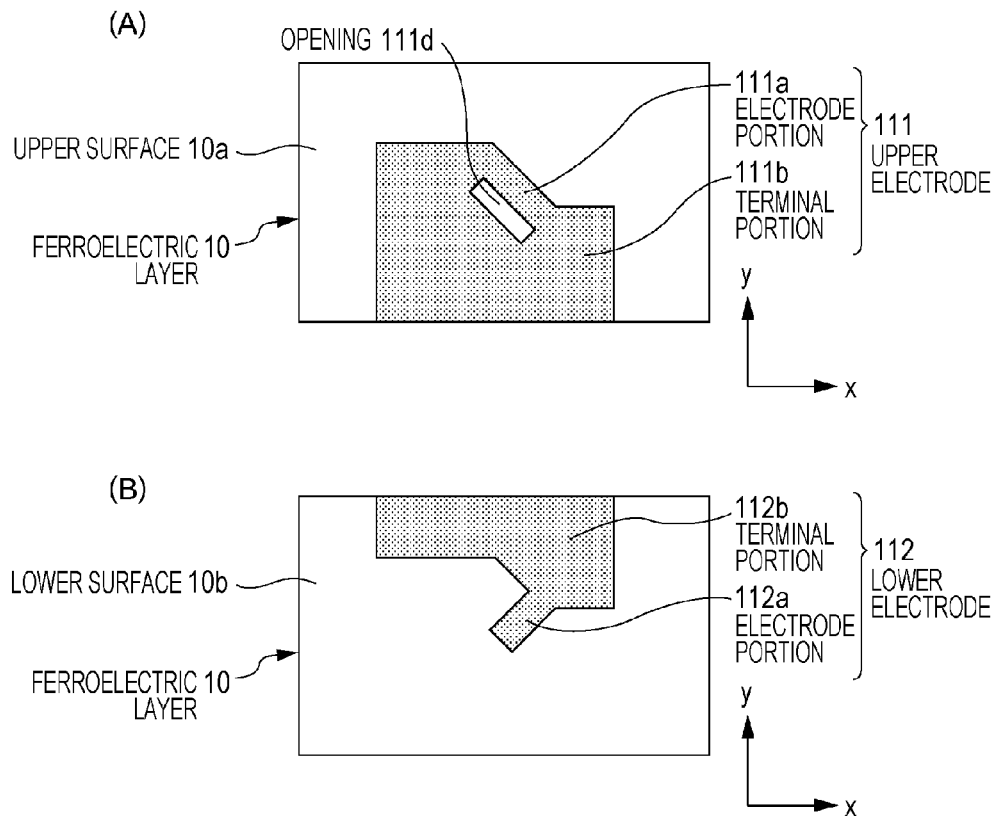
FIG. 31(A) is a configuration diagram of an upper electrode of a variable capacitance capacitor according to Modification 4.
FIG. 31(B) is a configuration diagram of a lower electrode of the variable capacitance capacitor according to Modification 4.

FIGS. 31(A) and (B) show an example of configuration of a variable capacitance capacitor according to Modification 4. FIG. 31(A) is a top view of the variable capacitance capacitor according to Modification 4, illustrating the configuration of an upper electrode. On the other hand, FIG. 31(B) is a bottom view of the variable capacitance capacitor according to Modification 4, illustrating the configuration of a lower electrode. This example is of the same configuration as the variable capacitance capacitor according to the fourth embodiment mentioned above, except that the configurations (shapes) of the upper electrode and lower electrode are changed. In FIGS. 31(A) and (B), the same components as those according to the above fourth embodiment (FIGS. 29(A) and (B)) are denoted by the same symbols.

An upper electrode 111 includes an electrode portion 111a and a terminal portion 111b. The electrode portion 111a is formed so as to extend in an oblique direction (non-orthogonal direction) with respect to the direction (the x direction in FIG. 31(A)) along the long sides of the upper surface 10a of the ferroelectric layer 10. Specifically, in the plane of FIG. 31(A), the electrode portion 111a extends in a direction from the upper left corner portion of the upper surface 10a of the ferroelectric layer 10 toward the opposing lower right corner portion.

The terminal portion 111b has a substantially L-shape, and its base portion is formed along one long side (the lower long side in the drawing) of the upper surface 10a of the ferroelectric layer 10, and near the long side. One end of the electrode portion 111a is connected to one end of the substantially L-shaped terminal portion 111b, and the other end of the electrode portion 111a is connected to the other end thereof. As a result, in the upper electrode 111, a rectangular opening 111d is defined by the electrode portion 111a and the terminal portion 111b.

A lower electrode 112 includes an electrode portion 112a and a terminal portion 112b. The electrode portion 112a is formed so as to extend in an oblique direction (non-orthogonal direction) with respect to the direction (the x direction in FIG. 31(B)) along the long sides of the lower surface 10b of the ferroelectric layer 10. Specifically, in the plane of FIG. 31(B), the electrode portion 112a extends in a direction from the upper right corner portion of the lower surface 10b of the ferroelectric layer 10 toward the opposing lower left corner portion. The extending direction of the electrode portion 112a of the lower electrode 112 is substantially orthogonal to the extending direction of the electrode portion 111a of the upper electrode 111.

The terminal portion 112b has a substantially L-shape, and its base portion is formed along the other long side (the upper long side in the drawing) of the upper surface 10a of the ferroelectric layer 10, and near the long side. One end of the electrode portion 112a is connected to an end located opposite to the base portion of the substantially L-shaped terminal portion 112b. In this example, in comparison to the fourth embodiment mentioned above, the region (area) of the terminal portion 112b of the lower electrode 112 can be made wider, and the length in the extending direction of the electrode portion 112a of the lower electrode 112 can be made shorter. Therefore, in this example, the resistance value of the lower electrode 112 can be made smaller in comparison to the fourth embodiment.

Figure 32:
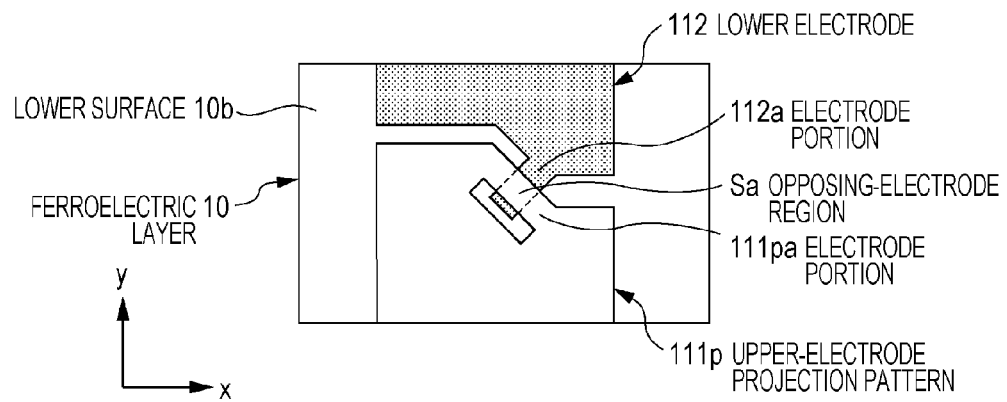
FIG. 32 is a diagram showing an overlapping state between the projection pattern of an upper electrode and a lower electrode in a case when there is no displacement, in accordance with Modification 4.

FIG. 32 shows an overlapping state between an upper-electrode projection pattern 111p, which is obtained by projecting the upper electrode 111 of the variable capacitance capacitor according to this example onto the lower surface 10b of the ferroelectric layer 10, and the lower electrode 112. FIG. 32 shows an overlapping state between the upper-electrode projection pattern 111p and the lower electrode 112 in a case when the upper electrode 111 is not displaced with respect to the lower electrode 112. In this example, an electrode portion 111pa of the upper-electrode projection pattern 111p, and the electrode portion 112a of the lower electrode 112 are made to cross each other, and the opposing-electrode region Sa is formed in the crossing region.

In this example, as in the fourth embodiment mentioned above, the shapes and dimensions of the upper electrode 111 and lower electrode 112 are designed by taking into consideration the necessary capacitance value and resistance value, and the assumed maximum amount of displacement between the electrodes. At this time, the shapes and dimensions of the upper electrode 111 and lower electrode 112 are designed so that the area of the opposing-electrode region Sa is constant even if there is displacement between the upper electrode 111 and lower electrode 112.

The variable capacitance capacitor according to this example can be fabricated in the same manner as, for example, the manufacturing method according to the first embodiment described above. While this embodiment relates to the case of configuration in which there is a single ferroelectric layer 10, the present invention is not limited to this, and a plurality of ferroelectric layers 10 may be layered via electrodes.

As described above, in this example, both the internal electrodes are formed in such a way that the area of the opposing-electrode region Sa between the upper electrode 111 and the lower electrode 112 is constant even when displacement occurs between the upper electrode 111 and the lower electrode 112. Therefore, according to this embodiment, the same effect as that of the first embodiment is attained.

According to this example, the region (area) of not only the upper electrode 111 but also the lower electrode 112 can be made to be wide, and make the length of the electrode portion 112a of the lower electrode 112 shorter. Therefore, according to this example, the value of the electrode resistance of the variable capacitance capacitor can be further reduced, and a drop in Q value can be further suppressed.

While the fourth embodiment and Modification 4 mentioned above relate to the case in which an opening is provided in the upper electrode forming the variable capacitance capacitor, the present invention is not limited to this. An opening may be formed in the lower electrode as well. In a case when displacement between the upper electrode and the lower electrode occurs mainly in a single direction as described above with reference to the second embodiment, the upper electrode and the lower electrode may be each formed by an electrode having an opening.

While description has been made in the fourth embodiment and Modification 4 above with an example of a variable capacitance device (variable capacitance capacitor) as the capacitance device, the present invention is not restricted to this. The configurations of the upper electrode and lower electrode described with the fourth embodiment and Modification 4 can be similarly applied to constant-capacitance devices regarding which the capacitance hardly changes at all, regardless of the type of input signal and the signal level thereof. Note however, in this case, the dielectric layer is formed of a paraelectric material which has low relative permittivity. Materials the same as the paraelectric materials described with the first embodiment above may be used for paraelectric materials.

The problem described in the fourth embodiment above, i.e., the problem in that in the event that the upper electrode and lower electrode are formed smaller, the resistance value R of the overall capacitance device increases and the Q value decreases, occurs similarly with constant-capacitance devices. In the event of applying the configuration of the upper electrode and lower electrode described with the fourth embodiment above to a constant-capacitance device, the above-described problem can be resolved, and advantages the same as those of the fourth embodiment can be obtained.

5. Fifth Embodiment>

Figure 33:
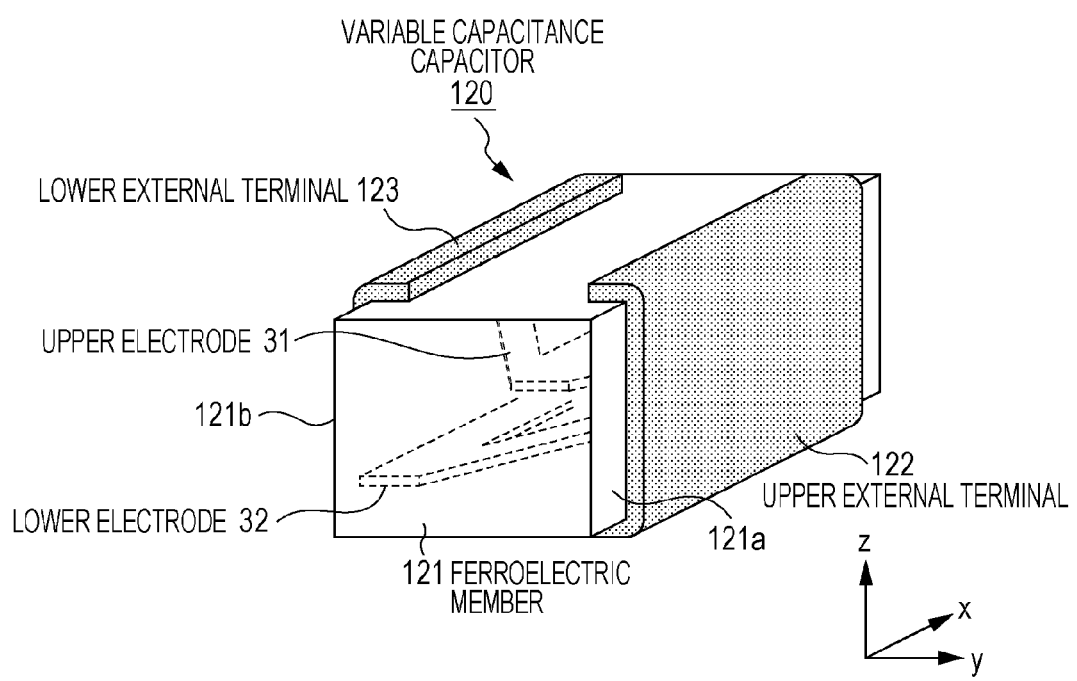
FIG. 33 is a schematic perspective view of a variable capacitance capacitor.

The variable capacitance capacitors described above with reference to the first to fourth embodiments and Modifications 1 and 2 each include external terminals for electrically connecting between internal electrodes and external circuit elements. FIG. 33 and FIGS. 34(A) and (B) show a more specific example of configuration of the variable capacitance capacitor having the electrode configuration described above with reference to Modification 2. FIG. 33 is a perspective exterior view of a variable capacitance capacitor 120. FIG. 34(A) is a top view of the variable capacitance capacitor 120, and FIG. 34(B) is a cross-sectional view taken along the line A-A in FIG. 34(A). In FIG. 33 and FIGS. 34(A) and (B), the same components as those according to Modification 2 (FIGS. 17(A) and (B)) are denoted by the same symbols.

The variable capacitance capacitor 120 having the electrode configuration according to Modification 2 includes, for example, a rectangular parallelepiped ferroelectric member 121, and an upper external terminal 122 and a lower external terminal 123 respectively provided on a pair of side surfaces 121a and 121b extending along the long sides of the ferroelectric member 121.

As shown in FIG. 34(B), the ferroelectric member 121 includes the ferroelectric layer 10, the upper electrode 31 and the lower electrode 32 respectively formed on the upper surface 10a and lower surface 10b of the ferroelectric layer 10, and a ferroelectric layer 124 that is further formed on each of the upper electrode 31 and the lower electrode 32. The ferroelectric layer 124 is formed of the same material as the ferroelectric layer 10.

The upper external terminal 122 is a metal member that is substantially C-shaped in side view, and is provided so as to cover substantially the entirety of the side surface 121a on one long side of the ferroelectric member 121 and a part of the upper and lower surfaces. The upper external terminal 122 is connected to the terminal portion 31b of the upper electrode 31. The lower external terminal 123 is a metal member that is substantially C-shaped in side view, and is provided so as to cover substantially the entirety of the side surface 121b on the other long side of the ferroelectric member 121 and a part of the upper and lower surfaces. The lower external terminal 123 is connected to the terminal portion 32b of the lower electrode 32. In a case where the variable capacitance capacitor 120 is a capacitor in pF order, for example, the distance between the upper external terminal 122 and the lower external terminal 123 is about 0.5 mm.

In the variable capacitance capacitor 120 having the configuration described above, a stray capacitance C0 occurs between the upper external terminal 122 and the lower external terminal 123. FIG. 35 shows a substantially equivalent circuit of the variable capacitance capacitor 120. In the case of the variable capacitance capacitor 120 having the configuration described above, its equivalent circuit is a circuit in which a variable capacitance capacitor 125 between the upper electrode 31 and the lower electrode 32, and a capacitor 126 with constant capacitance between the upper external terminal 122 and the lower external terminal 123 are connected in parallel.

In the case of a variable capacitance capacitor with a small capacitance in pF order, as described above, the distance between the upper external terminal 122 and the lower external terminal 123 is short, and the opposing area between the external terminals is large. Therefore, the stray capacitance C0 between the external terminals becomes non-negligibly large relative to the capacitance C1 of the variable capacitance capacitor formed between the upper electrode 31 and the lower electrode 32. For example, provided that the relative permittivity of the ferroelectric member 121 is about 3500, and the distance between the upper external terminal 122 and the lower external terminal 123 is about 0.5 mm, the stray capacitance C0 between these external terminals becomes about 30 pF. In contrast, for example, provided that the relative permittivity of the ferroelectric layer 10 is about 3500, and the distance between the upper electrode 31 and the lower electrode 32 is about 2 µ, the capacitance C1 between the upper electrode 31 and the lower electrode 32 becomes about several tens to 100 pF.

That is, in the case of fabricating a variable capacitance capacitor with a small capacitance in pF order by using the electrode configuration according to an embodiment of the present invention, the capacitance C1 between the upper electrode 31 and the lower electrode 32 (internal electrodes), and the stray capacitance C0 between the external terminals are values of the same order. In this case, a problem arises in which the capacitance value of the variable capacitance capacitor 120 deviates from a design value due to the influence of the stray capacitance C0. In addition, since the capacitor 126 between the external terminals functions as a fixed capacitor with constant capacitance, a problem arises in that the variable range of the capacitance of the variable capacitance capacitor 120 becomes narrow. Accordingly, in this embodiment, a description will be given of an example of configuration of a two-terminal type variable capacitance capacitor with which the influence of the stray capacitance C0 between external terminals described above can be reduced.

[Configuration of Variable Capacitance Capacitor]

FIGS. 36(A) and (B) show an example of schematic configuration of a variable capacitance capacitor according to this embodiment. FIG. 36(A) is a perspective exterior view of a variable capacitance capacitor 135, and FIG. 36(B) is a top view of the variable capacitance capacitor 135. In FIGS. 36(A) and (B), the same components as those according to the first embodiment (FIGS. 7(A) and (B)) are denoted by the same symbols. In each of FIGS. 36(A) and (B), an upper electrode 131 and a lower electrode 132 formed within a ferroelectric member 136 are indicated by broken lines.

The variable capacitance capacitor 135 (variable capacitance device) includes, for example, the rectangular parallelepiped ferroelectric member 136, and an upper external terminal 137 and a lower external terminal 138 respectively provided on a pair of side surfaces 136a and 136b on the long sides of the ferroelectric member 136.

The ferroelectric member 136 includes the ferroelectric layer 10 (dielectric layer), the upper electrode 131 and the lower electrode 132 respectively formed on the upper surface 10a and lower surface 10b of the ferroelectric layer 10, and a ferroelectric layer 139 that is further formed on each of the upper electrode 131 and the lower electrode 132. The ferroelectric layer 139 is formed of the same material as the ferroelectric layer 10. The ferroelectric member 136 is obtained by integrating these layers by, for example, sintering in a layered state.

The upper external terminal 137 (first external terminal) is a metal member that is substantially C-shaped in side view, and is provided so as to cover a part of the side surface 136a (first side surface) on one long side of the ferroelectric member 136 and a part of the upper and lower surfaces. The width of the upper external terminal 137 is set to about half of the long-side length of the ferroelectric member 136. In the side surface 136a of the ferroelectric member 136 on which the upper external terminal 137 is placed, the upper external terminal 137 is placed near the short side on which a terminal portion 131b of the upper electrode 131 is formed. The upper external terminal 137 is connected to the terminal portion 131b of the upper electrode 131.

On the other hand, like the upper external terminal 137, the lower external terminal 138 (second external terminal) is a metal member that is substantially C-shaped in side view, and is provided so as to cover substantially a part of the side surface 136b (second side surface) on the other long side of the ferroelectric member 136 and a part of the upper and lower surfaces. The width of the lower external terminal 138 is set to about half of the long-side length of the ferroelectric member 136. In the side surface 136b of the ferroelectric member 136 on which the lower external terminal 138 is placed, the lower external terminal 138 is placed near the short side on which a terminal portion 132b of the lower electrode 132 is formed (the side opposite to the short side on which the upper external terminal 137 is formed). The lower external terminal 138 is connected to the terminal portion 132b of the lower electrode 132.

While this embodiment relates to the case in which each of the external terminals is a metal member that is substantially C-shaped in side view, the present invention is not limited to this. An external terminal of any shape can be used as long as the external terminal has a shape and dimensions allowing its connection to an internal electrode.

As described above, in this embodiment, the upper external terminal 137 and the lower external terminal 138 are placed on the diagonal across the ferroelectric member 136. That is, the upper external terminal 137 and the lower external terminal 138 are placed in such a way that the placing direction of the upper external terminal 137 and the lower external terminal 138 crosses the opposing direction between the side surfaces 136a and 136b on the long sides of the ferroelectric member 136 (the y direction in FIGS. 36(A) and (B)). By placing the both external terminals in this way, in combination with shortening of the terminal width, the opposing area between the upper external terminal 137 and the lower external terminal 138 can be made smaller than that in the case described above with reference to FIG. 33. As a result, the stray capacitance between the external terminals in the variable capacitance capacitor 135 can be made smaller. It should be noted that the term "placing direction" of the external terminals as used in this specification means the direction from the center of one external terminal toward the center of the other external terminal.

While the example shown in FIGS. 36(A) and (B) relates to the case in which the upper external terminal 137 and the lower external terminal 138 do not oppose each other in a direction (y direction) along the short sides of the ferroelectric member 136, the present invention is not limited to this. If the stray capacitance between the upper external terminal 137 and the lower external terminal 138 is negligibly small relative to the capacitance of the variable capacitance capacitor formed between the upper electrode 131 and the lower electrode 132, a region may be present between the upper external terminal 137 and the lower external terminal 138 where the external terminals oppose each other.

For example, the stray capacitance between the upper external terminal 137 and the lower external terminal 138 is preferably set to about ¹⁄₁₀ or less of the capacitance of the variable capacitance capacitor formed between the upper electrode 131 and the lower electrode 132.

[Electrode Configuration]

Figure 37:
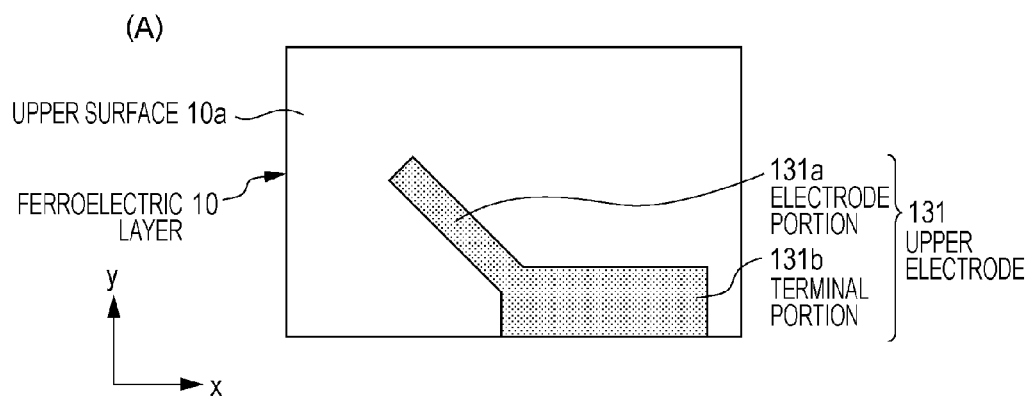
FIG. 37(A) is a configuration diagram of an upper electrode of the variable capacitance capacitor according to the fifth embodiment.
FIG. 37(B) is a configuration diagram of a lower electrode of the variable capacitance capacitor according to the fifth embodiment.

Next, a description will be given of an example of electrode configuration of the variable capacitance capacitor 135 according to this embodiment. FIGS. 37(A) and (B) show an example of electrode configuration of the variable capacitance capacitor 135 according to this embodiment. FIG. 37(A) is a top view of the ferroelectric layer 10 according to this embodiment, illustrating the configuration of the upper electrode 131. On the other hand, FIG. 37(B) is a bottom view of the ferroelectric layer 10 according to this embodiment, illustrating the configuration of the lower electrode 132.

This embodiment is of the same configuration as the variable capacitance capacitor according to the first embodiment mentioned above, except that the configurations (shapes) of the upper electrode 131 and lower electrode 132 are changed. That is, in this embodiment, as in the first embodiment, a description will be given of an example of electrode configuration that takes displacement in both the x direction and the y direction in the drawing into consideration. In FIGS. 37(A) and (B), the same components as those according to the first embodiment mentioned above (FIGS. 7(A) and (B)) are denoted by the same symbols.

The upper electrode 131 (first electrode) includes an electrode portion 131a and the terminal portion 131b. The electrode portion 131a is formed so as to extend in an oblique direction (non-orthogonal direction) with respect to the direction (the x direction in FIG. 37(A)) along the long sides of the upper surface 10a of the ferroelectric layer 10. Specifically, in the plane of FIG. 37(A), the electrode portion 131a extends in a direction from the lower right corner portion of the upper surface 10a of the ferroelectric layer 10 toward the opposing upper left corner portion.

The terminal portion 131b is formed so as to extend from the vicinity of one short side of the upper surface 10a of the ferroelectric layer 10 in a direction along the long sides, and has a rectangular shape. In this embodiment, the extending length of the terminal portion 131b is set to about half of the long-side length of the ferroelectric layer 10. In addition, the terminal portion 131b is placed near one long side (near the lower long side in the drawing) of the upper surface 10a of the ferroelectric layer 10. That is, the terminal portion 131b is placed in the vicinity of one corner portion (in the vicinity of the lower right corner portion in the drawing) of the upper surface 10a of the ferroelectric layer 10. One end of the electrode portion 131a is connected to the corner portion of the terminal portion 131b located on the center side of the upper surface 10a of the ferroelectric layer 10.

Like the lower electrode 32 (FIG. 17(B)) according to Modification 2, the lower electrode 132 (second electrode) has a V-shape, and includes an electrode portion 132a and a terminal portion 132b. In this embodiment, the extending length of the terminal portion 132b is set to about half of the long-side length of the ferroelectric layer 10. Otherwise, the lower electrode 132 is of the same configuration as the lower electrode 32 (FIG. 17(B)) according to Modification 2. The extending direction of the electrode portion 132a of the lower electrode 132 is substantially orthogonal to the extending direction of the electrode portion 131a of the lower electrode 131.

Figure 38:
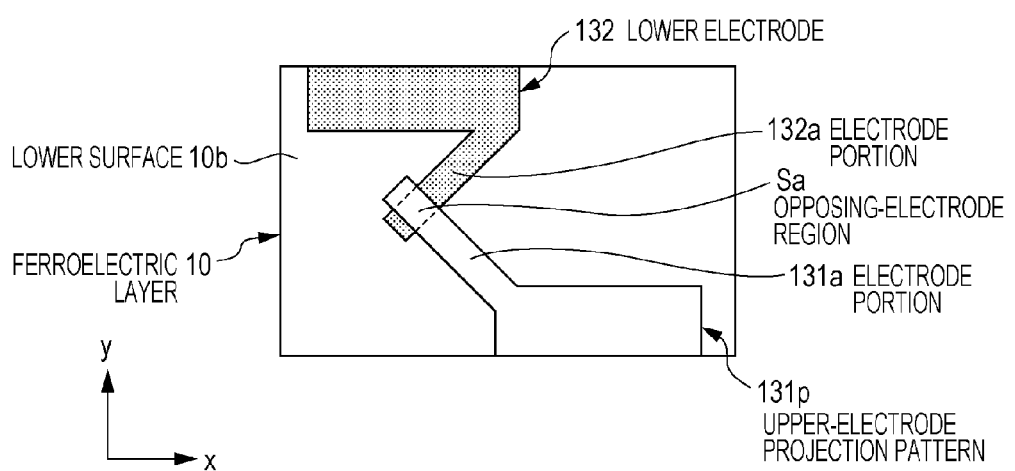
FIG. 38 is a diagram showing an overlapping state between the projection pattern of an upper electrode and a lower electrode in a case when there is no displacement, in accordance with the fifth embodiment.

FIG. 38 shows an overlapping state between an upper-electrode projection pattern 131p, which is obtained by projecting the upper electrode 131 onto the lower surface 10b of the ferroelectric layer 10, and the lower electrode 132, in the variable capacitance capacitor 135 according to this embodiment. FIG. 38 shows an overlapping state between the upper-electrode projection pattern 131p and the lower electrode 132 in a case when the upper electrode 131 is not displaced with respect to the lower electrode 132. In this embodiment, an electrode portion 131a of the upper-electrode projection pattern 131p, and the electrode portion 132a of the lower electrode 132 are made to cross each other, and the opposing-electrode region Sa (first region) is formed in the crossing region.

In this embodiment, the shapes and dimensions of the upper electrode 131 and lower electrode 132 are designed so that the area of the opposing-electrode region Sa between the upper electrode 131 and the lower electrode 132 is constant even when displacement occurs between the upper electrode 131 and the lower electrode 132. In addition, as in the first embodiment mentioned above, the shapes and dimensions of the upper electrode 131 and lower electrode 132 are designed by taking the necessary capacitance value and resistance value, and the like into consideration.

The variable capacitance capacitor 135 according to this embodiment can be fabricated in the same manner as, for example, the manufacturing method according to the first embodiment described above. While this embodiment relates to the case of configuration in which there is a single ferroelectric layer 10, the present invention is not limited to this, and a plurality of ferroelectric layers 10 may be layered via electrodes.

As described above, in this embodiment, both the internal electrodes are formed in such a way that the area of the opposing-electrode region Sa between the upper electrode 131 and the lower electrode 132 is constant even when displacement occurs between the upper electrode 131 and the lower electrode 132. Therefore, according to this embodiment, the same effect as that of the first embodiment is attained.

In addition, according to this embodiment, the opposing area between the upper external terminal 137 and the lower external terminal 138 can be made smaller. Therefore, the stray capacitance between the two external terminals can be made small, thereby enabling elimination of the above-described problem that occurs due to the influence of stray capacitance. Specifically, with the variable capacitance capacitor 135 according to this embodiment, a capacitance value substantially equal to a designed value can be achieved, and the influence of stray capacitance on the variable range of the capacitance of the capacitor can be reduced.

While the above embodiment relates to the case of electrode configuration in which displacement in both the x and y directions in FIGS. 37(A) and (B) is considered, the present invention is not limited to this. The placement of the external terminals according to the above embodiment is also applicable to the case in which displacement is pronounced in one of the x direction and the y direction as described above with reference to the second embodiment.

[Modification 5]

An example of configuration of a variable capacitance capacitor with which the stray capacitance between external terminals can be made smaller is not limited to the example according to the fifth embodiment mentioned above. Now, a description will be given of another example of configuration (Modification 5) of a variable capacitance capacitor with which the stray capacitance between external terminals can be reduced.

[Configuration of Variable Capacitance Capacitor]

FIGS. 39(A) and (B) show an example of schematic configuration of a variable capacitance capacitor according to Modification 5. FIG. 39(A) is a perspective exterior view of a variable capacitance capacitor 145, and FIG. 39(B) is a top view of the variable capacitance capacitor 145. In FIGS. 39(A) and (B), the same components as those according to the fifth embodiment (FIGS. 36(A) and (B)) are denoted by the same symbols. In each of FIGS. 39(A) and (B), an upper electrode 141 and a lower electrode 142 formed within a ferroelectric member 146 are indicated by broken lines.

The variable capacitance capacitor 145 includes, for example, the rectangular parallelepiped ferroelectric member 146, and an upper external terminal 147 and a lower external terminal 148 respectively provided on a pair of side surfaces 146a and 146b on the short sides of the ferroelectric member 146.

The ferroelectric member 146 includes the ferroelectric layer 10, the upper electrode 141 and the lower electrode 142 respectively formed on the upper surface 10a and lower surface 10b of the ferroelectric layer 10, and the ferroelectric layer 139 that is further formed on each of the upper electrode 141 and the lower electrode 142. The ferroelectric member 146 according to this example is of the same configuration as the ferroelectric member 136 (FIG. 36(A)) according to the fifth embodiment described above, except that the shapes of the upper electrode 141 and lower electrode 142 are changed.

The upper external terminal 147 is a metal member that is substantially C-shaped in side view, and is provided so as to cover a part of the side surface 146a on one short side of the ferroelectric member 146 and a part of the upper and lower surfaces. The width of the upper external terminal 147 is set to about half of the short-side length of the ferroelectric member 146. In the side surface 146a of the ferroelectric member 146 on which the upper external terminal 147 is placed, the upper external terminal 147 is placed near the long side on which a terminal portion 141b of the upper electrode 141 is formed. The upper external terminal 147 is connected to the terminal portion 141b of the upper electrode 141.

On the other hand, like the upper external terminal 147, the lower external terminal 148 is a metal member that is substantially C-shaped in side view, and is provided so as to cover substantially a part of the side surface 146b on the other short side of the ferroelectric member 146 and a part of the upper and lower surfaces. The width of the lower external terminal 148 is set to about half of the short-side length of the ferroelectric member 146. In the side surface 146b of the ferroelectric member 146 on which the lower external terminal 148 is placed, the lower external terminal 148 is placed near the long side on which a terminal portion 142b of the lower electrode 142 is formed (the side opposite to the long side on which the upper external terminal 147 is formed). The lower external terminal 148 is connected to the terminal portion 142b of the lower electrode 142.

As described above, in this example as well, as in the fifth embodiment mentioned above, the upper external terminal 147 and the lower external terminal 148 are placed on the diagonal across the ferroelectric member 146. Therefore, in this case as well, as in the fifth embodiment, the opposing area between the upper external terminal 147 and the lower external terminal 138 can be made smaller, and the stray capacitance between the external terminals can be made small.

While the example shown in FIGS. 39(A) and (B) relates to the case in which the upper external terminal 147 and the lower external terminal 148 do not oppose each other in a direction (x direction) along the long sides of the ferroelectric member 146, the present invention is not limited to this. If the stray capacitance between the upper external terminal 147 and the lower external terminal 148 is negligibly small relative to the capacitance of the variable capacitance capacitor formed between the upper electrode 141 and the lower electrode 142, a region may be present between the upper external terminal 147 and the lower external terminal 148 where the external terminals oppose each other.

[Electrode Configuration]

Figure 40:
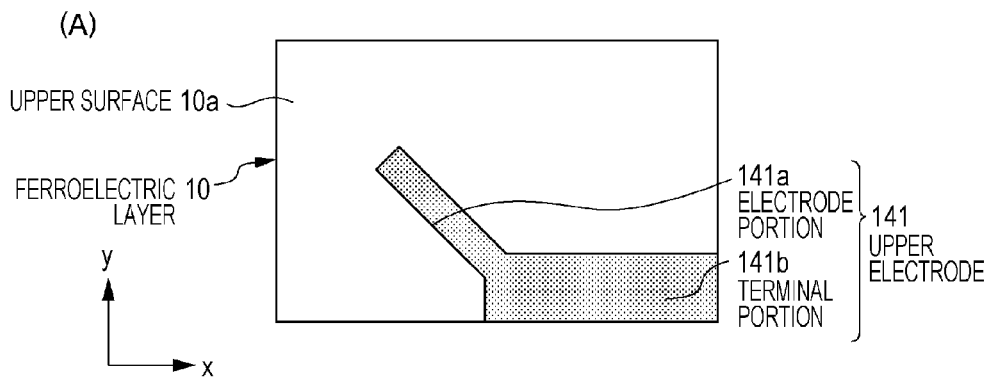
FIG. 40(A) is a configuration diagram of an upper electrode of the variable capacitance capacitor according to Modification 5.
FIG. 40(B) is a configuration diagram of a lower electrode of the variable capacitance capacitor according to Modification 5.

FIGS. 40(A) and (B) show an example of electrode configuration of the variable capacitance capacitor 145 according to this example. FIG. 40(A) is a top view of the ferroelectric layer 10 according to this example, illustrating the configuration of the upper electrode 141. On the other hand, FIG. 40(B) is a bottom view of the ferroelectric layer 10 according to this example, illustrating the configuration of the lower electrode 142. In FIGS. 40(A) and (B), the same components as those according to the fifth embodiment mentioned above (FIGS. 37(A) and (B)) are denoted by the same symbols.

The upper electrode 141 has the same shape as that of the upper electrode 131 (FIG. 37(A)) according to the fifth embodiment mentioned above, and includes an electrode portion 141a and the terminal portion 141b. In this example, the terminal portion 141b is formed so as to extend from one short side (the right short side in FIG. 40(A)) of the upper surface 10a of the ferroelectric layer 10. That is, the extending length of the terminal portion 141b is made longer than that according to the fifth embodiment. The upper electrode 141 according to this example is of the same configuration as the upper electrode 131 according to the fifth embodiment described above, except that the shape of the terminal portion 141b is changed.

The lower electrode 142 has the same shape as that of the lower electrode 142 (FIG. 37(B)) according to the fifth embodiment mentioned above, and includes an electrode portion 142a and a terminal portion 142b. In this example, the terminal portion 142b is formed so as to extend from the other short side (the left short side in FIG. 40(B)) of the lower surface 10b of the ferroelectric layer 10. That is, the extending length of the terminal portion 142b is made longer than that according to the fifth embodiment. The lower electrode 142 according to this example is of the same configuration as the lower electrode 142 according to the fifth embodiment described above, except that the shape of the terminal portion 142b is changed. In this example, the extending direction of the electrode portion 142a of the lower electrode 142 is substantially orthogonal to the extending direction of the electrode portion 141a of the upper electrode 141.

Figure 41:
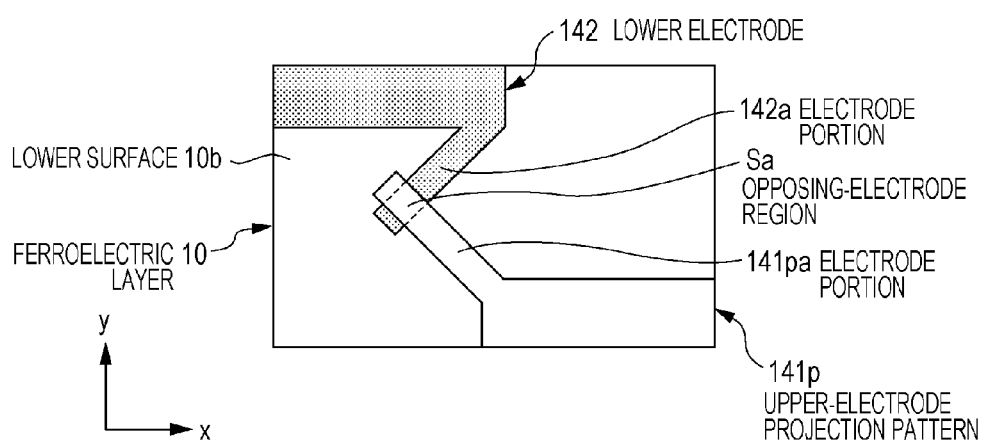
FIG. 41 is a diagram showing an overlapping state between the projection pattern of an upper electrode and a lower electrode in a case when there is no displacement, in the variable capacitance capacitor according to Modification 5.

FIG. 41 shows an overlapping state between an upper-electrode projection pattern 141p, which is obtained by projecting the upper electrode 141 onto the lower surface 10b of the ferroelectric layer 10, and the lower electrode 142, in the variable capacitance capacitor 145 according to this example. FIG. 41 shows an overlapping state between the upper-electrode projection pattern 141p and the lower electrode 142 in a case when the upper electrode 141 is not displaced with respect to the lower electrode 142. In this example, an electrode portion 141pa of the upper-electrode projection pattern 141p, and the electrode portion 142a of the lower electrode 142 are made to cross each other, and the opposing-electrode region Sa is formed in the crossing region.

In this example, the shapes and dimensions of the upper electrode 141 and lower electrode 142 are designed so that the area of the opposing-electrode region Sa between the upper electrode 141 and the lower electrode 142 is constant even when displacement occurs between the upper electrode 141 and the lower electrode 142. In addition, as in the first embodiment mentioned above, the shapes and dimensions of the upper electrode 141 and lower electrode 142 are designed by taking the necessary capacitance value and resistance value, and the like into consideration.

The variable capacitance capacitor 145 according to this example can be fabricated in the same manner as, for example, the manufacturing method according to the first embodiment described above. While this example relates to the case of configuration in which there is a single ferroelectric layer 10, the present invention is not limited to this, and a plurality of ferroelectric layers 10 may be layered via electrodes.

As described above, in this example, both the internal electrodes are formed in such a way that the area of the opposing-electrode region Sa between the upper electrode 141 and the lower electrode 142 is constant even when displacement occurs between the upper electrode 141 and the lower electrode 142. Therefore, according to this example, the same effect as that of the first embodiment is attained.

Also, according to this example, the opposing area between the upper external terminal 147 and the lower external terminal 148 can be made smaller. In addition, in this example, the upper external terminal 147 and the lower external terminal 148 are respectively placed on the opposite side surfaces on the short sides of the ferroelectric member 146, so the distance between the upper external terminal 147 and the lower external terminal 148 becomes larger than that according to the fifth embodiment. Therefore, in this example, the stray capacitance between the two external terminals can be made further smaller, and the influence of stray capacitance can be reduced further.

While description has been made in the fifth embodiment and Modification 5 above with an example of a variable capacitance device (variable capacitance capacitor) as the capacitance device, the present invention is not restricted to this. The configurations of the upper electrode and lower electrode described with the fifth embodiment and Modification 5 can be similarly applied to constant-capacitance devices regarding which the capacitance hardly changes at all, regardless of the type of input signal and the signal level thereof. Note however, in this case, the dielectric layer is formed of a paraelectric material which has low relative permittivity. Materials the same as the paraelectric materials described with the first embodiment above may be used for paraelectric materials.

The problem described in the fifth embodiment above, i.e., the problem of stray capacitance C0 between the upper external terminal and the lower external terminal occurs similarly with constant-capacitance devices. Accordingly, in the event of applying the configuration of the upper electrode and lower electrode described with the fifth embodiment and Modification 5 above to a constant-capacitance device, the stray capacitance between the external terminals can be reduced even further, and advantages the same as those of the fifth embodiment can be obtained.

<6. Sixth Embodiment>

In a sixth embodiment, a description will be given of another example of configuration of a variable capacitance capacitor with which the stray capacitance between external terminals can be reduced.

[Configuration of Variable Capacitance Capacitor]

Figure 42:
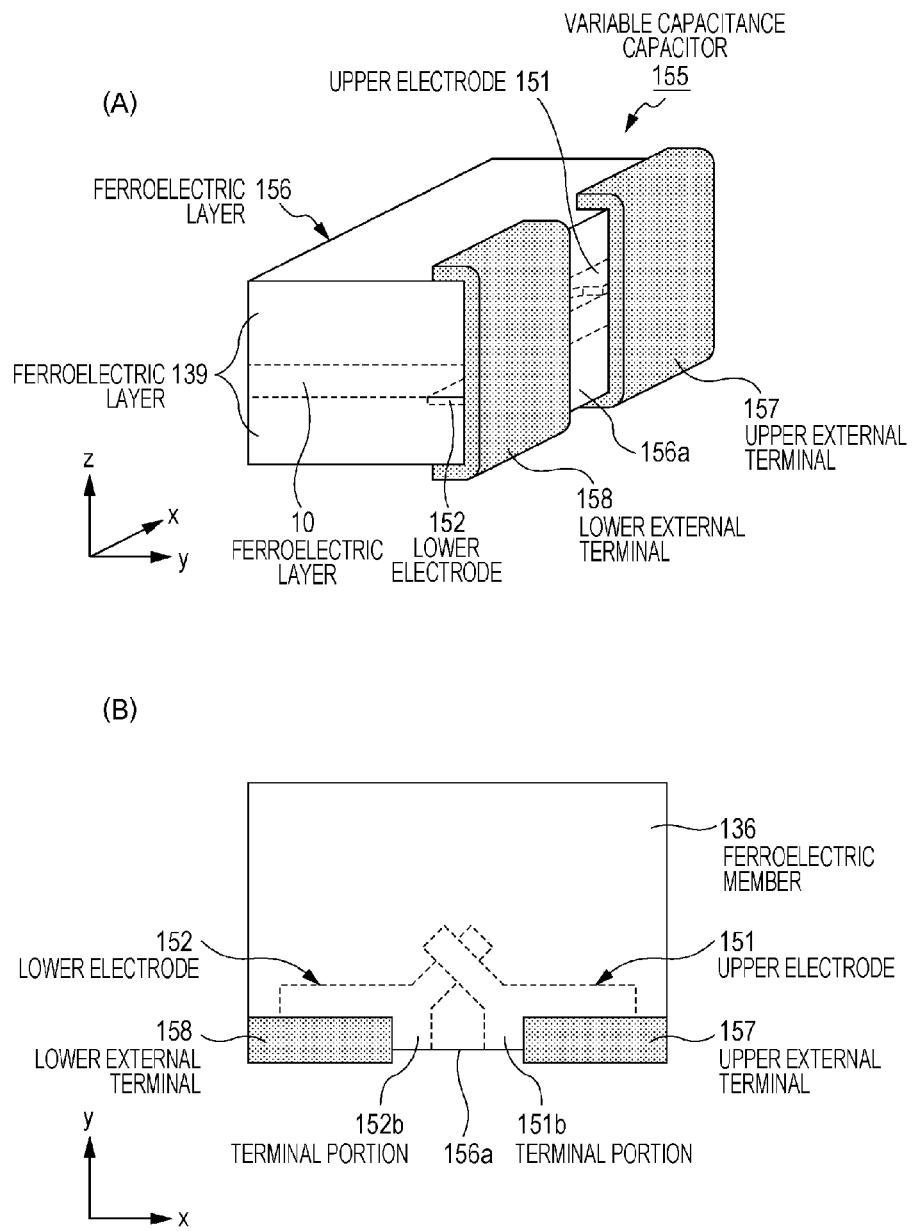
FIG. 42(A) is a schematic perspective view of a variable capacitance capacitor according to a sixth embodiment.
FIG. 42(B) is a top view of the variable capacitance capacitor according to the sixth embodiment.

FIGS. 42(A) and (B) show an example of schematic configuration of a variable capacitance capacitor according to this embodiment. FIG. 42(A) is a perspective exterior view of a variable capacitance capacitor 155, and FIG. 42(B) is a top view of the variable capacitance capacitor 155. In FIGS. 42(A) and (B), the same components as those according to the fifth embodiment (FIGS. 36(A) and (B)) are denoted by the same symbols. In each of FIGS. 42(A) and (B), an upper electrode 151 and a lower electrode 152 formed within a ferroelectric member 156 are indicated by broken lines.

The variable capacitance capacitor 155 (variable capacitance device) includes, for example, the rectangular parallelepiped ferroelectric member 156, and an upper external terminal 157 and a lower external terminal 158 that are provided at a predetermined distance from each other on one side surface 156a on the long side of the ferroelectric member 156. The spacing between the upper external terminal 157 and the lower external terminal 158 is preferably set to such a distance that makes the stray capacitance between these external terminals negligibly small in comparison to the capacitance between the upper electrode 151 and the lower electrode 152.

The ferroelectric member 156 includes the ferroelectric layer 10 (dielectric layer), the upper electrode 151 and the lower electrode 152 respectively formed on the upper surface 10a and lower surface 10b of the ferroelectric layer 10, and the ferroelectric layer 139 that is further formed on each of the upper electrode 151 and the lower electrode 152. The ferroelectric member 156 according to this embodiment is of the same configuration as the ferroelectric member 136 (FIG. 36(A)) according to the fifth embodiment described above, except that the shapes of the upper electrode 151 and lower electrode 152 are changed.

The upper external terminal 157 (first external terminal) and the lower external terminal 158 (second external terminal) are both metal members that are substantially C-shaped in side view, and are provided so as to cover a part of the side surface 156a of the ferroelectric member 156 on which those external terminals are placed and a part of the upper and lower surfaces. In this embodiment, the width of each of the upper external terminal 157 and lower external terminal 158 is set to less than half of the long-side length of the ferroelectric layer 10.

In the side surface 156a of the ferroelectric member 156 on which the upper external terminal 157 is placed, the upper external terminal 157 is placed near one short side on which a terminal portion 151b of the upper electrode 151 is formed. The upper external terminal 157 is connected to the terminal portion 151b of the upper electrode 151. On the other hand, in the side surface 156a of the ferroelectric member 156, the lower external terminal 158 is placed near the other short side on which a terminal portion 152b of the lower electrode 152 is formed. The lower external terminal 158 is connected to the terminal portion 152b of the lower electrode 152.

As described above, in the variable capacitance capacitor 155 according to this embodiment, the upper external terminal 157 and the lower external terminal 158 are placed on the same side surface of the ferroelectric member 156. Therefore, according to this embodiment, since the upper external terminal 157 and the lower external terminal 158 do not oppose each other across the ferroelectric member 156, the stray capacitance between the external terminals can be significantly reduced.

[Electrode Configuration]

Figure 43:
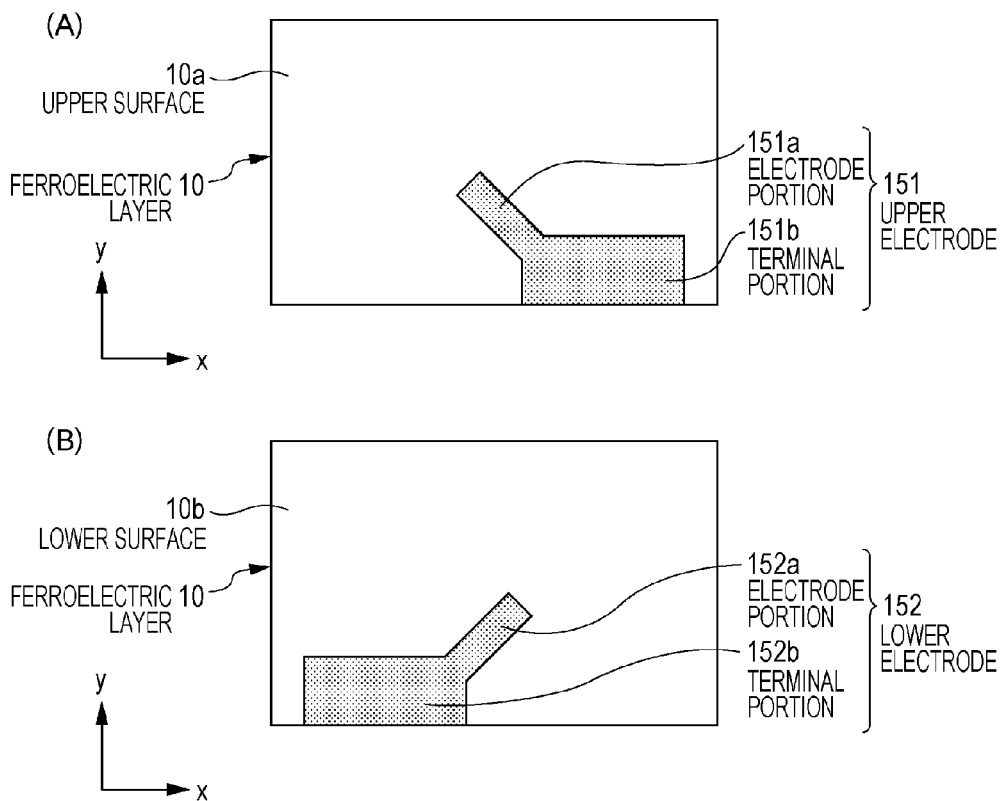
FIG. 43(A) is a configuration diagram of an upper electrode of the variable capacitance capacitor according to the sixth embodiment.
FIG. 43(B) is a configuration diagram of a lower electrode of the variable capacitance capacitor according to the sixth embodiment.

FIGS. 43(A) and (B) show an example of electrode configuration of the variable capacitance capacitor 155 according to this embodiment. FIG. 43(A) is a top view of the ferroelectric layer 10 according to this embodiment, illustrating the configuration of the upper electrode 151. On the other hand, FIG. 43(B) is a bottom view of the ferroelectric layer 10 according to this embodiment, illustrating the configuration of the lower electrode 152. In FIGS. 43(A) and (B), the same components as those according to the fifth embodiment mentioned above (FIGS. 37(A) and (B)) are denoted by the same symbols.

The upper electrode 151 (first electrode) includes an electrode portion 151a and the terminal portion 151b. The electrode portion 151a is formed so as to extend in an oblique direction (non-orthogonal direction) with respect to the direction (the x direction in FIG. 43(A)) along the long sides of the upper surface 10a of the ferroelectric layer 10. Specifically, in the plane of FIG. 43(A), the electrode portion 151a extends in a direction from the lower right corner portion of the upper surface 10a of the ferroelectric layer 10 toward the opposing upper left corner portion.

The terminal portion 151b is formed so as to extend from the vicinity of one short side of the upper surface 10a of the ferroelectric layer 10 in a direction along the long sides, and has a rectangular shape. In this embodiment, the length in the extending direction of the terminal portion 151b is set to less than half of the long-side length of the ferroelectric layer 10. In addition, in the upper surface 10a of the ferroelectric layer 10, the terminal portion 151b is placed near one long side (near the lower long side in the drawing), and near one short side on which the terminal portion 151b of the upper electrode 151 is formed. That is, in FIG. 43(A), the terminal portion 151b is placed in the vicinity of the lower right corner portion of the upper surface 10a of the ferroelectric layer 10. One end of the electrode portion 151a is connected to the corner portion of the terminal portion 151b located on the center side of the upper surface 10a of the ferroelectric layer 10.

On the other hand, the lower electrode 152 has a shape that is line-symmetric to the upper electrode 151, with respect to the direction (the y direction in FIG. 43(B)) along the short sides of the lower surface 10b of the ferroelectric layer 10. That is, in FIG. 43(B), the lower electrode 152 is placed in the vicinity of the lower left corner portion of the lower surface 10b of the ferroelectric layer 10. In this embodiment, the extending direction of the electrode portion 152a of the lower electrode 152 is substantially orthogonal to the extending direction of the electrode portion 151a of the upper electrode 151.

Figure 44:
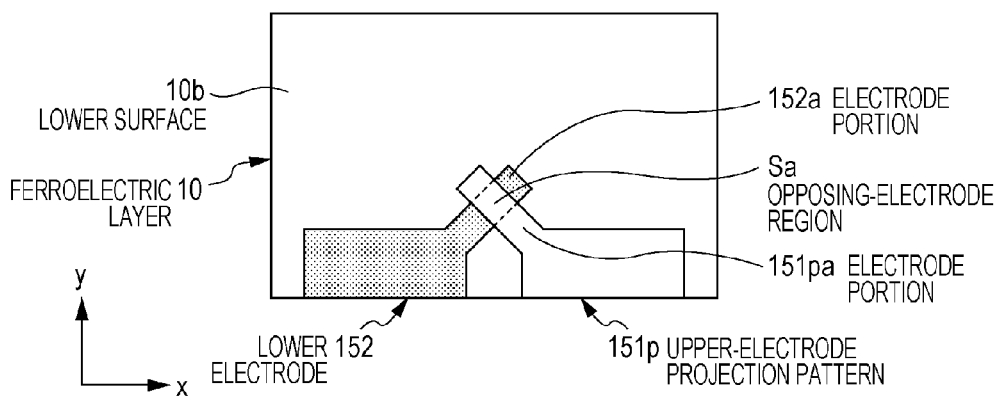
FIG. 44 is a diagram showing an overlapping state between the projection pattern of an upper electrode and a lower electrode in a case when there is no displacement, in accordance with the sixth embodiment.

FIG. 44 shows an overlapping state between an upper-electrode projection pattern 151p, which is obtained by projecting the upper electrode 151 onto the lower surface 10b of the ferroelectric layer 10, and the lower electrode 152, in the variable capacitance capacitor 155 according to this embodiment. FIG. 44 shows an overlapping state between the upper-electrode projection pattern 151p and the lower electrode 152 in a case when the upper electrode 151 is not displaced with respect to the lower electrode 152. In this embodiment, an electrode portion 151pa of the upper-electrode projection pattern 151p, and the electrode portion 152a of the lower electrode 152 are made to cross each other, and the opposing-electrode region Sa (first region) is formed in the crossing region.

In this embodiment, the shapes and dimensions of the upper electrode 151 and lower electrode 152 are designed so that the area of the opposing-electrode region Sa between the upper electrode 151 and the lower electrode 152 is constant even when displacement occurs between the upper electrode 151 and the lower electrode 152. In addition, as in the first embodiment mentioned above, the shapes and dimensions of the upper electrode 151 and lower electrode 152 are designed by taking the necessary capacitance value and resistance value, and the like into consideration.

The variable capacitance capacitor 155 according to this embodiment can be fabricated in the same manner as, for example, the manufacturing method according to the first embodiment described above. While this embodiment relates to the case of configuration in which there is a single ferroelectric layer 10, the present invention is not limited to this, and a plurality of ferroelectric layers 10 may be layered via electrodes.

As described above, in this embodiment, both the internal electrodes are formed in such a way that the area of the opposing-electrode region Sa between the upper electrode 151 and the lower electrode 152 is constant even when displacement occurs between the upper electrode 151 and the lower electrode 152. Therefore, according to this embodiment, the same effect as that of the first embodiment is attained.

According to this embodiment, since the upper external terminal 157 and the lower external terminal 158 do not oppose each other, the stray capacitance between the external terminals can be significantly reduced, and the above-described problem that occurs due to the influence of stray capacitance can be eliminated. Specifically, with the variable capacitance capacitor 155 according to this embodiment, a capacitance value substantially equal to a designed value can be attained, and the influence of stray capacitance on the variable range of the capacitance of the capacitor can be reduced.

While description has been made in the sixth embodiment above with an example of a variable capacitance device as the capacitance device, the present invention is not restricted to this. The configurations of the upper external terminal and lower external terminal described with the sixth embodiment can be similarly applied to constant-capacitance devices, and the same advantages can be obtained. Note however, in this case, the dielectric layer is formed of a paraelectric material which has low relative permittivity. Materials the same as the paraelectric materials described with the first embodiment above may be used for paraelectric materials.

<7. Seventh Embodiment>

While the fifth and sixth embodiments mentioned above relate to the case in which a pair of external terminals (a single variable capacitance capacitor) are formed in a single ferroelectric member, the present invention is not limited to this. For example, a configuration may be adopted in which, by providing the ferroelectric member with a plurality of pairs of external terminals, a plurality of variable capacitance capacitors may be provided (arrayed) within a single variable capacitance device. In this embodiment, a description will be given of a variable capacitance device having such a configuration.

[Configuration of Variable Capacitance Capacitor]

FIGS. 45(A) and (B) show the schematic configuration of a variable capacitance device according to this embodiment. FIG. 45(A) is a perspective exterior view of a variable capacitance device 165 according to this embodiment, and FIG. 45(B) is a top view of the variable capacitance device 165. In FIGS. 45(A) and (B), the same components as those according to the sixth embodiment (FIGS. 42(A) and (B)) are denoted by the same symbols. In each of FIGS. 45(A) and (B), a first upper electrode 161, a first lower electrode 162, a second upper electrode 163, and a second lower electrode 164 formed within a ferroelectric member 166 are indicated by broken lines.

The variable capacitance device 165 includes the ferroelectric member 166, and a first upper external terminal 167 (first external terminal) and a first lower external terminal 168 (second external terminal) which are provided on a side surface 166a (first side surface) on one long side of the ferroelectric member 166. Further, the variable capacitance device 165 includes a second upper external terminal 169 (third external terminal) and a second lower external terminal 170 (fourth external terminal) which are provided on a side surface 166b (second side surface) on the other long side of the ferroelectric member 166.

In the variable capacitance device 165 according to this embodiment, a single variable capacitance capacitor is formed between the first upper external terminal 167 and the first lower external terminal 168, as well as between the second upper external terminal 169 and the second lower external terminal 170. That is, in this embodiment, two variable capacitance capacitors are arrayed within a single variable capacitance device 165.

The ferroelectric member 166 has, for example, a rectangular parallelepiped shape, and includes the ferroelectric layer 10 (dielectric layer), the first upper electrode 161 (first electrode) and the second upper electrode 163 (third electrode) which are formed on the upper surface of the ferroelectric layer 10, and the ferroelectric layer 139 formed on each of those upper electrodes. In addition, the ferroelectric member 166 includes the first lower electrode 162 (second electrode) and the second lower electrode 164 (fourth electrode) which are formed on the lower surface of the ferroelectric layer 10, and the ferroelectric layer 139 formed on each of those lower electrodes. The ferroelectric member 166 according to this embodiment is of the same configuration as the sixth embodiment mentioned above, except that the ferroelectric member 166 has an arrayed electrode configuration.

The first upper external terminal 167 (first external terminal) and the second upper external terminal 169 (third external terminal) are of the same configuration as the upper external terminal 157 (FIG. 42(A)) described above with reference to the sixth embodiment.

In the one side surface 166a of the ferroelectric member 166 on which the first upper external terminal 167 is placed, the first upper external terminal 167 is placed near the short side on which a terminal portion 161b of the first upper electrode 161 is formed, and the first upper external terminal 167 is connected to the terminal portion 161b. On the other hand, in the other side surface 166b of the ferroelectric member 166 on which the second upper external terminal 169 is placed, the second upper external terminal 169 is placed near the short side on which a terminal portion 163b of the second upper electrode 163 is formed, and the second upper external terminal 169 is connected to the terminal portion 163b. That is, the first upper external terminal 167 and the second upper external terminal 169 are placed on the diagonal across the ferroelectric member 166.

The first lower external terminal 168 (second external terminal) and the second lower external terminal 170 (fourth external terminal) are of the same configuration as the lower external terminal 158 (FIG. 42(A)) described above with reference to the sixth embodiment.

In the side surface 166a of the ferroelectric member 166 on which the first lower external terminal 168 is placed, the first lower external terminal 168 is placed at a predetermined distance from the first upper external terminal 167, and is placed near the short side on which a terminal portion 162b of the first lower electrode 162 is formed. The first lower external terminal 168 is connected to the terminal portion 162b of the first lower electrode 162. On the other hand, in the other side surface 166b of the ferroelectric member 166 on which the second lower external terminal 170 is placed, the second lower external terminal 170 is placed at a predetermined distance from the second upper external terminal 169, and is placed near the short side on which a terminal portion 164b of the second lower electrode 164 is formed. The second lower external terminal 170 is connected to the terminal portion 164b of the second lower electrode 164.

That is, the first lower external terminal 168 and the second lower external terminal 170 are placed on the diagonal across the ferroelectric member 166. The placing direction of the first upper external terminal 167 and the second upper external terminal 169, and the placing direction of the first lower external terminal 168 and the second lower external terminal 170 cross each other.

As described above, in this embodiment, as in the sixth embodiment, each pair of external terminals forming each variable capacitance capacitor are provided on the same side surface of the ferroelectric member 166, so the pair of external terminals do not oppose each other. Therefore, in this embodiment as well, the stray capacitance between the external terminals of each variable capacitance capacitor can be significantly reduced.

[Electrode Configuration]

FIGS. 46(A) and (B) show an example of electrode configuration of the variable capacitance device 165 according to this embodiment. FIG. 46(A) is a top view of the ferroelectric layer 10, illustrating the configurations of the first upper electrode 161 and second upper electrode 163. On the other hand, FIG. 46(B) is a bottom view of the ferroelectric layer 10, illustrating the configurations of the first lower electrode 162 and the second lower electrode 164. In FIGS. 46(A) and (B), the same components as those according to the sixth embodiment mentioned above (FIGS. 43(A) and (B)) are denoted by the same symbols.

The first upper electrode 161 has the same shape as that of the upper electrode 151 described above with reference to the sixth embodiment mentioned above. In the upper surface 10a of the ferroelectric layer 10, the first upper electrode 161 is placed in the vicinity of one corner portion (the lower right corner portion in FIG. 46(A)). In the upper surface 10a of the ferroelectric layer 10, the second upper electrode 163 is placed in the vicinity of a corner portion (the upper left corner portion in FIG. 46(A)) in a diagonal direction from the first upper electrode 161, and is placed at a position that is line-symmetric to the first upper electrode 161 with respect to a direction orthogonal to the diagonal direction. In addition, the second upper electrode 163 has a shape that is line-symmetric to the first upper electrode 161 with respect to the direction orthogonal to the diagonal direction.

On the other hand, the first lower electrode 162 has the same shape as that of the lower electrode 152 described above with reference to the sixth embodiment mentioned above. In the lower surface 10b of the ferroelectric layer 10, the first lower electrode 162 is placed in the vicinity of a corner portion (the lower left corner portion in FIG. 46(B)) at a position that is line-symmetric to the first upper electrode 161 with respect to the short side direction of the lower surface 10b. In the lower surface 10b of the ferroelectric layer 10, the second lower electrode 164 is placed in the vicinity of a corner portion (the upper right corner portion in FIG. 46(B)) in a diagonal direction from the first lower electrode 162, and is placed at a position that is line-symmetric to the first lower electrode 162 with respect to a direction orthogonal to the diagonal direction. In addition, the second lower electrode 164 has a shape that is line-symmetric to the first lower electrode 162 with respect to the direction orthogonal to the diagonal direction.

FIG. 47 shows an overlapping state between a first upper-electrode projection pattern 161p and a second upper-electrode projection pattern 163p, which are respectively obtained by projecting the first upper electrode 161 and the second upper electrode 163 onto the lower surface 10b of the ferroelectric layer 10, and the first lower electrode 162 and the second lower electrode 164. FIG. 47 shows an overlapping state between the upper-electrode projection patterns and the lower electrodes in a case when the respective upper electrodes are not displaced with respect to the lower electrodes. In this embodiment, an electrode portion 161pa of the first upper-electrode projection pattern 161p, and an electrode portion 162a of the first lower electrode 162 are made to cross each other, and a first opposing-electrode region SA1 (first region) is formed in the crossing region. In addition, an electrode portion 163pa of the second upper-electrode projection pattern 163p, and an electrode portion 164a of the second lower electrode 164 are made to cross each other, and a second opposing-electrode region SA2 (second region) is formed in the crossing region.

In this embodiment, the shapes and dimensions of the upper electrodes and lower electrodes are designed so that the area of each of the opposing-electrode regions (SA1 and SA2) between the upper electrodes and the lower electrodes is constant even when the upper electrodes are displaced with respect to the corresponding lower electrodes. In addition, as in the first embodiment mentioned above, the shapes and dimensions of the upper electrodes and lower electrodes are designed by taking the necessary capacitance value and resistance value, and the like into consideration.

In a case where two variable capacitance capacitors are arrayed on a single ferroelectric layer as in this embodiment, it is preferable that the stray capacitance between the two variable capacitance capacitors be negligibly small relative to the capacitance of each variable capacitance capacitor. For example, it is preferable that the stray capacitance between the two variable capacitance capacitors be about 1/10 or less of the capacitance of each variable capacitance capacitor. To realize this, it is preferable to make the spacing between the first opposing-electrode region SA1 and the second opposing-electrode region SA2 as wide as possible.

Figure 48:
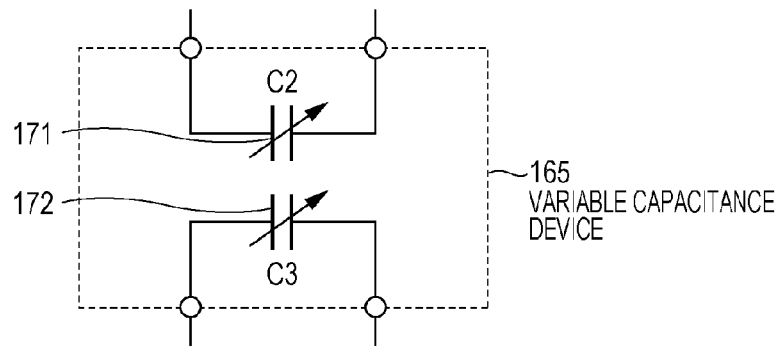
FIG. 48 is an equivalent circuit diagram of the variable capacitance device according to the seventh embodiment.

FIG. 48 shows an equivalent circuit of the variable capacitance device 165 according to this embodiment. A variable capacitance capacitor 171 with a capacitance C2 in FIG. 48 is a variable capacitance capacitor formed between the first upper external terminal 167 and the first lower external terminal 168. A variable capacitance capacitor 172 with a capacitance C3 in FIG. 48 is a variable capacitance capacitor formed between the second upper external terminal 169 and the second lower external terminal 170. As described above, in this embodiment, since two variable capacitance capacitors are formed independently with respect to a single ferroelectric member 166, the resulting equivalent circuit is represented by a four-terminal device.

The variable capacitance device 165 according to this embodiment can be fabricated in the same manner as, for example, the manufacturing method according to the first embodiment described above. While this embodiment relates to the case of configuration in which there is a single ferroelectric layer 10, the present invention is not limited to this, and a plurality of ferroelectric layers 10 may be layered via electrodes.

As described above, in this embodiment, the internal electrodes are formed in such a way that the area of each of the opposing-electrode regions (SA1 and SA2) between the upper electrodes and the lower electrodes is constant even when displacement occurs between the upper electrodes and the lower electrodes. Therefore, according to this embodiment, the same effect as that of the first embodiment is attained.

In this embodiment, the first upper external electrode 167 does not oppose the first lower external electrode 168. In addition, the second upper external electrode 169 does not oppose the second lower external electrode 170. Therefore, the stray capacitance between the external terminals can be significantly reduced, and the above-described problem that occurs due to the influence of stray capacitance can be eliminated.

Figure 49:
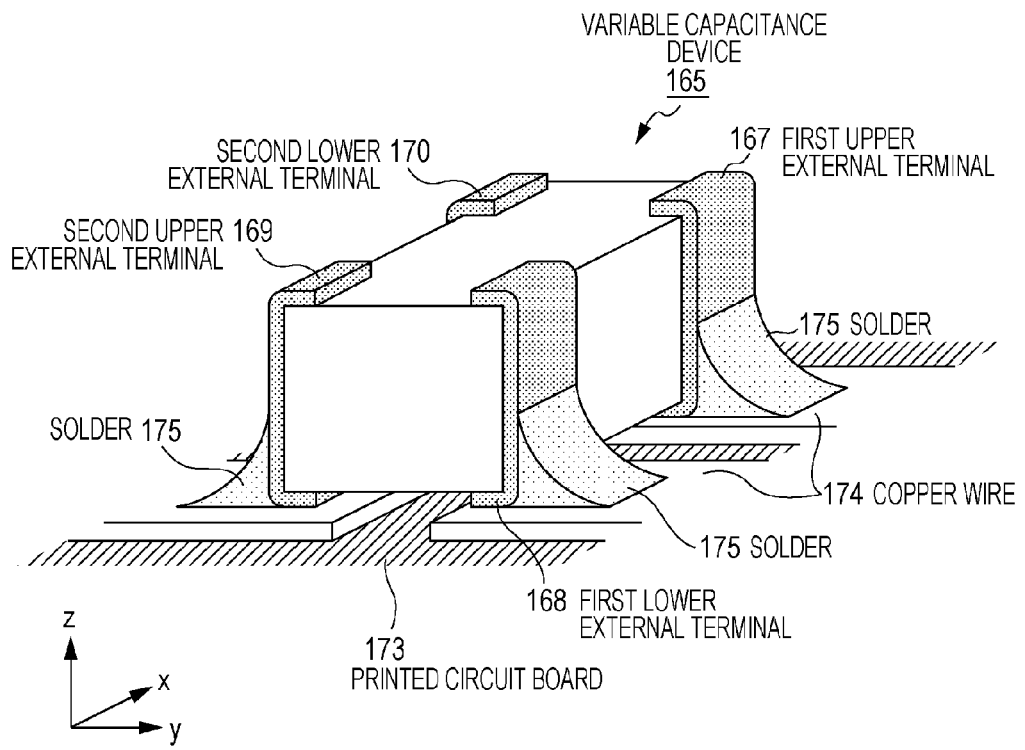
FIG. 49 is a diagram showing an example of mounting of the variable capacitance device according to the seventh embodiment.

Further, providing four external terminals at the four corner portion of the ferroelectric member 166 as in this embodiment provides the following advantage when mounting the variable capacitance device 165 onto a printed circuit board. FIG. 49 shows the schematic configuration of the variable capacitance device 165 according to this embodiment when mounted on the printed circuit board.

Normally, when fixing the variable capacitance device 165 onto a copper wire 174 of a printed circuit board 173, each external terminal and the corresponding copper wire 174 are soldered together by using a solder 175. At this time, since the solder 175 contracts when solidified, the variable capacitance device is pulled toward the copper wire 174. Thus, if external terminals of the variable capacitance device are provided at the corner portions on one side of the ferroelectric member 166, there is a possibility that as the solder 175 contracts, the side of the variable capacitance device that is not soldered will rise up, resulting in faulty soldering. In contrast, if four external terminals are respectively provided at the four corner portions of the ferroelectric member 166 as in this embodiment, the variable capacitance device is pulled evenly even when the solder 175 contracts, thereby enabling reduction in faulty soldering described above.

[Modification 6]

While the seventh embodiment mentioned above relates to the case in which the respective opposing-electrode regions (SA1 and SA2) of two variable capacitance capacitors formed on a single ferroelectric layer 10 are placed along the short side direction of the ferroelectric layer 10, the present invention is not limited to this. The respective opposing-electrode regions (SA1 and SA2) of the two variable capacitance capacitors may be placed in the diagonal direction of the ferroelectric layer 10. An example of such a configuration (Modification 6) is shown in FIG. 50.

Figure 50:
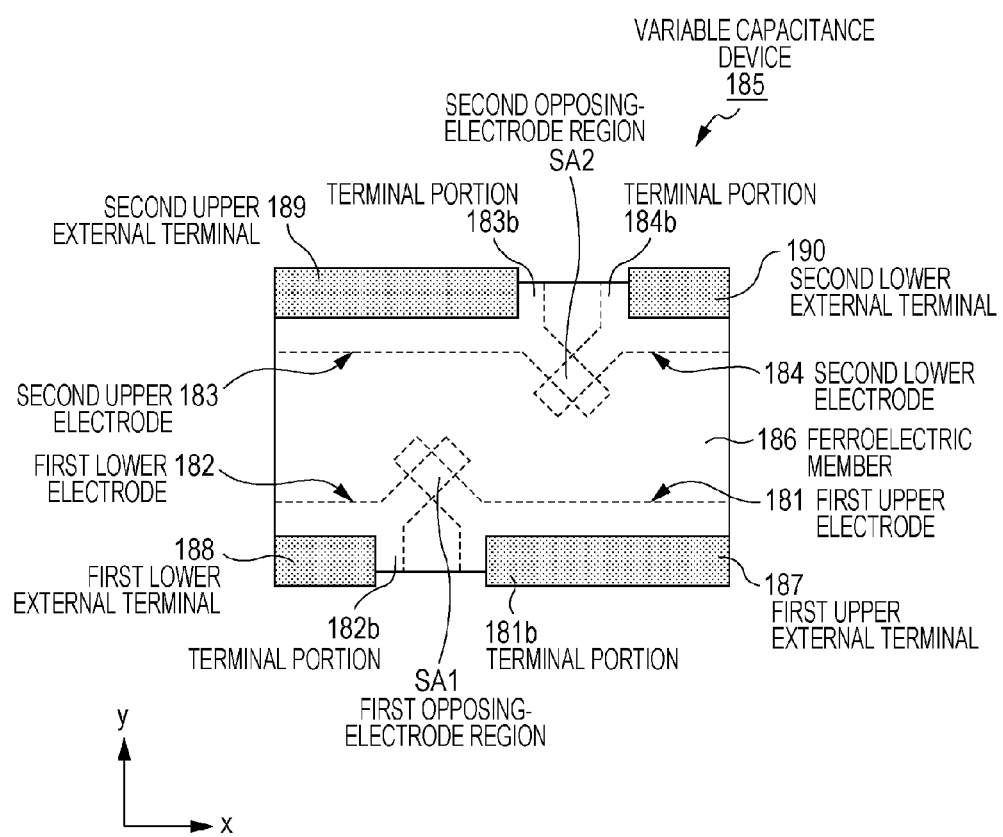
FIG. 50 is a schematic configuration diagram of a variable capacitance device according to Modification 6.

FIG. 50 is a top view of a variable capacitance device 185 according to this example. In FIG. 50, a first upper electrode 181, a first lower electrode 182, a second upper electrode 183, and a second lower electrode 184 formed within a ferroelectric member 186 are indicated by broken lines.

In the case of the variable capacitance device 185 according to this example, the length in the extending direction of the terminal portion of each internal electrode is changed from that of the variable capacitance device 165 (FIGS. 45(A) and (B)) according to the seventh embodiment mentioned above. Specifically, in this example, the length in the extending direction of each of a terminal portion 181b of the first upper electrode 181 and a terminal portion 183b of the second upper electrode 183 is made longer than that in the seventh embodiment. In addition, the length in the extending direction of each of a terminal portion 182b of the first lower electrode 182 and a terminal portion 184b of the second lower electrode 184 is made shorter than that in the seventh embodiment.

Then, in this example, following the change of the length of the terminal portion of each internal electrode, the width of the external terminal connected to each terminal portion is changed as well. Specifically, the width of each of a first upper external terminal 187 and a second upper external terminal 189 is made wider than that in the seventh embodiment. In addition, the width of each of a first lower external terminal 188 and a second lower external terminal 190 is made narrower than that in the seventh embodiment. The variable capacitance device 185 according to this example is of the same configuration as the seventh embodiment, except that the length in the extending direction of the terminal portion of each internal electrode and the width of each external terminal are changed.

By forming the individual internal electrodes in the manner as described above, the first opposing-electrode region SA1 defined between the first upper electrode 181 and the first lower electrode 182, and the second opposing-electrode region SA2 defined between the second upper electrode 183 and the second lower electrode 184 are placed in the diagonal direction of the ferroelectric layer. As a result, the spacing between the first opposing-electrode region SA1 and the second opposing-electrode region SA2 can be made wider than that in the seventh embodiment.

Therefore, in this example, the stray capacitance between the variable capacitance capacitor formed between the first upper electrode 181 and the first lower electrode 182, and the variable capacitance capacitor formed between the second upper electrode 183 and the second lower electrode 184 can be made smaller. For example, provided that the distance between the first opposing-electrode region SA1 and the second opposing-electrode region SA2 in the variable capacitance device 185 according to this example is twice of that in the seventh embodiment, the stray capacitance becomes ½ of that in the seventh embodiment.

[Modification 7]

In Modification 7, a description will be given of another example of configuration in which a plurality of variable capacitance capacitors are arrayed within a single variable capacitance device.

[Configuration of Variable Capacitance Capacitor]

FIGS. 51(A) and (B) show the schematic configuration of a variable capacitance device according to Modification 7. FIG. 51(A) is a perspective exterior view of a variable capacitance device 195 according to this example, and FIG. 51(B) is a top view of the variable capacitance device 195. In FIGS. 51(A) and (B), the same components as those according to the seventh embodiment (FIGS. 45(A) and (B)) are denoted by the same symbols. In each of FIGS. 51(A) and (B), a first upper electrode 191, a first lower electrode 192, and a second lower electrode 193 formed within a ferroelectric member 196 are indicated by broken lines.

The variable capacitance device 195 includes, for example, the ferroelectric member 196 having a rectangular parallelepiped shape, and an upper external terminal 197 provided on a side surface 196a on one long side of the ferroelectric member 196, and a first lower external terminal 198 and a second lower external terminal 199 which are provided on a side surface 196b on the other long side. In the variable capacitance device 195 according to this example, a single variable capacitance capacitor is formed between the upper external terminal 197 and the first lower external terminal 198, as well as between the upper external terminal 197 and the second lower external terminal 199. That is, in this example, the upper external terminal 197 serves as a common external terminal for two variable capacitance capacitors.

The ferroelectric member 196 includes the ferroelectric layer 10, the upper electrode 191 formed on the upper surface thereof, and the ferroelectric layer 139 formed on the upper electrode 191. In addition, the ferroelectric member 196 includes the first lower electrode 192 and the second lower electrode 193 formed on the lower surface of the ferroelectric layer 10, and the ferroelectric layer 139 formed on each of those lower electrodes. The ferroelectric member 196 according to this example is of the same configuration as the seventh embodiment mentioned above, except that the upper electrode is formed as a common electrode, and the shapes of the individual internal electrodes are changed.

The upper external terminal 197 is of the same configuration as the upper external terminal 167 described above with reference to the seventh embodiment. The upper external terminal 197 is placed in the vicinity of the center of the side surface 196a on one long side of the ferroelectric member 196. The upper external terminal 197 is connected to the terminal portion of the upper electrode 191.

The first lower external terminal 198 and the second lower external terminal 199 are of the same configuration as that of the first lower external terminal 168 described above with reference to the seventh embodiment. The first lower external terminal 198 and the second lower external terminal 199 are placed on the side surface 196b on the other long side of the ferroelectric member 196 so as to be separated by a predetermined distance from each other. In addition, in the side surface 196b of the ferroelectric member 196, the first lower external terminal 198 and the second lower external terminal 199 are placed near one and the other short sides, respectively.

As described above, in this example, the upper external terminal 197, and the first lower external terminal 198 and the second lower external terminal 199 are placed so as to cross the opposing direction (the y direction in FIGS. 51(A) and (B)) between the side surfaces 196a and 196b on the long sides of the ferroelectric member 196. Therefore, the opposing area between two external terminals forming each variable capacitance capacitor becomes small, thereby enabling the stray capacitance between the external terminals to be made smaller in each variable capacitance capacitor.

[Electrode Configuration]

FIGS. 52(A) and (B) show an example of electrode configuration of the variable capacitance device 195 according to this example. FIG. 52(A) is a top view of the ferroelectric layer 10 according to this example, illustrating the configuration of the upper electrode 191. On the other hand, FIG. 52(B) is a bottom view of the ferroelectric layer 10 according to this example, illustrating the configurations of the first lower electrode 192 and the second lower electrode 193. In FIGS. 52(A) and (B), the same components as those according to the seventh embodiment mentioned above (FIGS. 46(A) and (B)) are denoted by the same symbols.

The upper electrode 191 (first electrode) is a Y-shaped electrode, and includes a first electrode portion 191a, a second electrode portion 191c, and a terminal portion 191b. The terminal portion 191b is formed so as to extend in a direction along the long sides of the upper surface 10a of the ferroelectric layer 10, and has a rectangular shape. The terminal portion 191b is placed near one long side (near the lower long side in the plane of FIG. 52(A)) of the upper surface 10a of the ferroelectric layer 10, and in the vicinity of the center of the long side.

The first electrode portion 191a and the second electrode portion 191c are formed so as to extend in an oblique direction (non-orthogonal direction) with respect to the direction (the x direction in FIG. 52(A)) along the long sides of the upper surface 10a of the ferroelectric layer 10. Of the four corner portions of the terminal portion 191b, the first electrode portion 191a is connected to one corner portion located on the center side of the upper surface 10a of the ferroelectric layer 10, and the second electrode portion 191c is connected to the other corner portion located on the center side of the upper surface 10a of the ferroelectric layer 10. The first electrode portion 191a and the second electrode portion 191c are placed in such a way that their distance increases with decreasing proximity to the terminal portion 191b.

The first lower electrode 192 (second electrode) and the second lower electrode 193 (third electrode) both have a V-shape, and are of the same configuration as the lower electrode 132 (FIG. 37(B)) described above with reference to the fifth embodiment. It should be noted, however, that in this example, the length in the extending direction of each of the terminal portion 192b of the first lower electrode 192 and the terminal portion 193b of the second lower electrode 193 is set to less than half of the long-side length of the ferroelectric layer 10.

Then, in this example, in the lower surface 10b of the ferroelectric layer 10, the first lower electrode 192 and the second lower electrode 193 are placed at a predetermined distance from each other, and near the long side opposite to the long side on which the upper electrode 191 is formed. At this time, the first lower electrode 192 and the second lower electrode 193 are placed in such a way that the ends on the respective electrode portion sides oppose each other. That is, the first lower electrode 192 and the second lower electrode 193 are placed so as to be line-symmetric with respect to the direction (the y direction in FIG. 52(B)) along the short sides of the lower surface 10b of the ferroelectric layer 10.

FIG. 53 shows an overlapping state between an upper-electrode projection pattern 191p, which is obtained by projecting the upper electrode 191 onto the lower surface 10b of the ferroelectric layer 10, and the first lower electrode 192 and the second lower electrode 193, in the variable capacitance device 195 according to this example. FIG. 53 shows an overlapping state between the upper-electrode projection pattern 191p and the first lower electrode 192 and the second lower electrode 193 in a case when the upper electrode is not displaced with respect to the lower electrodes. In this example, an electrode portion 191pa of the upper-electrode projection pattern 191p, and an electrode portion 192a of the first lower electrode 192 are made to cross each other, and the first opposing-electrode region SA1 (first region) is formed in the crossing region. In addition, the electrode portion 191pc of the upper-electrode projection pattern 191p, and an electrode portion 193a of the second lower electrode 193 are made to cross each other, and the second opposing-electrode region SA2 (second region) is formed in the crossing region.

In this example, the shapes and dimensions of the individual internal electrodes are designed so that the area of each of the first opposing-electrode region SA1 and the second opposing-electrode region SA2 is constant even when the upper electrode 191 is displaced with respect to the first lower electrode 192 and the second lower electrode 193. In addition, in this example, as in the first embodiment mentioned above, the shapes and dimensions of the upper electrode and lower electrodes are designed by taking the necessary capacitance value and resistance value, and the like into consideration.

Figure 54:
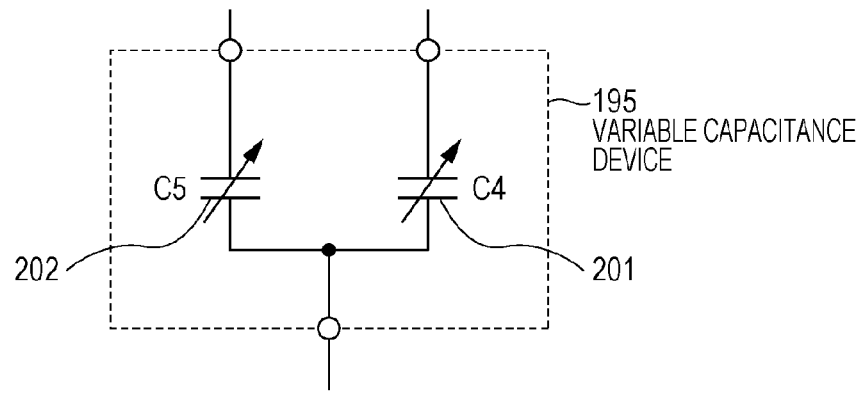
FIG. 54 is an equivalent circuit diagram of the variable capacitance device according to Modification 7.

FIG. 54 shows an equivalent circuit of the variable capacitance device 195 according to this example. A variable capacitance capacitor 201 with a capacitance C4 in FIG. 54 is a variable capacitance capacitor formed between the upper external terminal 197 and the first lower external terminal 198. A variable capacitance capacitor 202 with a capacitance C5 in FIG. 54 is a variable capacitance capacitor formed between the upper external terminal 197 and the second lower external terminal 199. As described above, in this example, while two variable capacitance capacitors 201 and 202 are formed with respect to a single ferroelectric member 196, the upper external terminal 197 (upper electrode) is a common terminal for the two capacitors. Thus, the resulting equivalent circuit is represented by a three-terminal device, in which the two variable capacitance capacitors 201 and 202 are connected in series.

The variable capacitance device 195 according to this example can be fabricated in the same manner as, for example, the manufacturing method according to the first embodiment described above. While in this example the description relates to the case of configuration in which there is a single ferroelectric layer 10, the present invention is not limited to this, and a plurality of ferroelectric layers 10 may be layered via electrodes.

As described above, in this example, even when displacement occurs between the upper electrode 191, the first lower electrode 192, and the second lower electrode 193, the area of each of the opposing-electrode regions (SA1 and SA2) between the internal electrodes is constant. Therefore, according to this example, the same effect as that of the first embodiment is attained.

In addition, in this example, the opposing area between the upper external terminal 197 and the first lower external terminal 198, as well as between the upper external terminal 197 and the second lower external terminal 199 can be made smaller. Therefore, the stray capacitance between the individual external terminals can be further reduced, thereby enabling elimination of the above-described problem that occurs due to the influence of stray capacitance.

Further, in this example, since three external terminals are placed in a triangular shape across the ferroelectric member 196, as in the seventh embodiment, faulty soldering at the time of fixing the variable capacitance device 195 onto a copper wire or the like on a printed circuit board can be reduced.

[Modification 8]

Figure 55:
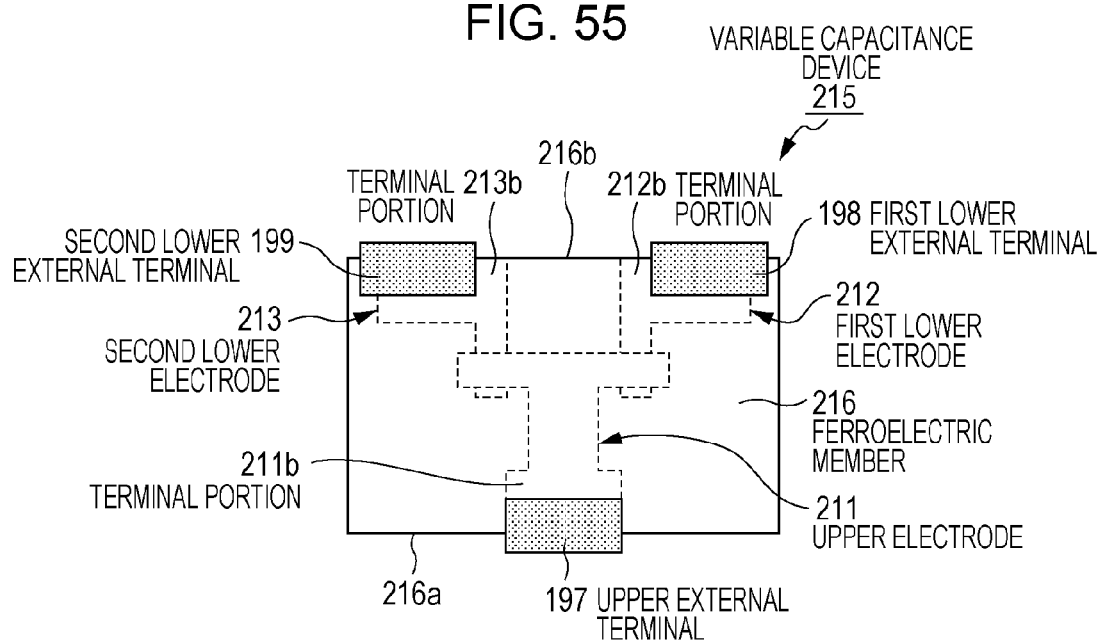
FIG. 55 is a schematic configuration diagram of a variable capacitance device according to Modification 8.

An example of configuration of a three-terminal type variable capacitance device is not limited to Modification 7 mentioned above. FIG. 55 shows another example of a configuration (Modification 8) of a three-terminal type variable capacitance device. FIG. 55 is a top view of a variable capacitance device according to this example, in which the same components as those according to Modification 7 (FIG. 51(B)) are denoted by the same symbols. In FIG. 55, a first upper electrode 211, a first lower electrode 212, and a second lower electrode 213 formed within a ferroelectric member 216 are indicated by broken lines.

In this example, the upper electrode 211 is formed as a substantially T-shaped electrode, and the first upper electrode 212 and the second lower electrode 213 are formed as L-shaped electrodes. A terminal portion of the upper electrode 211 is connected to the upper external terminal 197, a terminal portion 212b of the first lower electrode 212 is connected to the first lower external terminal 198, and a terminal portion 213b of the second lower electrode 213 is connected to the second lower external terminal 199. Otherwise, the variable capacitance device is of the same configuration as the variable capacitance device 195 (FIGS. 51(A) and (B)) according to Modification 7.

In a variable capacitance device 215 according to this example, a variable capacitance capacitor is formed between the upper electrode 211 and the first lower electrode 212, as well as between the upper electrode 211 and the second lower electrode 213. In this example as well, as in Modification 7, since the upper electrode 211 is used as a common electrode for two variable capacitance capacitors, a three-terminal variable capacitance device can be constructed.

Figure 56:
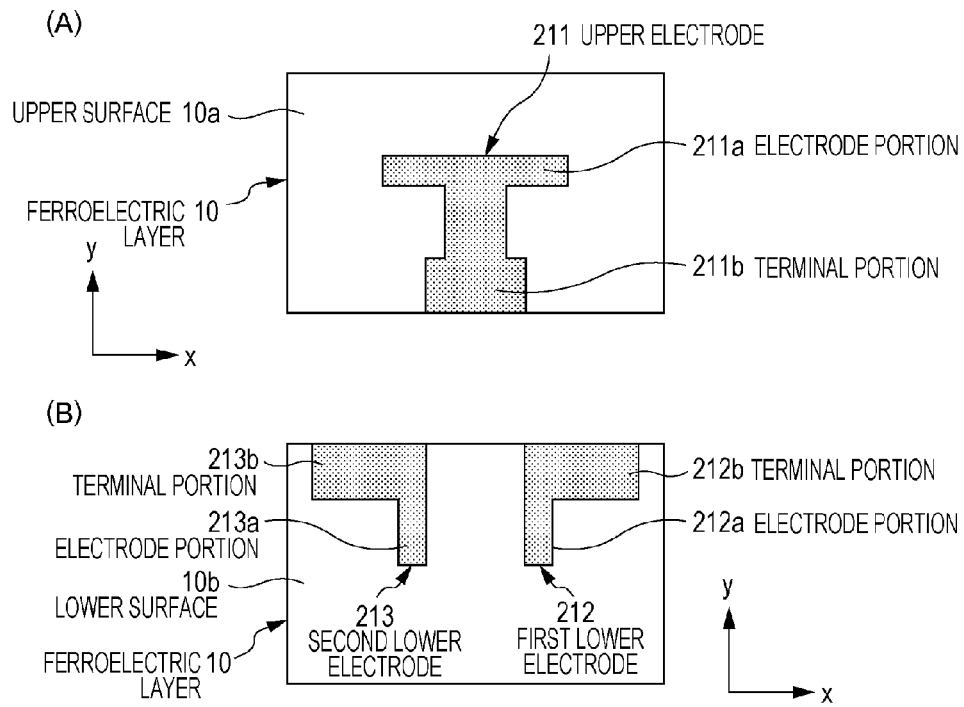
FIG. 56(A) is a configuration diagram of an upper electrode of the variable capacitance capacitor according to Modification 8.
FIG. 56(B) is a configuration diagram of lower electrodes of the variable capacitance capacitor according to Modification 8.

FIGS. 56(A) and (B) show an example of electrode configuration of the variable capacitance device 215 according to this example. FIG. 56(A) is a top view of the ferroelectric layer 10 according to this example, illustrating the configuration of the upper electrode 211. On the other hand, FIG. 56(B) is a bottom view of the ferroelectric layer 10 according to this example, illustrating the configuration of the first lower electrode 212 and second lower electrode 213. In FIGS. 56(A) and (B), the same components as those according to Modification 7 (FIGS. 52(A) and (B)) mentioned above are denoted by the same symbols.

The upper electrode 211 includes an electrode portion 211a and a terminal portion 211b. The terminal portion 211b is formed so as to extend from near one long side (near the lower long side in FIG. 56(A)) of the upper surface 10a of the ferroelectric layer 10, in a direction along the short sides, and has a substantially rectangular shape. The terminal portion 211b is placed in the vicinity of the center of the one long side of the upper surface 10a of the ferroelectric layer 10.

The electrode portion 211a is formed so as to extend in a direction (the x direction in FIG. 56(A)) along the long sides of the upper surface 10a of the ferroelectric layer 10. The center portion of the electrode portion 211a is connected to one end of the terminal portion 211b.

The first lower electrode 212 includes the terminal portion 212b that extends in a direction (the x direction in FIG. 56(A)) along the long side of the lower surface 10b of the ferroelectric layer 10, and an electrode portion 212a that extends from one end of the terminal portion 212b in a direction orthogonal to the terminal portion 212b. On the other hand, the second lower electrode 213 has the same structure as the first lower electrode 212. In this example, the length in the extending direction of each of the terminal portion 212b of the first lower electrode 212 and the terminal portion 213b of the second lower electrode 213 is set to less than half of the long-side length of the ferroelectric layer 10.

In this example, in the lower surface 10b of the ferroelectric layer 10b, the first lower electrode 212 and the second lower electrode 213 are placed at a predetermined distance from each other, near the long side opposite to the long side on which the upper electrode 211 is formed. At this time, the first lower electrode 212 and the second lower electrode 213 are placed in such a way that the ends on the respective electrode portion sides oppose each other. That is, the first lower electrode 212 and the second lower electrode 213 are placed so as to be line-symmetric with respect to the direction (the y direction in FIG. 56(B)) along the short sides of the lower surface 10b of the ferroelectric layer 10.

Figure 57:
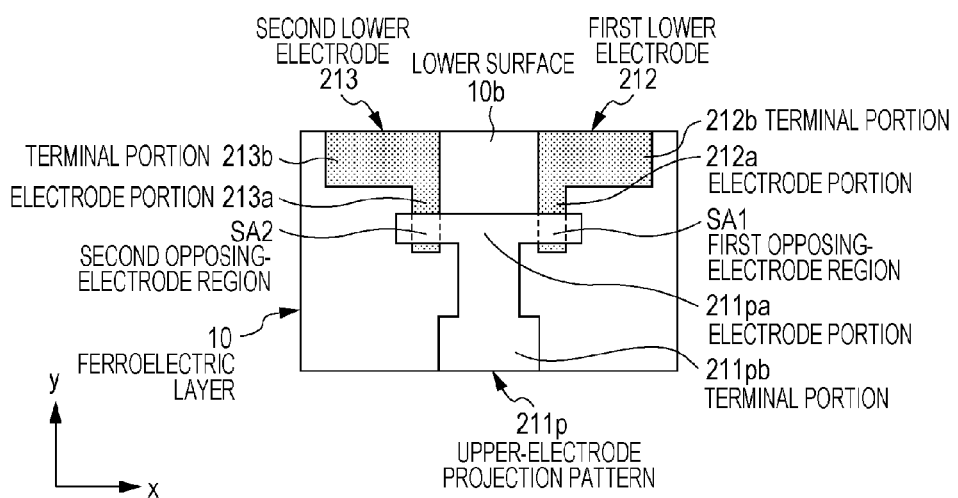
FIG. 57 is a diagram showing an overlapping state between the projection pattern of an upper electrode and lower electrodes in a case when there is no displacement, in the variable capacitance device according to Modification 8.

FIG. 57 shows an overlapping state between an upper-electrode projection pattern 211p, which is obtained by projecting the upper electrode 211 onto the lower surface 10b of the ferroelectric layer 10, and the first lower electrode 212 and the second lower electrode 213, in the variable capacitance device 215 according to this example. FIG. 57 shows an overlapping state between the upper-electrode projection pattern 211p and the first lower electrode 212 and the second lower electrode 213 in a case when the upper electrode is not displaced with respect to the lower electrodes. In this example, an electrode portion 211pa of the upper-electrode projection pattern 211p, and an electrode portion 212a of the first lower electrode 212 are made to cross each other, and the first opposing-electrode region SA1 is formed in the crossing region. In addition, the electrode portion 211pa of the upper-electrode projection pattern 211p, and an electrode portion 213a of the second lower electrode 213 are made to cross each other, and the second opposing-electrode region SA2 is formed in the crossing region.

In this example, the shapes and dimensions of the individual internal electrodes are designed so that the area of each of the first opposing-electrode region SA1 and the second opposing-electrode region SA2 is constant even when the upper electrode 211 is displaced with respect to the first lower electrode 212 and the second lower electrode 213. In addition, in this example, as in the first embodiment mentioned above, the shapes and dimensions of the individual internal electrodes are designed by taking the necessary capacitance value and resistance value, and the like into consideration.

The variable capacitance device 215 according to this example can be fabricated in the same manner as, for example, the manufacturing method according to the first embodiment described above. While in this example the description relates to the case of configuration in which there is a single ferroelectric layer 10, the present invention is not limited to this, and a plurality of ferroelectric layers 10 may be layered via electrodes.

As described above, in this example, even when displacement occurs between the upper electrode 211, the first lower electrode 212, and the second lower electrode 213, the area of each of the opposing-electrode regions (SA1 and SA2) between the internal electrodes is constant. Therefore, according to this example, the same effect as that of the first embodiment is attained.

In addition, in this example, the opposing area between the upper external terminal 197 and the first lower external terminal 198, as well as between the upper external terminal 197 and the second lower external terminal 199 can be made smaller. Therefore, the stray capacitance between the individual external terminals can be further reduced, thereby enabling elimination of the above-described problem that occurs due to the influence of stray capacitance.

Further, in this example, since three external terminals are placed in a triangular shape across the ferroelectric member 216, as in the seventh embodiment, faulty soldering at the time of fixing the variable capacitance device 215 onto a copper wire or the like on a printed circuit board can be reduced.

Further, with the electrode configuration of the variable capacitance device 215 according to this example, as compared with the electrode configuration (FIGS. 52(A) and (B)) according to Modification 7, the length of the electrode portion of each internal electrode can be made shorter. Thus, the resistance value of the variable capacitance device 215 as a whole can be further reduced.

While the description of the variable capacitance devices according to the seventh embodiment and Modifications 6 to 8 mentioned above relates to the case in which two variable capacitance capacitors are arrayed in a single ferroelectric layer. However, the present invention is not limited to this. A configuration may be employed in which three or more variable capacitance capacitors are arrayed in a single ferroelectric layer. In addition, while the description of the variable capacitance devices according to the seventh embodiment and Modifications 6 to 8 mentioned above relates to the example of configuration of internal electrodes in which external terminals are provided on side surfaces on the long sides of the ferroelectric member, the present invention is not limited to this. A configuration of internal electrodes may be employed in which external terminals are provided on side surfaces on the short sides of the ferroelectric member.

[Modification 9]

Figure 58:
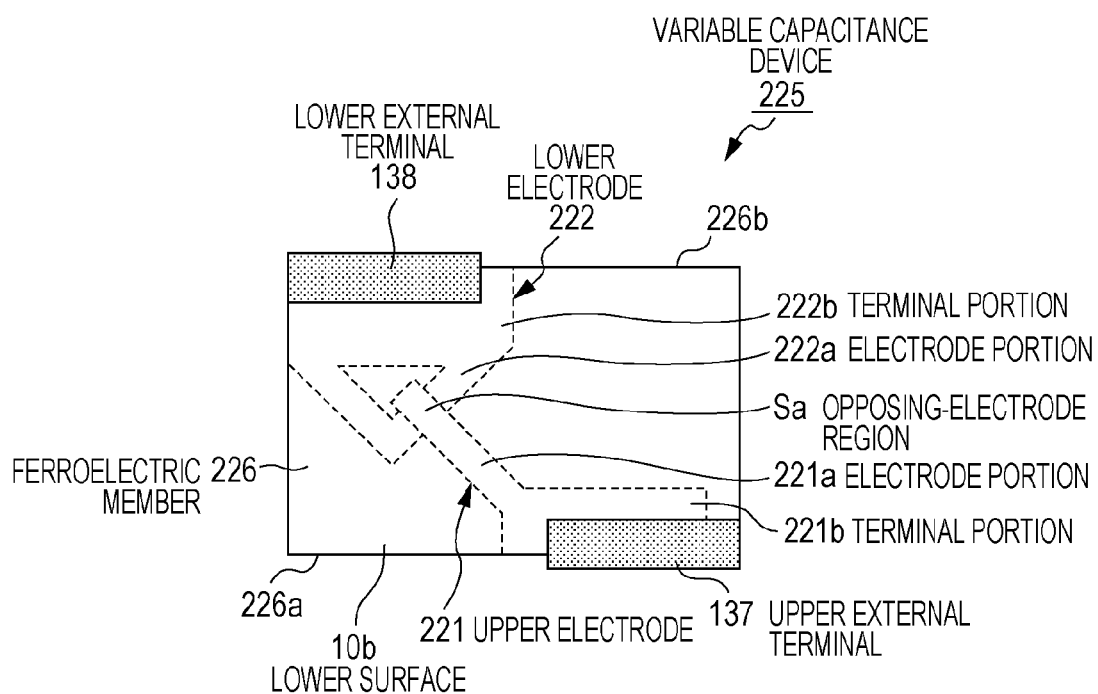
FIG. 58 is a schematic configuration diagram of a variable capacitance capacitor according to Modification 9.

The fourth embodiment mentioned above relates to the example of configuration for reducing the resistance value of a variable capacitance device as a whole, and the fifth to seventh embodiments relate to the example of configuration for reducing the stray capacitance between the external terminals of a variable capacitance device. However, the present invention is not limited to these. The example of configuration according to the fourth embodiment, and the example of configuration according to any one of the fifth to seventh embodiments may be combined as well. FIG. 58 shows such an example of configuration (Modification 9) of a variable capacitance capacitor.

FIG. 58 is a top view of a variable capacitance device 225 according to this example. In FIG. 58, the same components as those according to the fourth embodiment mentioned above (FIG. 30) are denoted by the same symbols. In FIG. 58, an upper electrode 221 and a lower electrode 222 formed within a ferroelectric member 216 are indicated by broken lines.

In this example, the upper electrode 221 is formed by the upper electrode 131 (FIG. 37(A)) described above with reference to the fifth embodiment, and the lower electrode 222 is formed by the lower electrode 101 (FIG. 29(A)) described above with reference to the fourth embodiment. The upper electrode 221 and the lower electrode 222 are formed on the diagonal of the ferroelectric member 226, and are placed in such a way that an electrode portion 221a of the upper electrode 221 and an electrode portion 222a of the lower electrode 222 cross each other. A terminal portion 221b of the upper electrode 221 is connected to the upper external terminal 137, and a terminal portion 222b of the lower electrode 222 is connected to the lower external terminal 138. Otherwise, the variable capacitance device 225 is of the same configuration as the variable capacitance capacitor 135 (FIGS. 36(A) and (B)) according to the fifth embodiment.

In this example as well, the shapes and dimensions of the upper electrode 221 and lower electrode 222 are designed so that the area of the opposing-electrode region Sa between the upper electrode 221 and the lower electrode 222 is constant even when the upper electrode 221 is displaced with respect to the lower electrode 222. In addition, in this example as well, as in the first embodiment mentioned above, the shapes and dimensions of the upper electrode 221 and lower electrode 222 are designed by taking the necessary capacitance value and resistance value, and the like into consideration. Therefore, in this case as well, the same effect as that of the first embodiment is attained.

As described above, the variable capacitance device 225 according to this example is a combination of the configurations according to the fourth and fifth embodiments. Thus, the resistance value of the variable capacitance device as a whole can be further reduced, and the stray capacitance between the external terminals of the variable capacitance device can be further reduced.

While description has been made in the seventh embodiment and Modifications 6 through 9 above with an example of a variable capacitance device (variable capacitance capacitor) as the capacitance device, the present invention is not restricted to this. The configurations of the upper external terminal and lower external terminal described with the seventh embodiment and Modifications 6 through 9 above can be similarly applied to capacitance devices which are constant-capacitance devices. Note however, in this case, the dielectric layer is formed of a paraelectric material which has low relative permittivity. Materials the same as the paraelectric materials described with the first embodiment above may be used for paraelectric materials.

<8. Eighth Embodiment>

With an eighth embodiment, a configuration example of a non-contact reception device having the capacitance device according to the present invention described above.

[Configuration of Non-Contact Reception Device]

Figure 59:
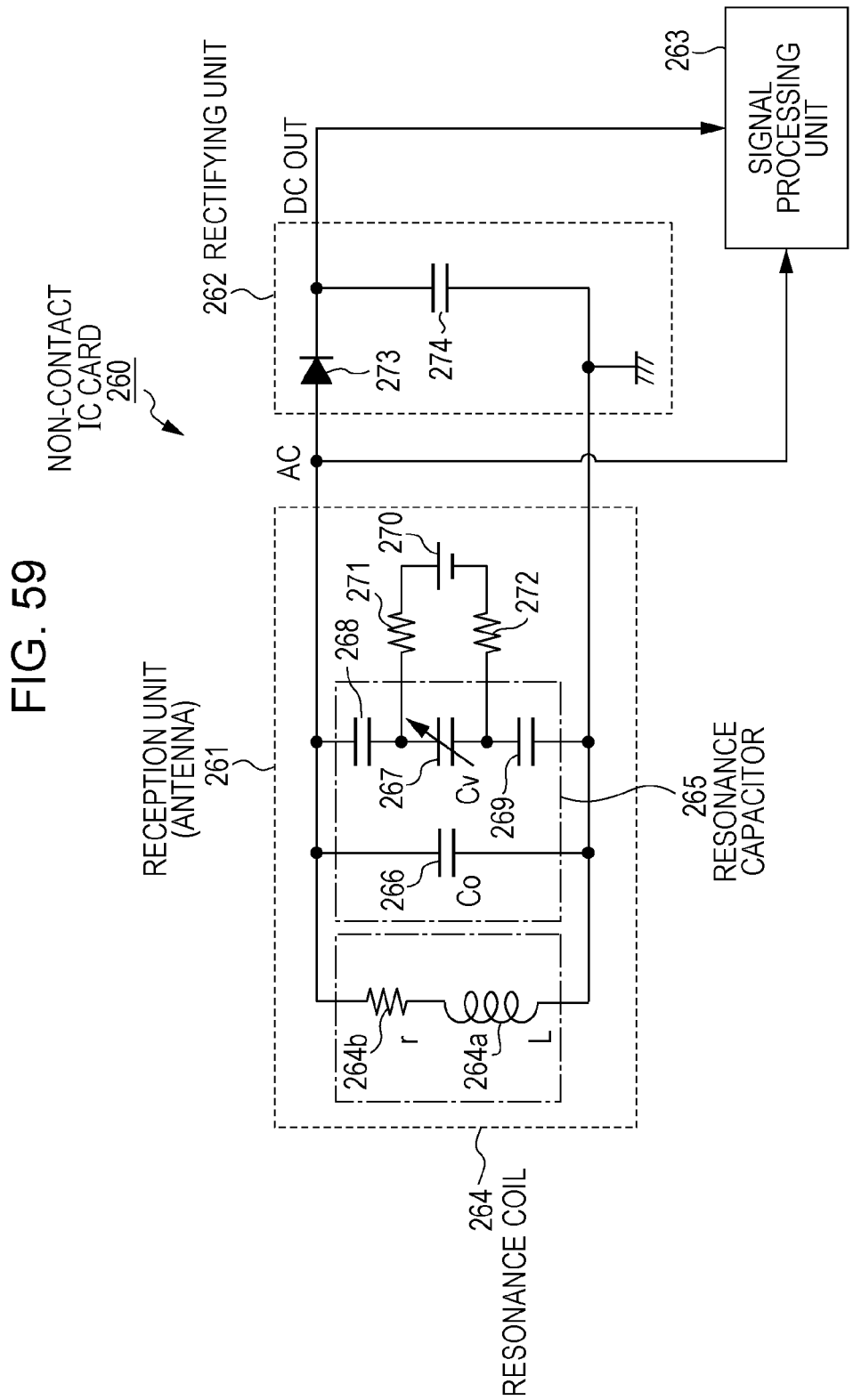
FIG. 59 is a block configuration diagram of a non-contact IC card according to an eighth embodiment.

With the present embodiment, description will be made of a non-contact IC card as an example of a non-contact reception device. FIG. 59 shows a block configuration of a reception system (demodulation system) of the non-contact IC card according to the present embodiment. Note that in FIG. 59, the transmission system (modulation system) circuit portion for signals is omitted to simplify description. The configuration of the transmission system circuit portion may be configured in the same way as with a conventional non-contact IC card or the like.

A non-contact IC card 260 has a reception unit 261 (antenna), a rectifying unit 262, and a signal processing unit 263.

The reception unit 261 has a resonance circuit configured of a resonance coil 264 and resonance capacitor 265, and receives signals transmitted from a reader/writer (not shown) of the non-contact IC card 260 with this resonance circuit. Note that in FIG. 59, the resonance coil 264 is illustrated in the drawing divided into the inductance component 264a (L) and resistance component 264b (r: around several ohms). Also, the reception unit 261 has a control power supply 270 of a later-described variable capacitance capacitor 267 within the resonance capacitor 265, and two current restricting resistors 271 and 272 provided between the variable capacitance capacitor 267 and control power supply 270.

The resonance capacitor 265 has a constant-capacitance capacitor 266 of capacitance Co, a variable capacitance capacitor 267, and two bias removal capacitors 268 and 269 connected to both terminals of the constant-capacitance capacitor 267. The serial circuit configured of the capacitor 266, variable capacitance capacitor 267, and two bias removal capacitors 268 and 269, is connected to the resonance coil 264 in parallel.

The constant-capacitance capacitor 266 is configured of a two-terminal type constant-capacitance capacitor (constant-capacitance device) having the configuration of electrodes and external terminals described in the various embodiments and modifications described above. The dielectric layer making up the constant-capacitance capacitor 266 is formed of the dielectric material which has low relative permittivity (paraelectric material) described with the first embodiment, and the capacitance thereof hardly changes at all, regardless of the type of input signal (AC or DC) and the signal level thereof.

Note that with circuits in actual practice, there is fluctuation in the capacitance of the reception unit 261 (around several pF) due to irregularities in the inductance component L of the resonance coil 264, parasitic capacitance at the input terminals of the integrated circuit within the signal processing unit 263, and so forth, and the amount of fluctuation differs from one non-contact IC card 260 to another. Accordingly, with the present embodiment, the electrode pattern of the internal electrode of the constant-capacitance capacitor 266 is trimmed to suitably adjust the capacitance Co, so as to suppress (correct) these influences.

The variable capacitance capacitor 267 also is configured of a two-terminal type variable capacitance capacitor (variable capacitance device) having the configuration of electrodes and external terminals described in the various embodiments and modifications described above. The dielectric layer making up the variable capacitance capacitor 267 is formed of the dielectric material which has great relative permittivity described with the first embodiment. Note that the present invention is not restricted to this, and that the variable capacitance capacitor 267 may be configured of the four-terminal type variable capacitance capacitor described with the third embodiment above (FIG. 27).

Also, the variable capacitance capacitor 267 is connected to the control power supply 270 via the current restricting resistors 271 and 272. The capacitance Cv of the variable capacitance capacitor 267 changes in accordance with the control voltage applied from the control power supply 270.

The bias removal capacitors 268 and 269 and the current restricting resistors 271 and 272 are provided to suppress the effects of interference between the DC bias current flowing from the control power supply (control current) and reception current. Specifically, the bias removal capacitors 268 and 269 are provided for signal circuit protection and/or separation, and the current restricting resistors 271 and 272 are provided for control circuit protection and/or separation.

The rectifying unit 262 is configured of a half-wave rectifier circuit made up of a rectifying diode 273 and rectifying capacitor 274, to rectify the AC voltage received at the reception unit 261 into DC voltage and output.

The signal processing unit 263 is configured primarily of a semiconductor device integrated circuit (LSI: Large Scale Integration), and demodulates the AC signals received at the reception unit 261. The LSI in the signal processing unit 263 is driven by the DC voltage supplied from the rectifying unit 262. The LSI used may be the same as that with conventional non-contact IC cards.

With the non-contact IC card 260 according to the present embodiment, the variable capacitance capacitor 267 is used to prevent the control circuit made up of semiconductor devices with low voltage withstanding properties due being damaged to excessively great reception signals. Specifically, in the event that a reception signal is excessively great, the capacitance Cv of the variable capacitance capacitor 267 is reduced by the control voltage. Accordingly, the resonance frequency of the reception unit 261 is shifted toward the high frequency region by a frequency Δf corresponding to the amount of reduced capacitance of the variable capacitance capacitor 267. Thus, the response of reception signals at the resonance frequency f0 before changing capacitance becomes lower than that before changing capacitance, and the level of the reception signals is suppressed. As a result, excessively great electrical signals can be prevented from flowing to the control circuit, and damage to the control circuit can be prevented.

With the non-contact IC card 260 according to the present embodiment, capacitance devices having the electrode configuration according to the present invention are used for the constant-capacitance capacitor 266 and the variable capacitance capacitor 267, so a non-contact IC card with higher performance can be provided. Also, a capacitance device having the electrode configuration according to the present invention is used for the variable capacitance capacitor 267, so the non-contact ID card can be driven with even lower driving voltage.

While an example has been described in the present embodiment wherein both the constant-capacitance capacitor 266 and the variable capacitance capacitor 267 are configured of capacitance devices having the electrode configuration according to the present invention, but the present invention is not restricted to this, and just one may be configured of the capacitance device according to the present invention. Also, the present embodiment may be of a configuration not having the constant-capacitance capacitor 266.

Figure 60:
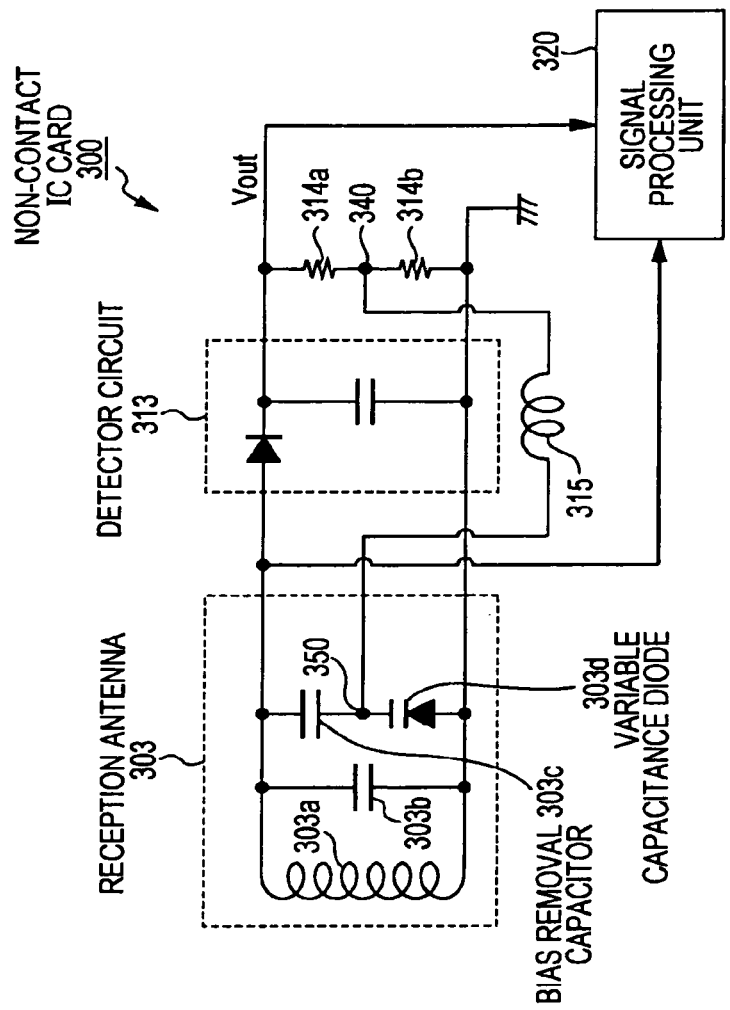
FIG. 60 is a block diagram of a conventional non-contact IC card.

Also, an example has been described regarding the non-contact IC card 260 according to the present embodiment where the control power supply 270 of the variable capacitance capacitor 267 is provided, but the present invention is not restricted to this. For example, a configuration may be made wherein a predetermined control voltage is extracted from the DC voltage output from the rectifying unit 262, by a technique such as resistive dividing or the like, for example, in the same way as with PTL 1 (FIG. 60) or the like.

Further, with the present embodiment, description has been made of an example of a non-contact IC card as an example of a non-contact reception device, but the present invention is not restricted to this. The present invention is applicable to any device which receives information and/or electric power by non-contact using a resonance circuit made up of a resonance coil and resonance capacitor, and the same advantages can be obtained. For example, this is also applicable to cellular telephones or the like, and wireless power transmission devices. Note that wireless power transmission devices are devices to transmit electric power by non-contact, so a signal processing unit to demodulate received signals does not have to be provided as with a non-contact IC card.

REFERENCE SIGNS LIST

1 two-terminal type variable capacitance capacitor
2, 165 variable capacitance capacitor
3 four-terminal type variable capacitance capacitor
10 ferroelectric layer (dielectric layer)
11, 21, 31, 41, 101, 131, 151 upper electrode (first electrode)
11a, 21a, 31a, 41a, 101a, 131a, 151a electrode portion first electrode portion)
11b, 21b, 31b, 41b, 101b, 131b, 151b terminal portion
11p, 21p, 31p, 41p, 101p, 131p, 151p upper-electrode projection pattern
12, 22, 32, 42, 102, 132, 152 lower electrode (second electrode)
12a, 22a, 32a, 42a, 42c, 102a, 132a, 152a electrode portion (second electrode portion)
12b, 22b, 32b, 42b, 102b, 132b, 152b terminal portion
70 ferroelectric layer
71 through 75 control electrode
76 through 79 signal electrode
135, 155 variable capacitance capacitor
136, 156, 166 ferroelectric material
137, 157 upper external terminal
138, 158 lower external terminal
161 first upper electrode
162 first lower electrode
163 second upper electrode
164 second lower electrode
167 first upper external terminal
168 first lower external terminal
169 second upper external terminal
170 second lower external terminal
260 non-contact IC card
261 reception unit
264 resonance coil
265 resonance capacitor
266 constant-capacitance capacitor
267 variable capacitance capacitor
270 control power source
Sa, Sa1, Sa2 opposing-electrode regions (first region)
SA1 first opposing-electrode region (first region)
SA2 second opposing-electrode region (second region)

The invention claimed is:

1. A capacitance device comprising:
a dielectric layer;
a first electrode that is formed in a predetermined first shape on a predetermined surface of the dielectric layer; and
a second electrode that is formed on an opposite surface of the dielectric layer opposite to the predetermined surface, has a first region overlapping a projection pattern obtained by projecting the first electrode onto the opposite surface, and is formed in a predetermined second shape, wherein:
the first electrode has a first electrode portion including an electrode region corresponding to the first region and extending in a first direction within the predetermined surface;
the second electrode has a second electrode portion including an electrode region corresponding to the first region and extending in a second direction crossing the first direction within the opposite surface;
the first electrode portion and the second electrode portion are individually formed in such shapes that an area of the first region does not change even when the first electrode undergoes relative displacement with respect to the second electrode within the predetermined surface in a predetermined direction and in a direction orthogonal to the predetermined direction;
the shape of the first electrode and the shape of the second electrode have a V-shape respectively; and
the shape of the first electrode and the shape of the second electrode are symmetric with respect to one of the predetermined direction and the direction orthogonal to the predetermined direction within the predetermined surface.

2. The capacitance device according to claim 1, wherein the dielectric layer is formed of a ferroelectric material, and wherein the capacitance thereof changes in accordance with externally applied control signals.

3. The capacitance device according to claim 1, wherein the first direction and the second direction are orthogonal to each other.

4. The capacitance device according to claim 1, further comprising:
a third electrode that is formed in a predetermined third shape on the predetermined surface of the dielectric layer; and
a fourth electrode that is formed on the opposite surface of the dielectric layer opposite to the predetermined surface, has a second region overlapping a projection pattern obtained by projecting the third electrode onto the opposite surface, and is formed in a fourth shape such that an area of the second region does not change even when the third electrode undergoes relative displacement in the predetermined direction within the predetermined surface.

5. The capacitance device according to claim 1, wherein:
the first electrode portion and the second electrode portion each extend in a direction orthogonal to the predetermined direction within the predetermined surface; and
the second electrode having a plurality of the first regions.

6. The capacitance device according to claim 1, wherein:
a shape of each of the surfaces of the dielectric layer on which the first electrode and the second electrode are resepctively formed is rectangular;
the first electrode and the second electrode have a first terminal portion and a second terminal portion for electrically externally connecting the first electrode portion and the second electrode portion, respectively; and the first terminal portion and the second terminal portion are each provided along a long side of each of the surfaces of the dielectric layer and near the long side.

7. The capacitance device according to claim 1, further comprising:
a plurality of the dielectric layers;
wherein the plurality of the dielectric layers are layered alternating with electrodes;
and wherein two electrodes sandwiching each of the plurality of dielectric layers are individually formed in such shapes that even when one of the two electrodes of each of the plurality of dielectric layers undergoes relative displacement in a predetermined direction with respect to the other electrode, an area of an overlapping region between the respective other electrode and a projection pattern obtained by projecting the one electrode onto the other electrode side does not change.

8. The capacitance device according to claim 1, wherein at least one of the first electrode and the second electrode has an electrode portion, and a terminal portion for electrically externally connecting the electrode portion; and the electrode portion and the terminal portion define an opening.

9. The capacitance device according to claim 1, further comprising:
a first external terminal that is provided on one side surface of the dielectric layer, and is connected to the first electrode; and
a second external terminal that is provided on the one side surface of the dielectric layer so as to be separated by a predetermined distance from the first external terminal, and is connected to the second electrode.

10. A capacitance device comprising:
a dielectric layer;
a first electrode that is formed in a predetermined first shape on a predetermined surface of the dielectric layer;
a second electrode that is formed on an opposite surface of the dielectric layer opposite to the predetermined surface, has a first region overlapping a projection pattern obtained by projecting the first electrode onto the opposite surface, and is formed in a predetermined second shape such that an area of the first region does not change even when the first electrode undergoes relative displacement in a predetermined direction within the predetermined surface; and
a third electrode that is formed on the opposite surface of the dielectric layer opposite to the predetermined surface, has a second region overlapping the projection pattern obtained by projecting the first electrode onto the opposite surface, and is formed in a third shape such that an area of the second region does not change even when the first electrode undergoes relative displacement in the predetermined direction within the predetermined surface.

11. The capacitance device according to claim 10, further comprising:
a first external terminal that is provided on a first side surface of the dielectric layer, and is connected to the first electrode;
a second external terminal that is provided on a second side surface of the dielectric layer opposing the first side surface, and is connected to the second electrode; and
a third external terminal that is provided on the second side surface of the dielectric layer so as to be separated by a predetermined distance from the second external terminal, and is connected to the third electrode.

12. A capacitance device comprising:
a dielectric layer;
a first electrode that is formed in a predetermined first shape on a predetermined surface of the dielectric layer;
a second electrode that is formed on an opposite surface of the dielectric layer opposite to the predetermined surface, has a first region overlapping a projection pattern obtained by projecting the first electrode onto the opposite surface, and is formed in a predetermined second shape such that an area of the first region does not change even when the first electrode undergoes relative displacement in a predetermined direction within the predetermined surface;
a third electrode that is formed in a predetermined third shape on the predetermined surface of the dielectric layer;
a fourth electrode that is formed on the opposite surface of the dielectric layer opposite to the predetermined surface, has a second region overlapping a projection pattern obtained by projecting the third electrode onto the opposite surface, and is formed in a fourth shape such that an area of the second region does not change even when the third electrode undergoes relative displacement in the predetermined direction within the predetermined surface;
a first external terminal that is provided on a first side surface of the dielectric layer, and is connected to the first electrode;
a second external terminal that is provided on the first side surface of the dielectric layer so as to be separated by a predetermined distance from the first external terminal, and is connected to the second electrode;
a third external terminal that is provided on a second side surface of the dielectric layer opposing the first side surface, and is connected to the third electrode; and
a fourth external terminal that is provided on the second side surface of the dielectric layer so as to be separated by a predetermined distance from the third external terminal, and is connected to the fourth electrode.

13. A capacitance device comprising:
a dielectric layer;
a first electrode that is formed in a predetermined first shape on a predetermined surface of the dielectric layer;
a second electrode that is formed on an opposite surface of the dielectric layer opposite to the predetermined surface, has a first region overlapping a projection pattern obtained by projecting the first electrode onto the opposite surface, and is formed in a predetermined second shape such that an area of the first region does not change even when the first electrode undergoes relative displacement in a predetermined direction within the predetermined surface;
a first external terminal that is provided on a first side surface of the dielectric layer, and is connected to the first electrode; and
a second external terminal that is provided on a second side surface of the dielectric layer opposing the first side surface, and is connected to the second electrode,
wherein a placing direction of the first external terminal and the second external terminal crosses an opposing direction between the first side surface and the second side surface.

14. A resonance circuit comprising:
a resonance capacitor including a dielectric layer, a first electrode that is formed in a predetermined first shape on a predetermined surface of the dielectric layer, and a second electrode that is formed on an opposite surface of the dielectric layer opposite to the predetermined surface, has a first region overlapping a projection pattern obtained by projecting the first electrode onto the opposite surface, and is formed in a predetermined second shape; and a resonance coil connected to the resonance capacitor, wherein:

the first shape of the first electrode and the second shape of the second electrode have a V-shape respectively;

the first shape of the first electrode and the second shape of the second electrode are symmetric with respect to one of the predetermined direction and a direction orthogonal to the predetermined direction within the predetermined surface;

the first electrode has a first electrode portion including an electrode region corresponding to the first region and extending in a first direction within the predetermined surface;

the second electrode has a second electrode portion including an electrode region corresponding to the first region and extending in a second direction crossing the first direction within the opposite surface; and the first electrode portion and the second electrode portion are individually formed in such shapes that an area of the first region does not change even when the first electrode undergoes relative displacement with respect to the second electrode within the predetermined surface in the predetermined direction and in the direction orthogonal to the predetermined direction.

15. A resonance circuit comprising:

a resonance capacitor including a dielectric layer, a first electrode that is formed in a predetermined first shape on a predetermined surface of the dielectric layer, a second electrode that is formed on an opposite surface of the dielectric layer opposite to the predetermined surface, has a first region overlapping a projection pattern obtained by projecting the first electrode onto the opposite surface, and is formed in a second shape such that an area of the first region does not change even when the first electrode undergoes relative displacement in a predetermined direction within the predetermined surface, a first external terminal that is provided on a first side surface of the dielectric layer, and is connected to the first electrode, and a second external terminal that is provided on a second side surface of the dielectric layer opposing the first side surface, and is connected to the second electrode; and a resonance coil connected to the resonance capacitor, wherein a placing direction of the first external terminal and the second external terminal crosses an opposing direction between the first side surface and the second side surface.

* * * * *